US012050580B2

(12) United States Patent
Kondiles et al.

(10) Patent No.: US 12,050,580 B2
(45) Date of Patent: Jul. 30, 2024

(54) DATA SEGMENT STORING IN A DATABASE SYSTEM

(71) Applicant: Ocient Inc., Chicago, IL (US)

(72) Inventors: George Kondiles, Chicago, IL (US); Jason Arnold, Chicago, IL (US)

(73) Assignee: Ocient Inc., Chicago, IL (US)

( * ) Notice: Subject to any disclaimer, the term of this patent is extended or adjusted under 35 U.S.C. 154(b) by 477 days.

(21) Appl. No.: 17/305,147

(22) Filed: Jun. 30, 2021

(65) Prior Publication Data

US 2021/0326320 A1 Oct. 21, 2021

Related U.S. Application Data

(63) Continuation-in-part of application No. 16/402,156, filed on May 2, 2019, now Pat. No. 11,080,277.
(Continued)

(51) Int. Cl.
*G06F 16/22* (2019.01)
*G06F 7/24* (2006.01)
(Continued)

(52) U.S. Cl.
CPC ........ *G06F 16/2282* (2019.01); *G06F 9/4881* (2013.01); *G06F 16/24532* (2019.01); *G06F 16/285* (2019.01)

(58) Field of Classification Search
CPC ...... G06F 7/24; G06F 16/256; G06F 16/2282; G06F 16/24532; G06F 16/278; G06F 16/285; G06F 9/5027; G06F 9/4881; G06F 11/1076; H04L 67/1097; H04L 67/561; H03M 7/3088; H03M 7/4031
See application file for complete search history.

(56) References Cited

U.S. PATENT DOCUMENTS

| 5,548,770 A | 8/1996 | Bridges |
| 6,230,200 B1 | 5/2001 | Forecast |
(Continued)

OTHER PUBLICATIONS

A new high performance fabric for HPC, Michael Feldman, May 2016, Intersect360 Research.
(Continued)

*Primary Examiner* — Etienne P Leroux
(74) *Attorney, Agent, or Firm* — GARLICK & MARKISON; Timothy W. Markison

(57) ABSTRACT

A method includes a host computing device receiving a segment group of data. The method further includes the host computing device evaluating availability status of other computing devices in the storage cluster of computing devices. When one of the other computing devices is unavailable, the method further includes the host computing device dividing the segment group of data into a plurality of lines of data blocks. For a line of the data blocks, the method further includes the host computing device generating at least one parity block. The method further includes the host computing device sending a first data segment that includes first positioned data blocks to a first available computing device. The method further includes the host computing device sending a second data segment that includes second positioned data blocks to a second available computing device. The method further includes the host computing device storing a parity segment.

18 Claims, 58 Drawing Sheets

Related U.S. Application Data

(60) Provisional application No. 62/745,787, filed on Oct. 15, 2018.

(51) Int. Cl.

| | | |
|---|---|---|
| *G06F 9/48* | (2006.01) | |
| *G06F 9/50* | (2006.01) | |
| *G06F 11/10* | (2006.01) | |
| *G06F 16/2453* | (2019.01) | |
| *G06F 16/25* | (2019.01) | |
| *G06F 16/27* | (2019.01) | |
| *G06F 16/28* | (2019.01) | |
| *H03M 7/30* | (2006.01) | |
| *H03M 7/40* | (2006.01) | |
| *H04L 67/1097* | (2022.01) | |
| *H04L 67/561* | (2022.01) | |

(56) References Cited

U.S. PATENT DOCUMENTS

| | | | |
|---|---|---|---|
| 6,633,772 B2 | 10/2003 | Ford | |
| 7,499,907 B2 | 3/2009 | Brown | |
| 7,908,242 B1 | 3/2011 | Achanta | |
| 2001/0051949 A1 | 12/2001 | Carey | |
| 2002/0032676 A1 | 3/2002 | Reiner | |
| 2004/0162853 A1 | 8/2004 | Brodersen | |
| 2008/0133456 A1 | 6/2008 | Richards | |
| 2009/0063893 A1 | 3/2009 | Bagepalli | |
| 2009/0183167 A1 | 7/2009 | Kupferschmidt | |
| 2010/0082577 A1 | 4/2010 | Mirchandani | |
| 2010/0241646 A1 | 9/2010 | Friedman | |
| 2010/0274983 A1 | 10/2010 | Murphy | |
| 2010/0312756 A1 | 12/2010 | Zhang | |
| 2011/0219169 A1 | 9/2011 | Zhang | |
| 2012/0042064 A1* | 2/2012 | Gagnon | H04L 43/04 709/224 |
| 2012/0109888 A1 | 5/2012 | Zhang | |
| 2012/0151118 A1 | 6/2012 | Flynn | |
| 2012/0185866 A1 | 7/2012 | Couvee | |
| 2012/0254252 A1 | 10/2012 | Jin | |
| 2012/0311246 A1 | 12/2012 | McWilliams | |
| 2013/0332484 A1 | 12/2013 | Gajic | |
| 2014/0047095 A1 | 2/2014 | Breternitz | |
| 2014/0136510 A1 | 5/2014 | Parkkinen | |
| 2014/0188841 A1 | 7/2014 | Sun | |
| 2014/0310321 A1 | 10/2014 | Murata | |
| 2015/0149819 A1* | 5/2015 | Lee | G06F 11/1076 714/6.24 |
| 2015/0205607 A1 | 7/2015 | Lindholm | |
| 2015/0244804 A1 | 8/2015 | Warfield | |
| 2015/0248366 A1 | 9/2015 | Bergsten | |
| 2015/0293966 A1 | 10/2015 | Cai | |
| 2015/0310045 A1 | 10/2015 | Konik | |
| 2016/0034547 A1 | 2/2016 | Lerios | |
| 2016/0191660 A1* | 6/2016 | Farrell | H04L 63/123 709/219 |
| 2017/0170845 A1* | 6/2017 | Cho | H03M 13/3761 |
| 2019/0081644 A1* | 3/2019 | Kim | H03M 13/453 |
| 2019/0102433 A1* | 4/2019 | Meiyyappan | G06F 16/24561 |
| 2019/0220358 A1* | 7/2019 | Fujii | G06F 11/0793 |
| 2021/0271557 A1* | 9/2021 | Hao | G06F 11/1448 |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; Feb. 13, 2018; 17 pgs.

International Searching Authority; International Search Report and Written Opinion; International Application No. PCT/US2017/054784; Dec. 28, 2017; 10 pgs.

International Searching Authority; International Search Report and Written Opinion; International Application No. PCT/US2017/066145; Mar. 5, 2018; 13 pgs.

International Searching Authority; International Search Report and Written Opinion; International Application No. PCT/US2017/066169; Mar. 6, 2018; 15 pgs.

International Searching Authority; International Search Report and Written Opinion; International Application No. PCT/US2018/025729; Jun. 27, 2018; 9 pgs.

International Searching Authority; International Search Report and Written Opinion; International Application No. PCT/US2018/034859; Oct. 30, 2018; 8 pgs.

MapReduce: Simplified Data Processing on Large Clusters, OSDI 2004, Jeffrey Dean and Sanjay Ghemawat, Google, Inc., 13 pgs.

Rodero-Merino, L.; Storage of Structured Data: Big Table and HBase, New Trends In Distributed Systems, MSc Software and Systems, Distributed Systems Laboratory; Oct. 17, 2012; 24 pages.

Step 2: Examine the data model and implementation details, 2016, Amazon Web Services, Inc., http://docs.aws.amazon.com/amazondynamodb/latestldeveloperguide!Ti . . . .

\* cited by examiner database system 10 computing device 18 computing device 18 computing device 18

FIG. 10  node 37

FIG. 11  node 37

FIG. 12    node 37 table 236

FIG. 19B 32 columns 80 rows or records

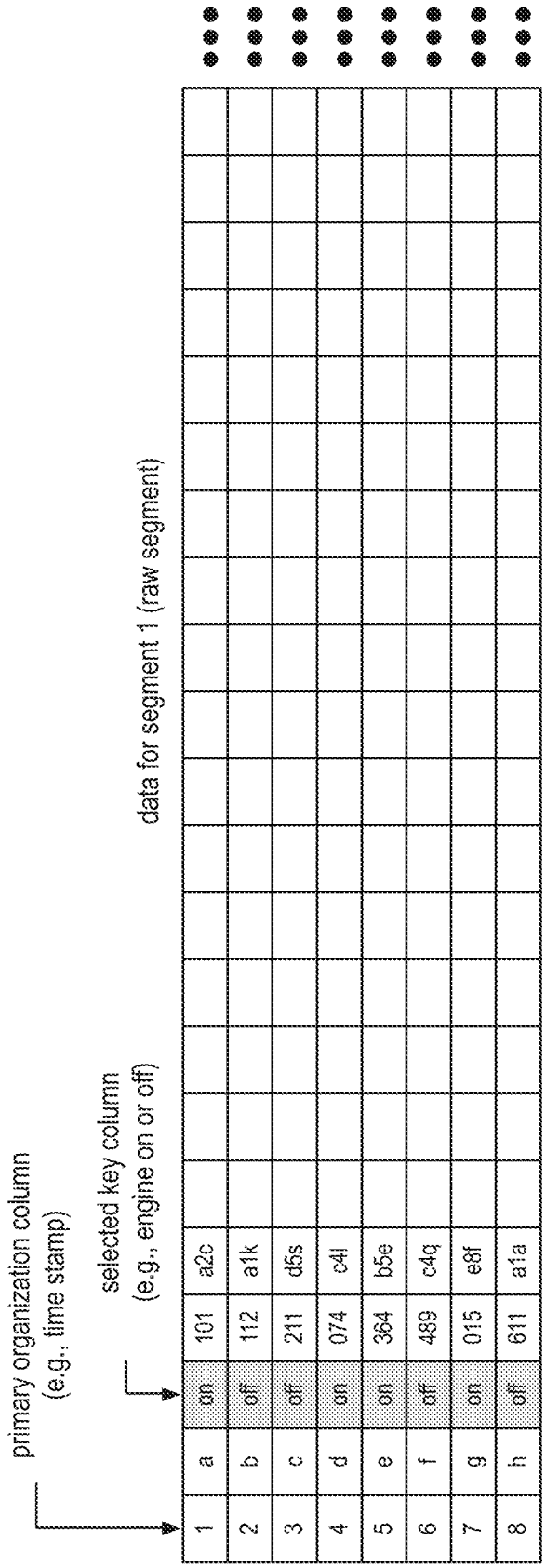

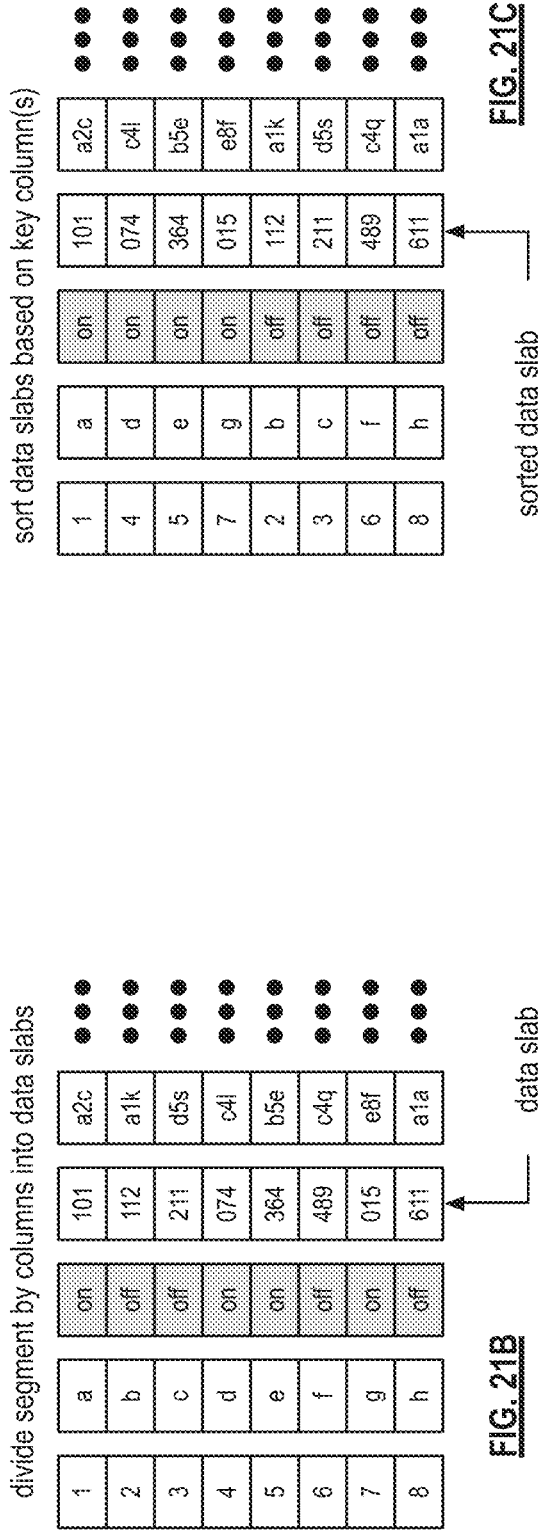

FIG. 21D

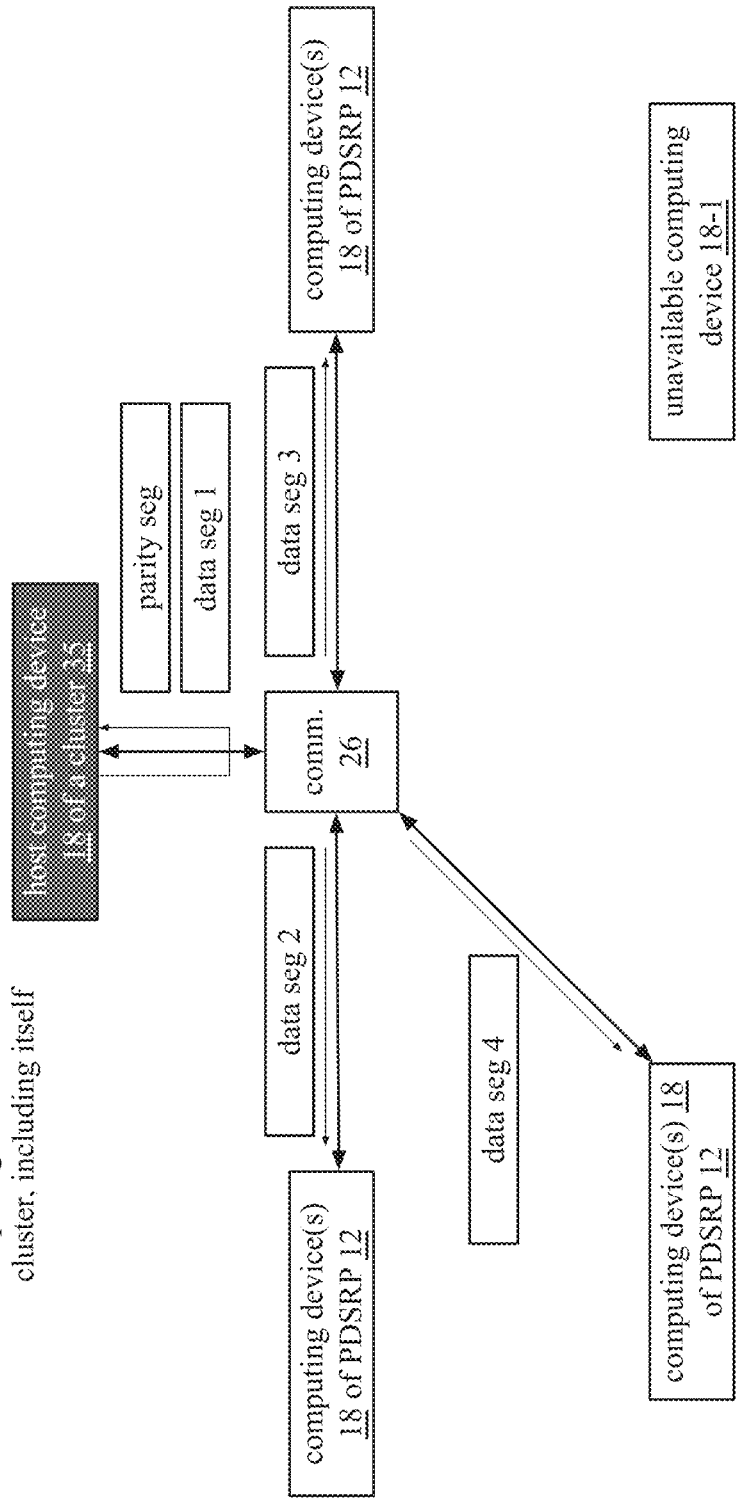

run length encoding (RLE) compression

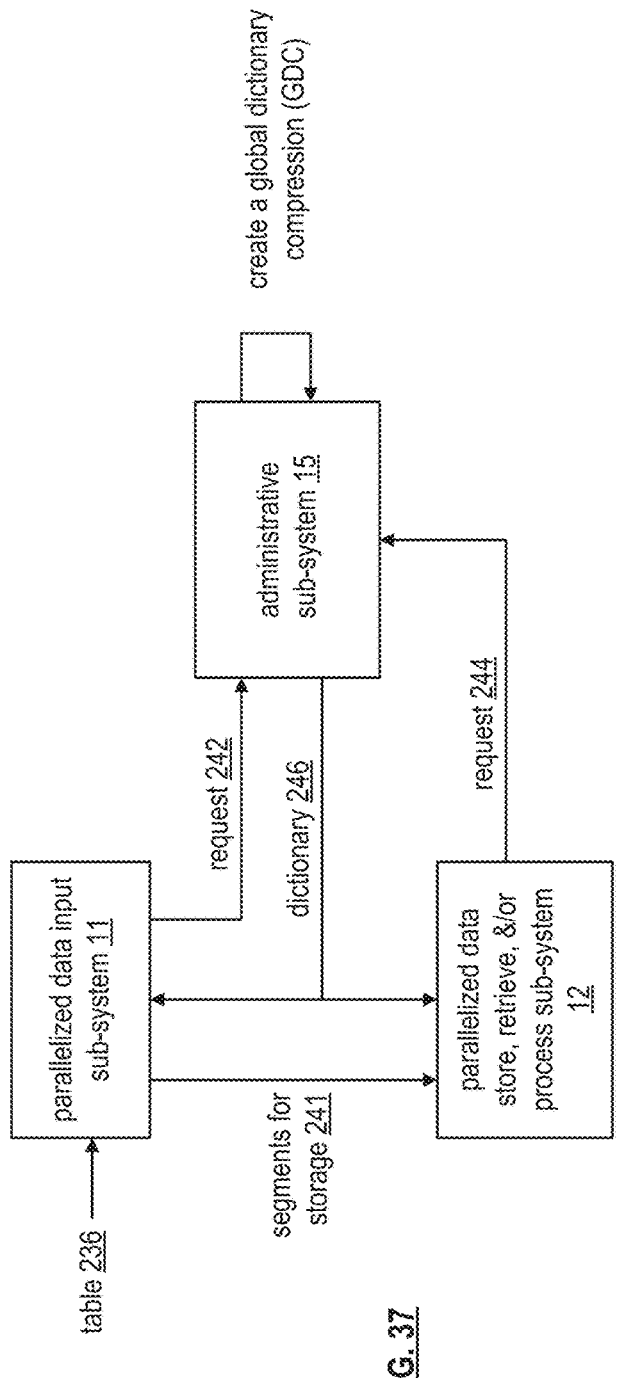

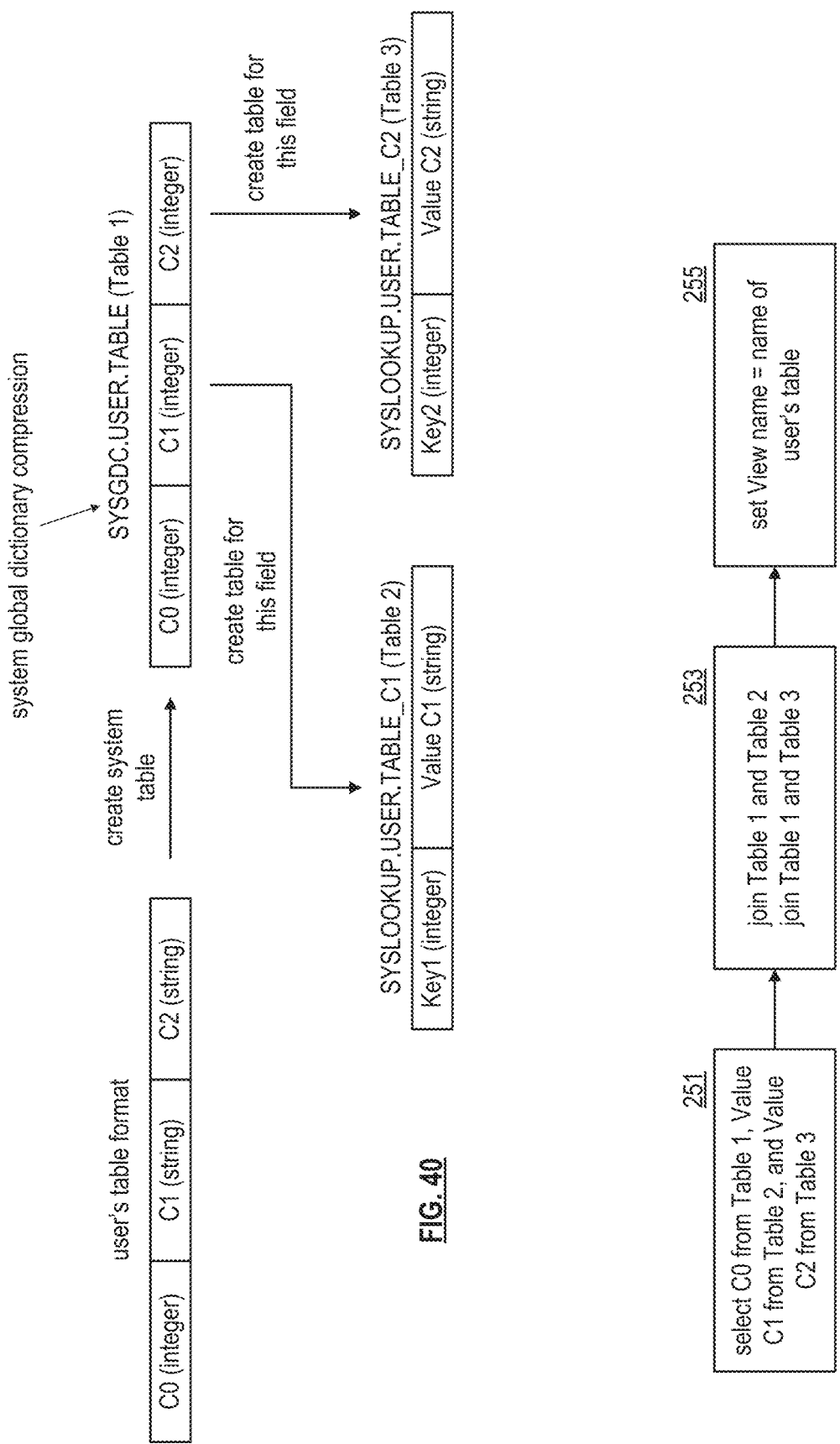

DATA SEGMENT STORING IN A DATABASE SYSTEM

CROSS-REFERENCE TO RELATED APPLICATIONS

The present U.S. Utility Patent application claims priority pursuant to 35 U.S.C. § 120 as a continuation-in-part of U.S. Utility application Ser. No. 16/402,156, entitled "DATA SET COMPRESSION WITHIN A DATABASE SYSTEM", filed May 2, 2019, which claims priority pursuant to 35 U.S.C. § 119(e) to U.S. Provisional Application No. 62/745,787, entitled "DATABASE SYSTEM AND OPERATION", filed Oct. 15, 2018, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIGS. 19A-19E are schematic block diagrams of an example of dividing a table into partitions having one or more segment groups in accordance with the present invention;

FIGS. 21A-21D are schematic block diagrams of an example of sorting each segment of its segment group to produce a segment group of sorted segments in accordance with the present invention;

FIG. 23B is a schematic block diagram of another embodiment of sending processed data segments to computing devices within a storage cluster when a computing device is unavailable in accordance with the present invention;

FIG. 37 is a schematic block diagram of an example a portion of the database system for implementing global dictionary compression (GDC) in accordance with the present invention;

FIG. 38 is a schematic block diagram of an example of a global dictionary compression (GDC) for cities in accordance with the present invention;

FIG. 39 is a schematic block diagram of an example of a global dictionary compression (GDC) for states in accordance with the present invention;

FIG. 40 is a schematic block diagram of an example of creating tables to form a view of a user's table in accordance with the present invention;

FIG. 41 is a schematic block diagram of an example of forming a view of a user's table from the tables created in FIG. 40 in accordance with the present invention;

DETAILED DESCRIPTION OF THE INVENTION

Figure 1:
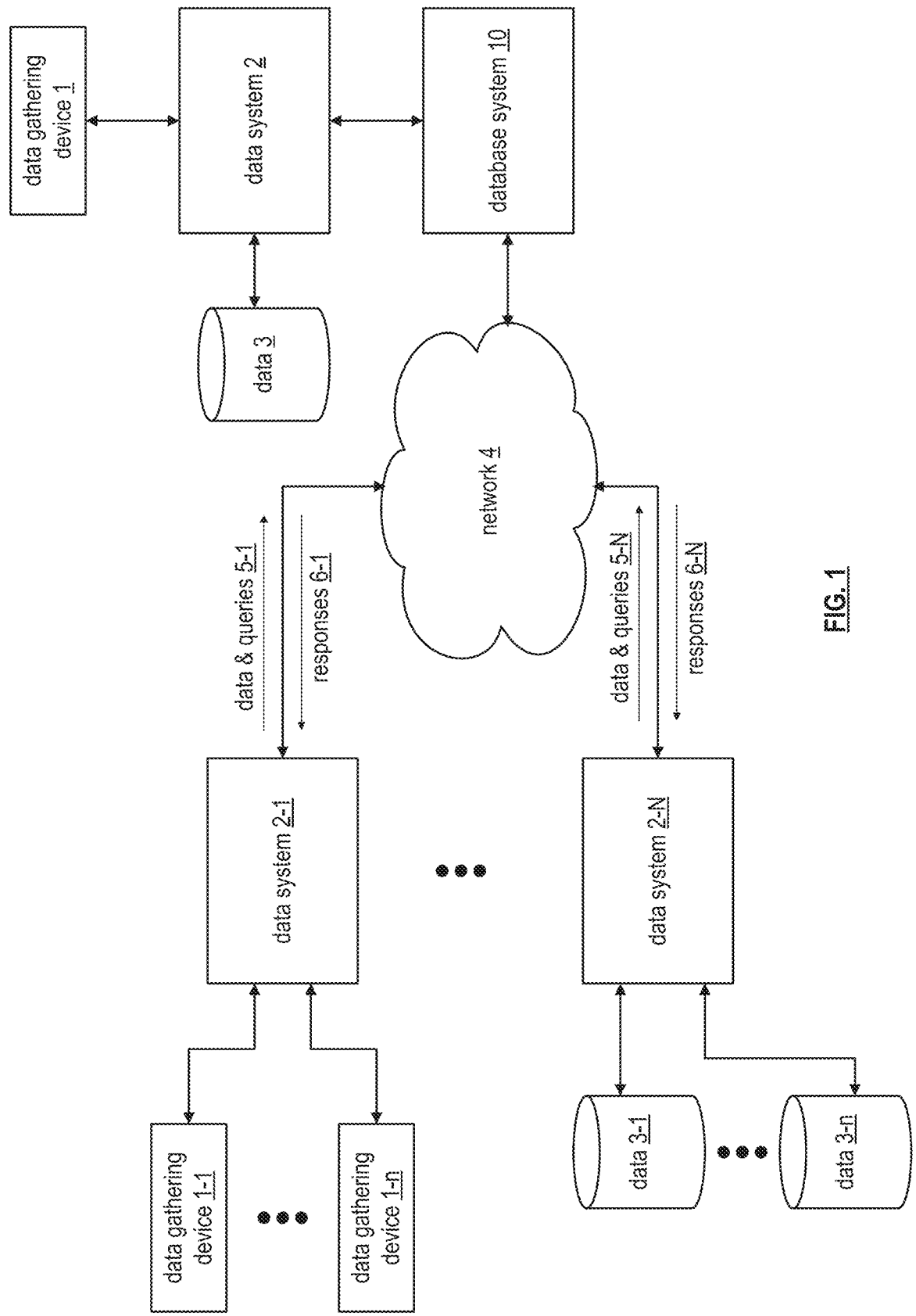
FIG. 1 is a schematic block diagram of an embodiment of a large scale data processing network that includes a database system in accordance with the present invention.

FIG. 1 is a schematic block diagram of an embodiment of a large-scale data processing network that includes data gathering device 1, data gathering devices 1-1 through 1-$n$, data system 2, data systems 2-1 through 2-N, data 3, data 3-1 through 3-$n$, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-n may be implemented utilizing sensors, monitors, handheld computing devices, etc. and/or a plurality of storage devices including hard drives, cloud storage, etc. The data gathering devices 1-1 through 1-n may provide real-time data to the data system 2-1 and/or any other data system and the data 3-1 through 3-n may provide stored data to the data system 2-N and/or any other data system.

Figure 1A:
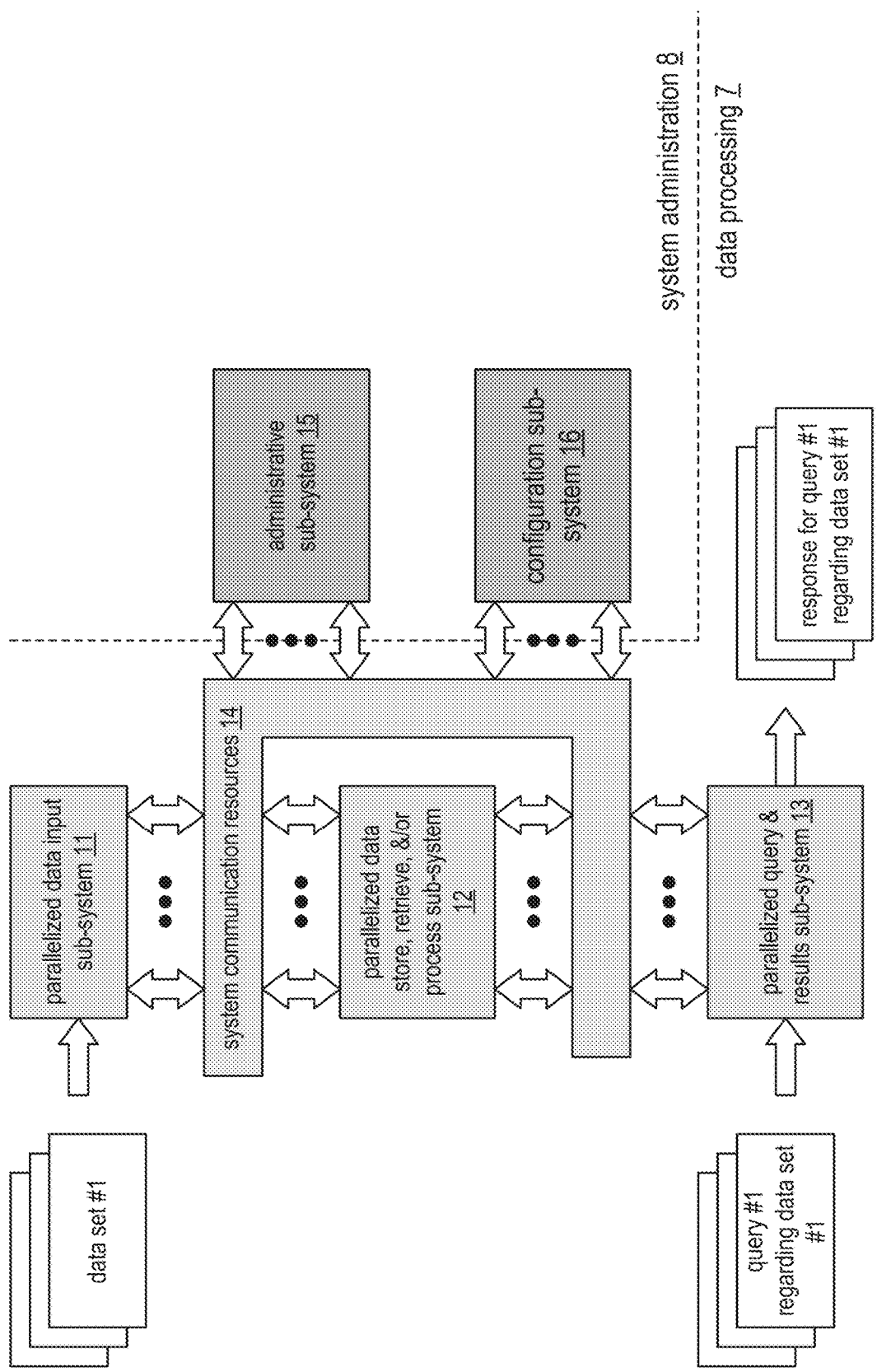
FIG. 1A is a schematic block diagram of an embodiment of a database system in accordance with the present invention.

FIG. 1A is a schematic block diagram of an embodiment of a database system 10 that includes data processing 7 and system administration 8. The data processing 7 includes a parallelized data input sub-system 11, a parallelized data store, retrieve, and/or process sub-system 12, a parallelized query and response sub-system 13, and system communication resources 14. The system administration 8 includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table includes payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, subquery or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
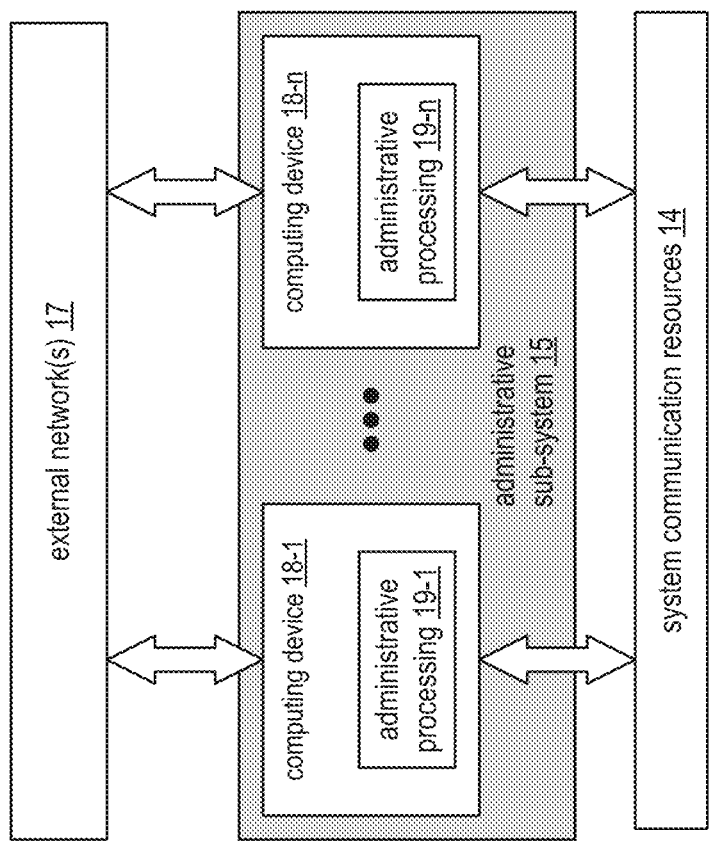
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
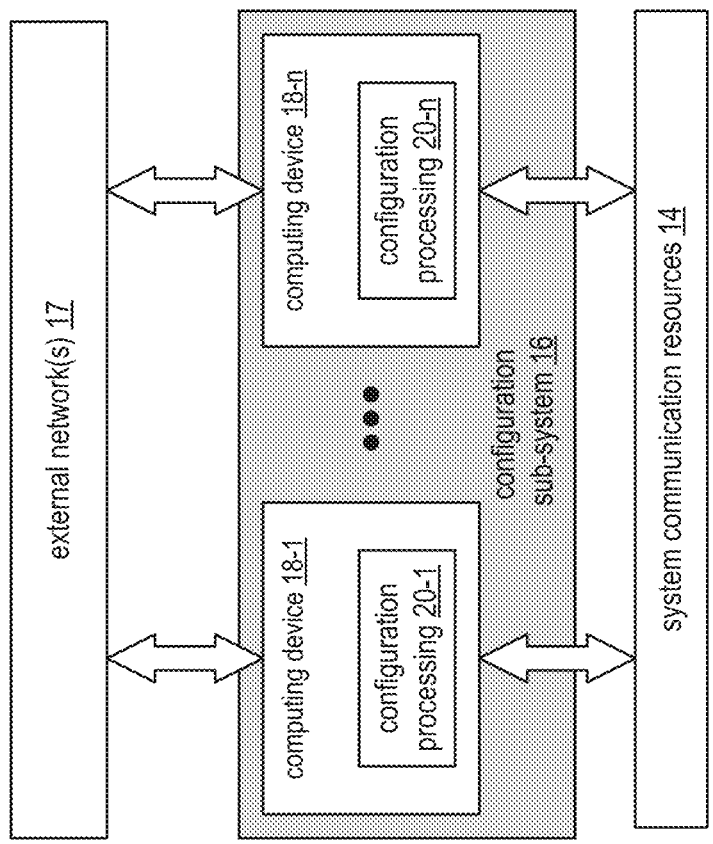
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function utilizing a corresponding configuration processing of configuration processing 20-1 through 20-n (which includes a plurality of configuration operations) that coordinates system level configurations of the database system.

Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of a configuration operation independently. This supports lock free and parallel execution of one or more configuration operations.

Figure 4:
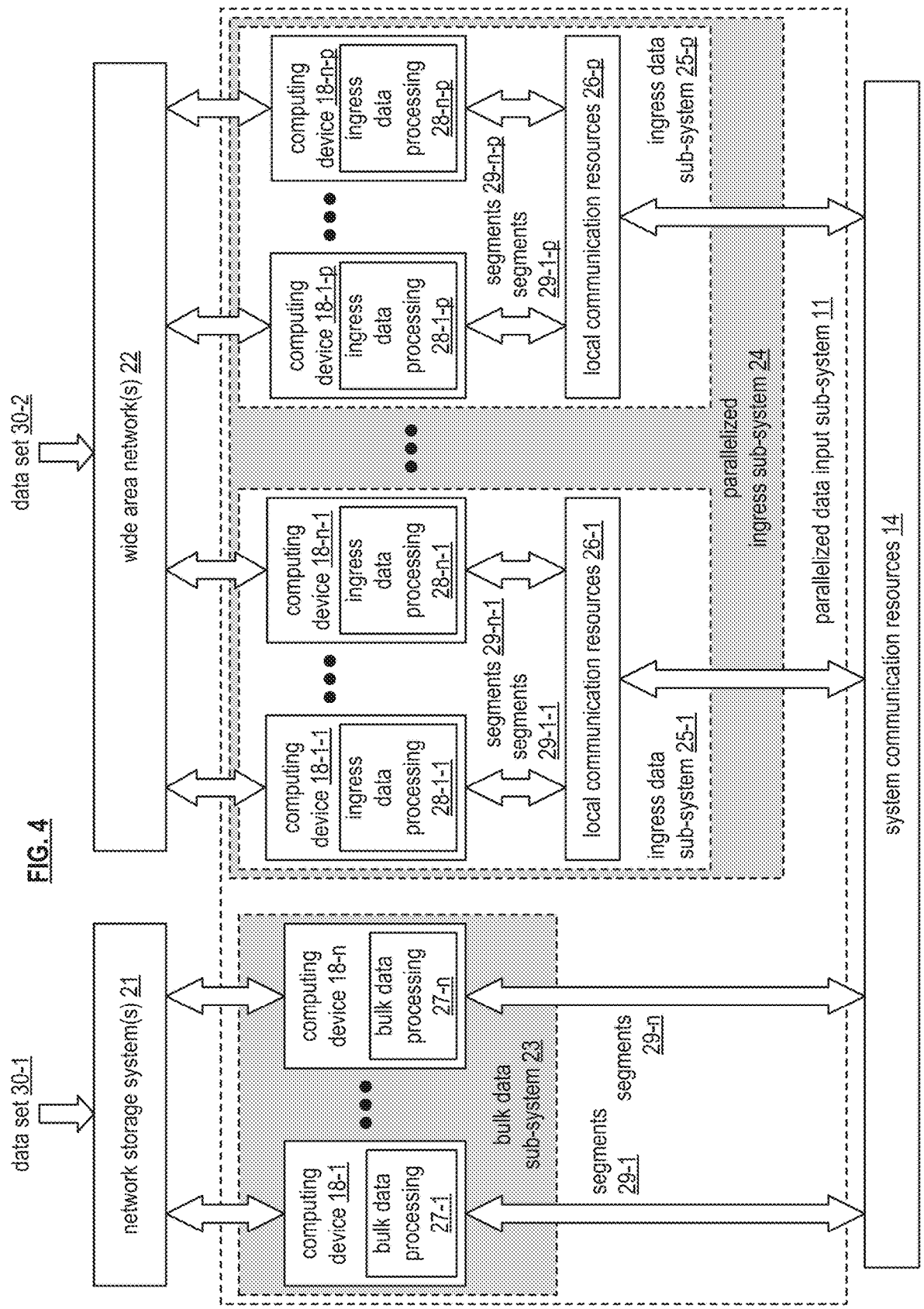
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-p that each include a local communication resource of local communication resources 26-1 through 26-p and a plurality of computing devices 18-1 through 18-n. Each of the computing devices of the parallelized ingress sub-system 24 execute an ingress data processing function utilizing an ingress data processing of ingress data processing 28-1 through 28-n of each ingress data sub-system 25-1 through 25-p that enables the computing device to stream data of a table (e.g., a data set 30-2 as segments 29-1-1 through 29-1-n and through 29-1-p through 29-n-p) into the database system 10 of FIG. 1A via a wide area network 22 (e.g., cellular network, Internet, telephone network, etc.). The streaming may further be via corresponding local communication resources 26-1 through 26-p and via the system communication resources 14 of FIG. 1A. With the plurality of ingress data sub-systems 25-1 through 25-p, data from a plurality of tables can be streamed into the database system 10 at one time (e.g., simultaneously utilizing two or more of the ingress data sub-systems 25-1 through 25-p in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-n). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
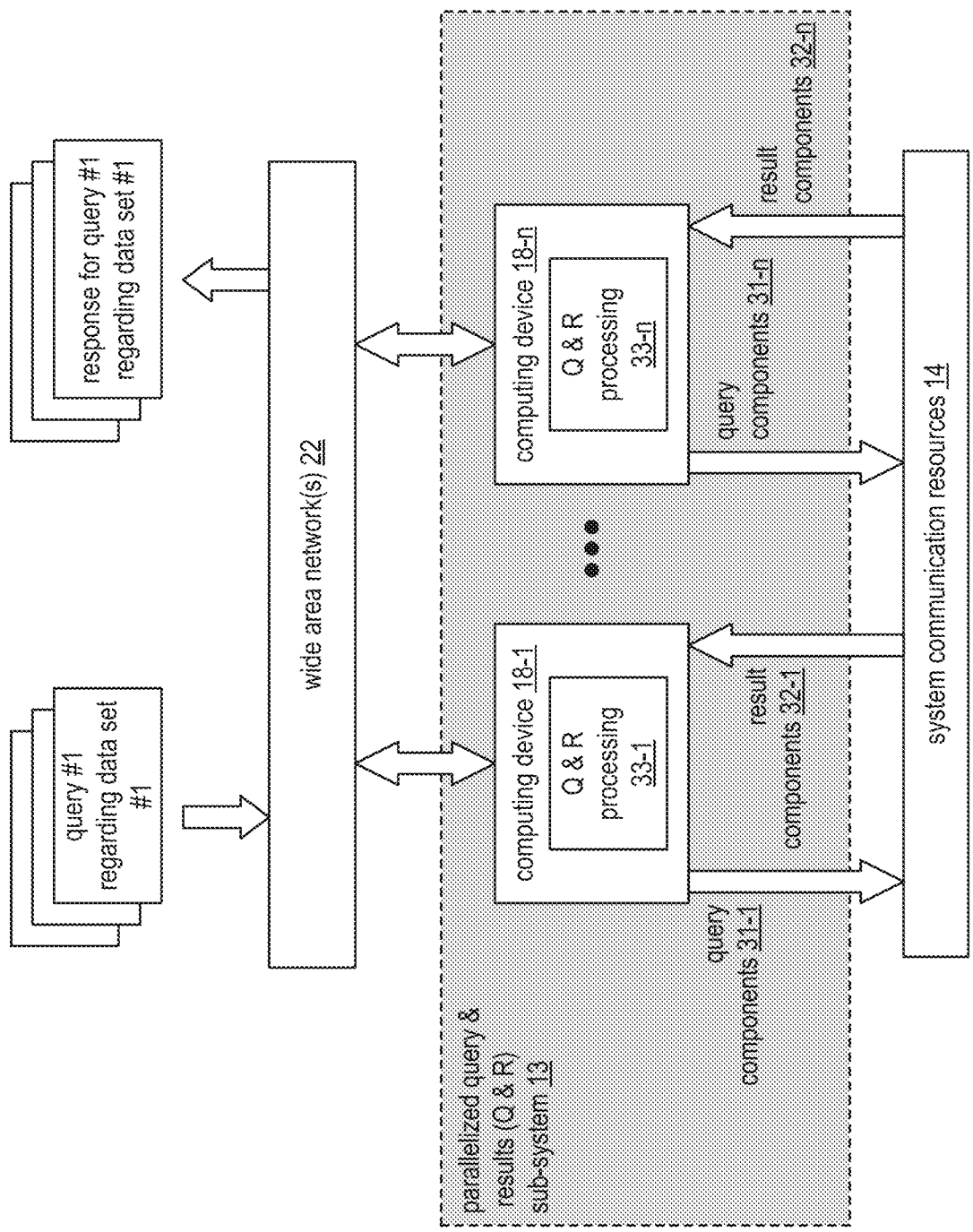
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) function utilizing a corresponding Q & R processing of Q & R processing 33-1 through 33-n. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-n receives a query, via the wide area network 22, issues, via the system communication resources 14 of FIG. 1A, query components 31-1 through 31-n to the parallelized data store, retrieve, &/or process sub-system 12 of FIG. 1A, receives, via the system communication resources 14, results components 32-1 through 32-n, and issues, via the wide area network 22, a response to the query.

The Q & R function enables the computing devices to process queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
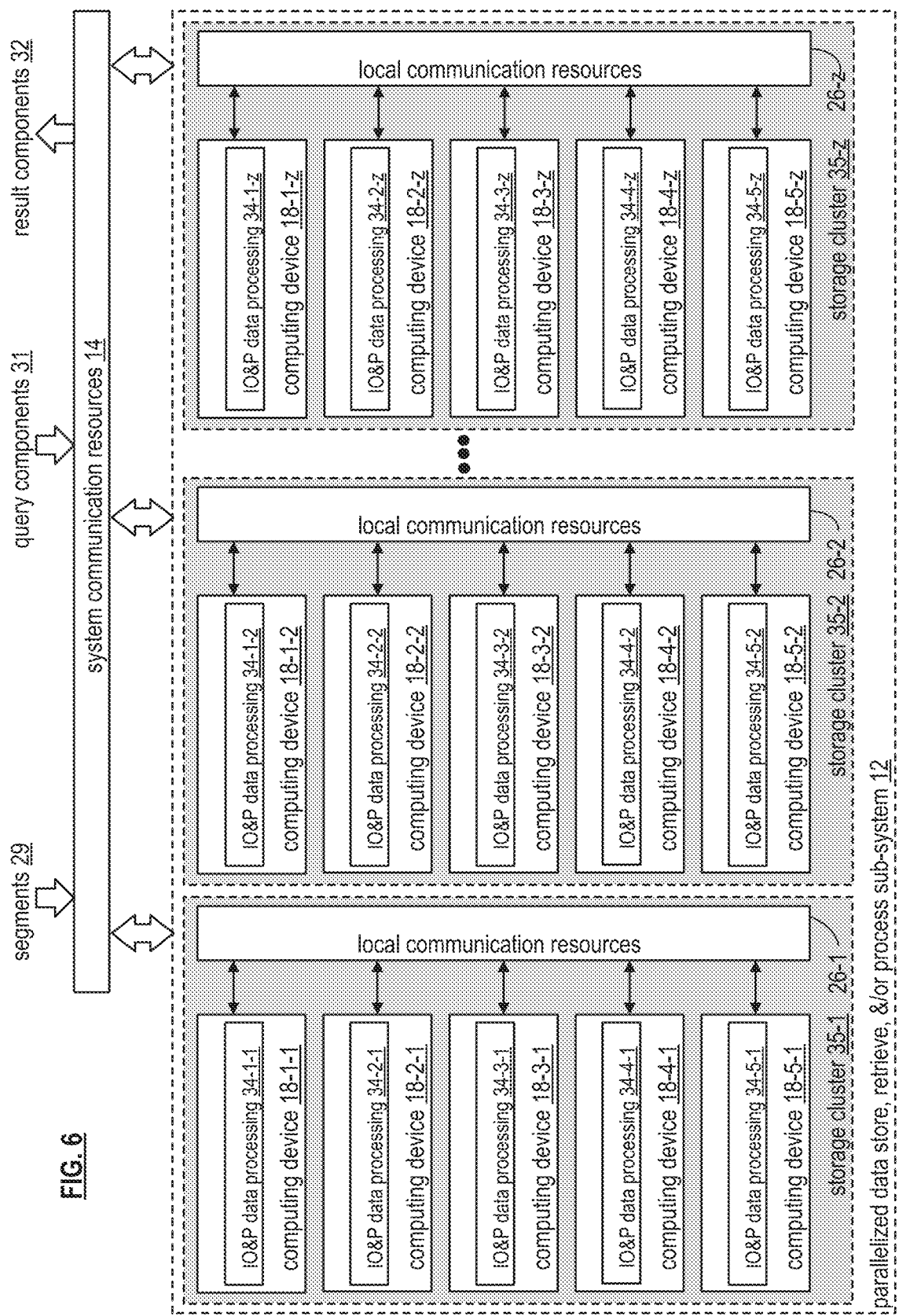
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of storage clusters 35-1 through 35-z. Each storage cluster includes a corresponding local communication resource of a plurality of local communication resources 26-1 through 26-z and includes a plurality of computing devices 18-1 through 18-5 and each computing device executes an input, output, and processing (TO &P) function utilizing a corresponding TO &P function of TO &P functions 34-1 through 34-5 to produce at least a portion of a resulting response. Each local communication resource may be implemented with a local communication resource of the local communication resources 26-1 through 26p of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
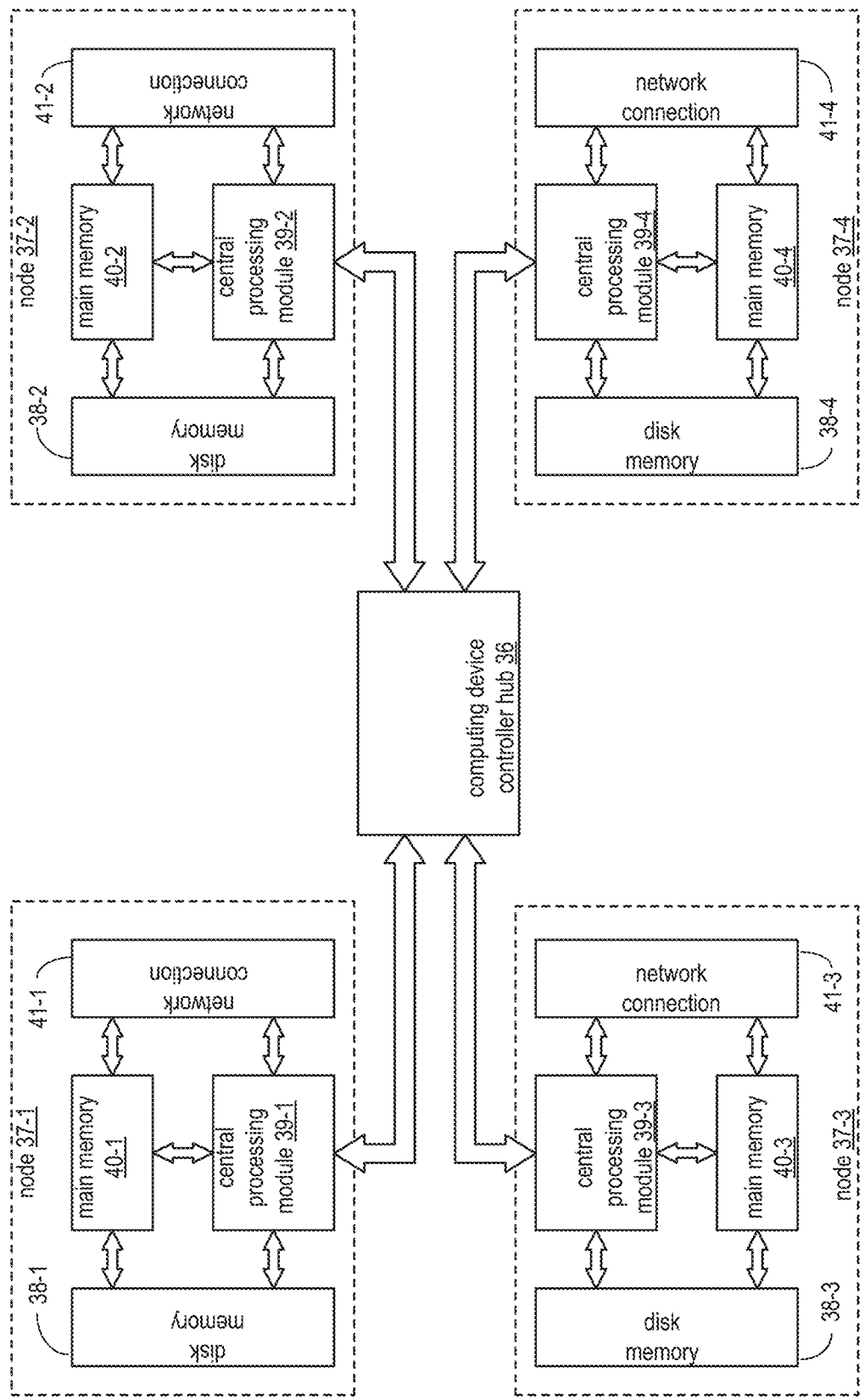
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub

36. The computing device controller hub 36 includes one or more of a chipset, a quick path interconnect (QPI), and an ultra path interconnection (UPI). Each node 37-1 through 37-4 includes a central processing module of central processing modules 40-1 through 40-4, a main memory of main memories 39-1 through 39-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
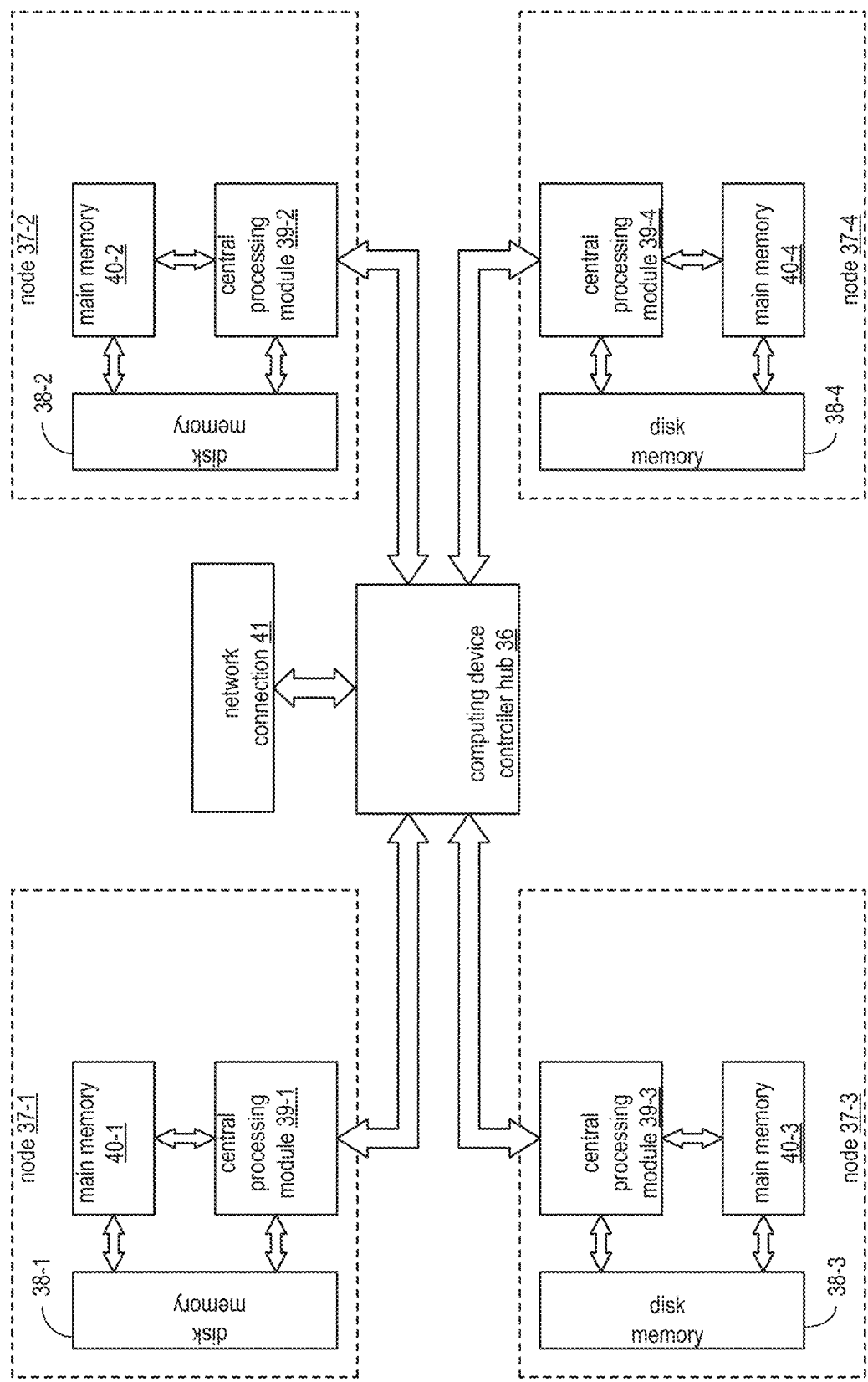
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
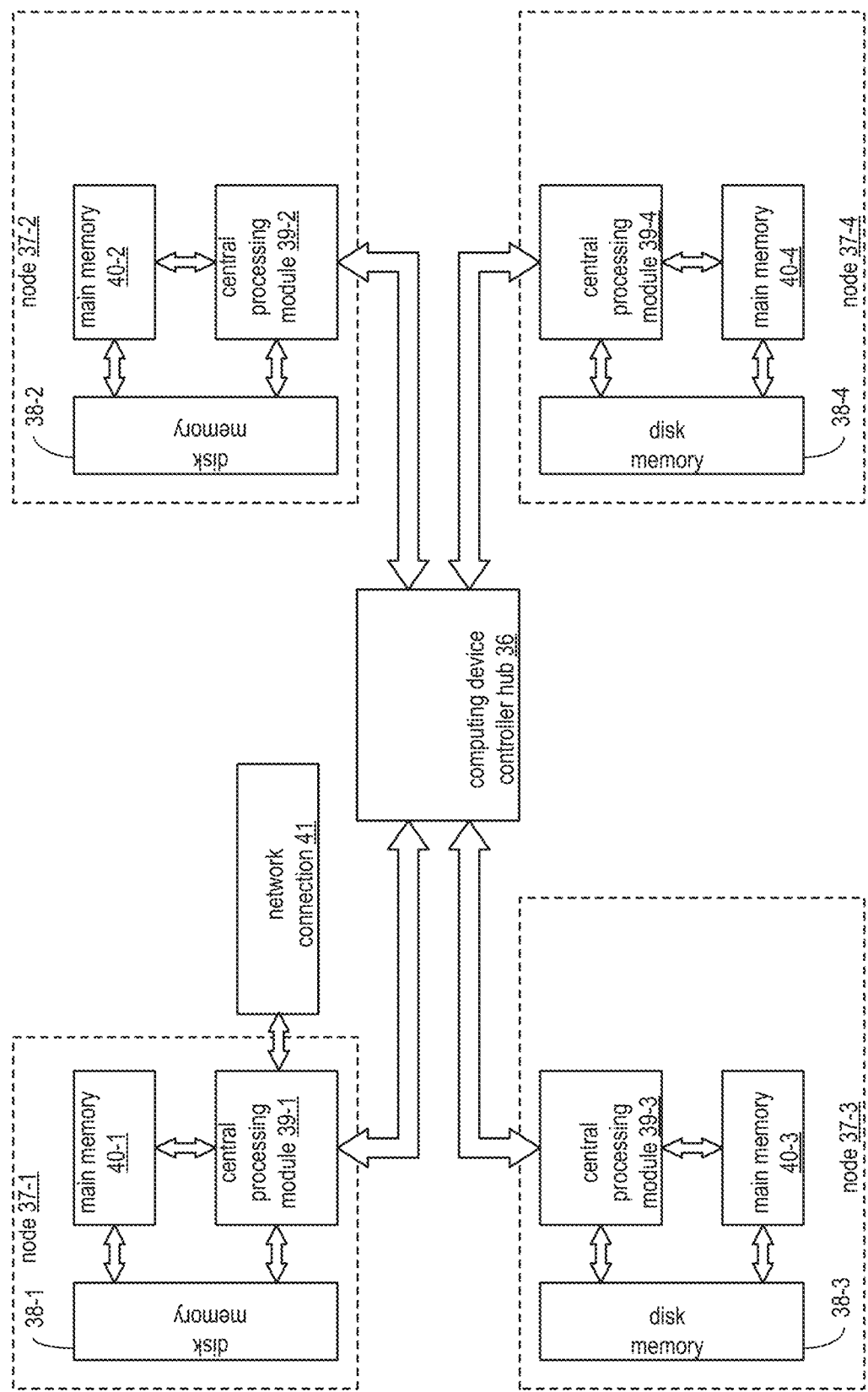
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 40-1 of node 37-1). As such, each node coordinates with the central processing module via the computing device controller hub 36 to transmit or receive data via the network connection.

Figure 10:
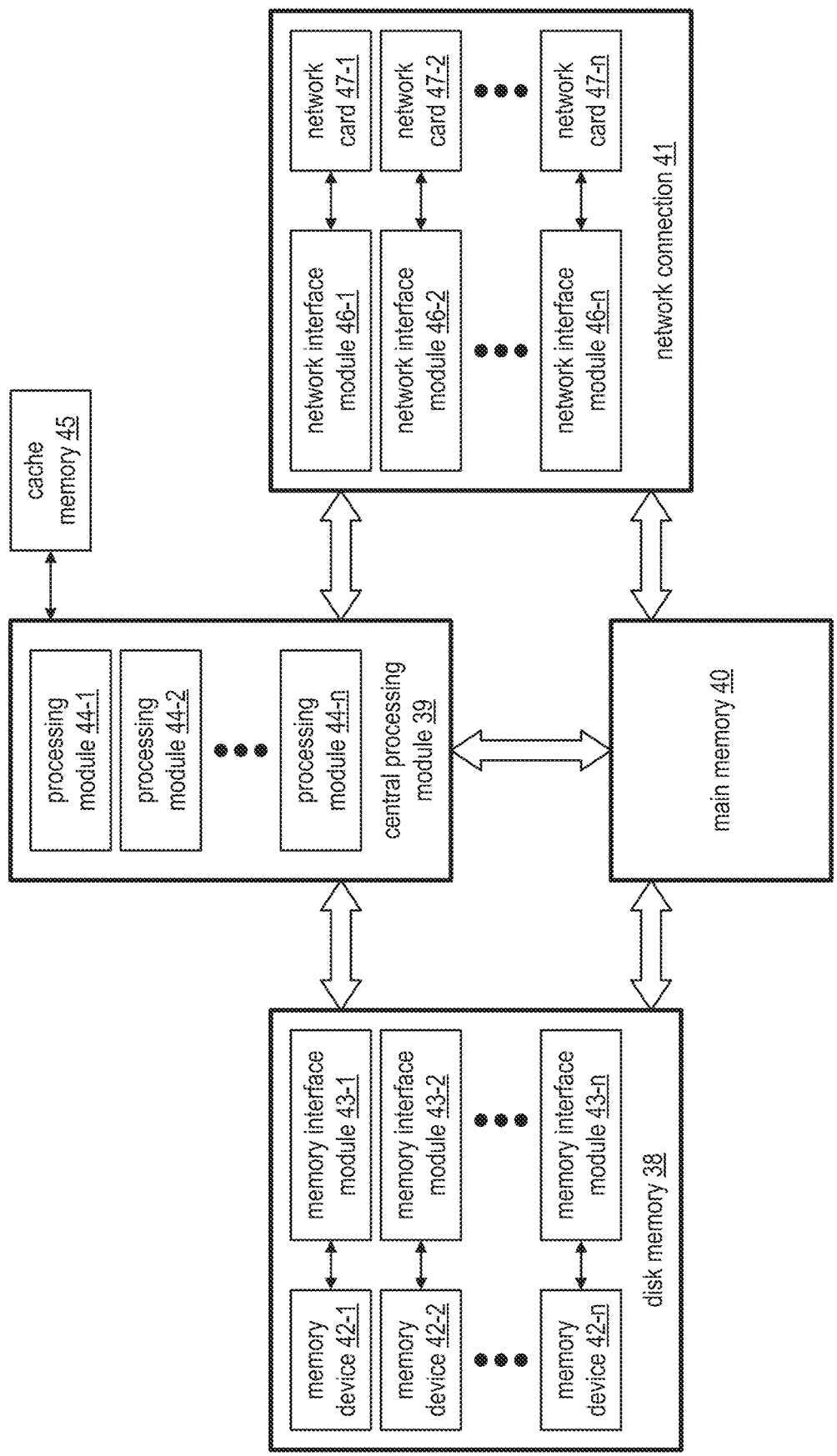
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n. The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
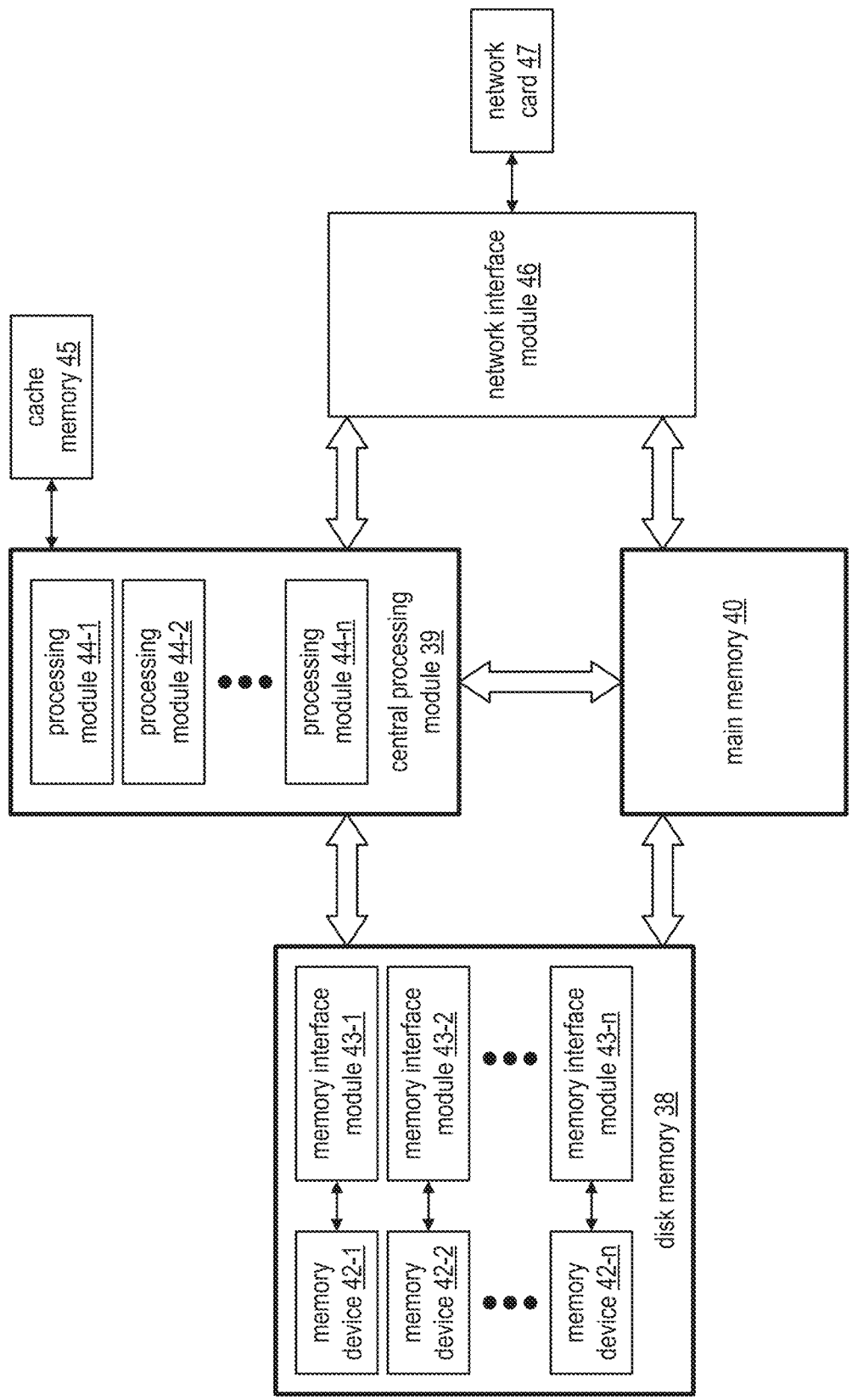
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and corresponding network card 47 configuration.

Figure 12:
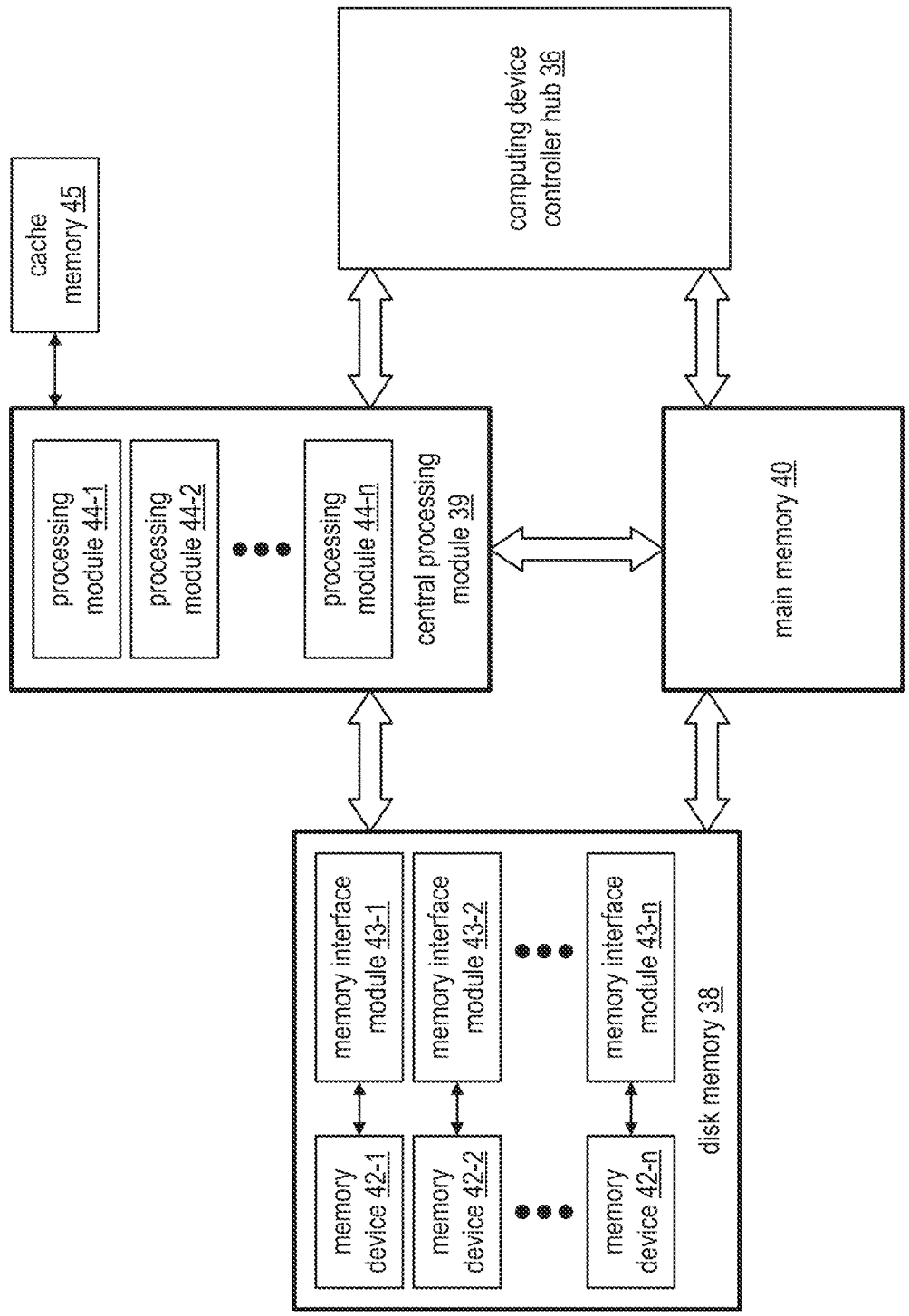
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
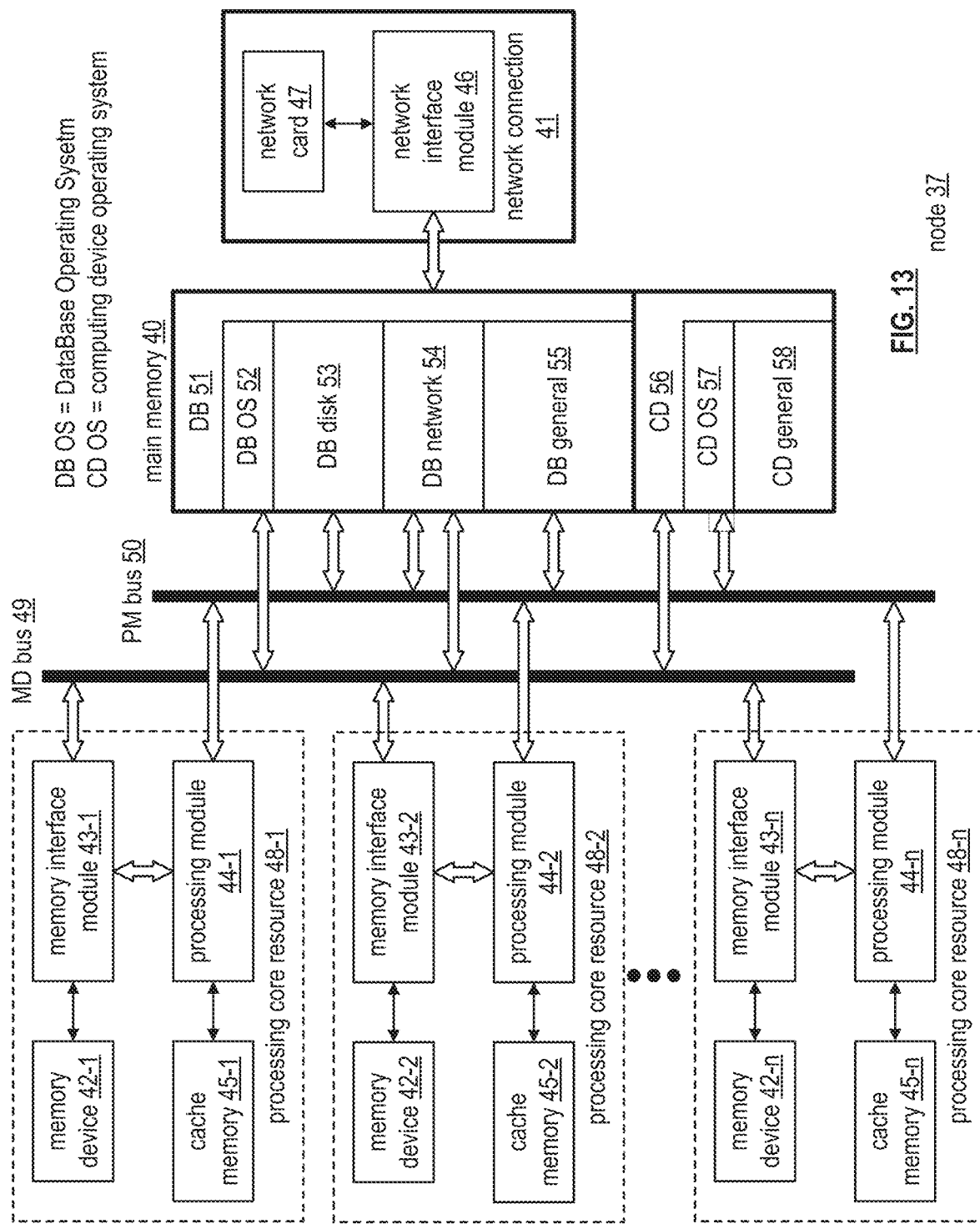
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

In an embodiment, the delineation between memory devices 42-1 through 42-n within the processing core resources is a logical one and not necessarily a physical one. For example, a computing device 18 includes a plurality of physical solid state memory devices (e.g., 2 or more) that are shared by the nodes and by the processing core resources within the nodes. The physical memory is shared logically by the nodes and by their processing core resources. As a specific example, the physical memory has a logical address space of 0 to 1,600, the computing device includes 4 nodes and each node includes 4 processing core resources, totaling 16 processing core resources. Each processing core resource is logically allocated 100 logical addresses for its independent use.

As another example, the computing device includes sixteen physical memory devices (e.g., solid state memory drives) and includes sixteen processing core resources. The logical address space is mapped to the sixteen physical memory devices, which is also allocated to the sixteen processing core resources. As such, each processing core resource is allocated a unique portion of the logical address range that also corresponds to physical boundaries of the physical memory devices.

The main memory 40 is divided into a computing device (CD) 56 section and a database (DB) 51 section. The database section includes a database operating system (OS)

area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
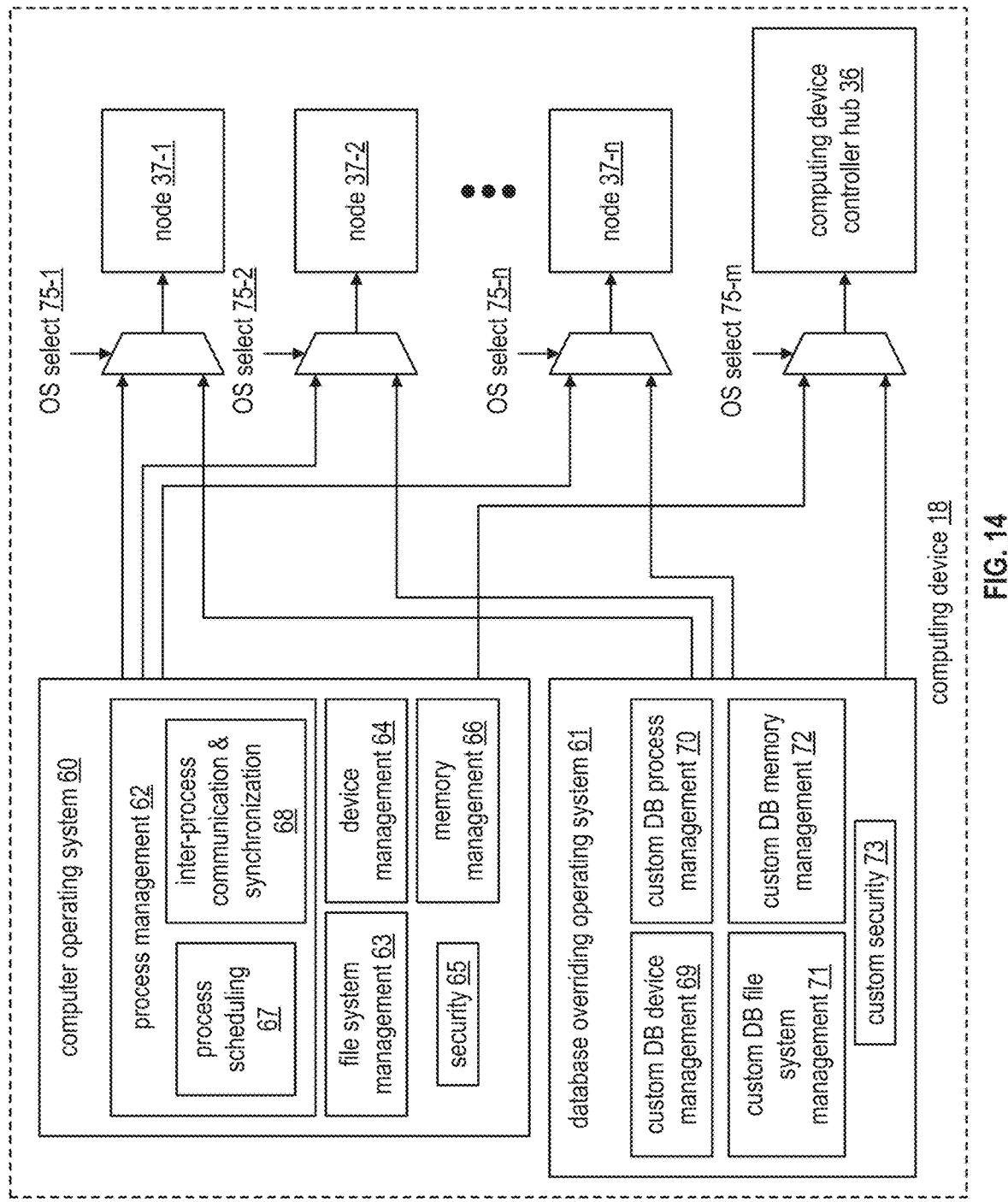
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
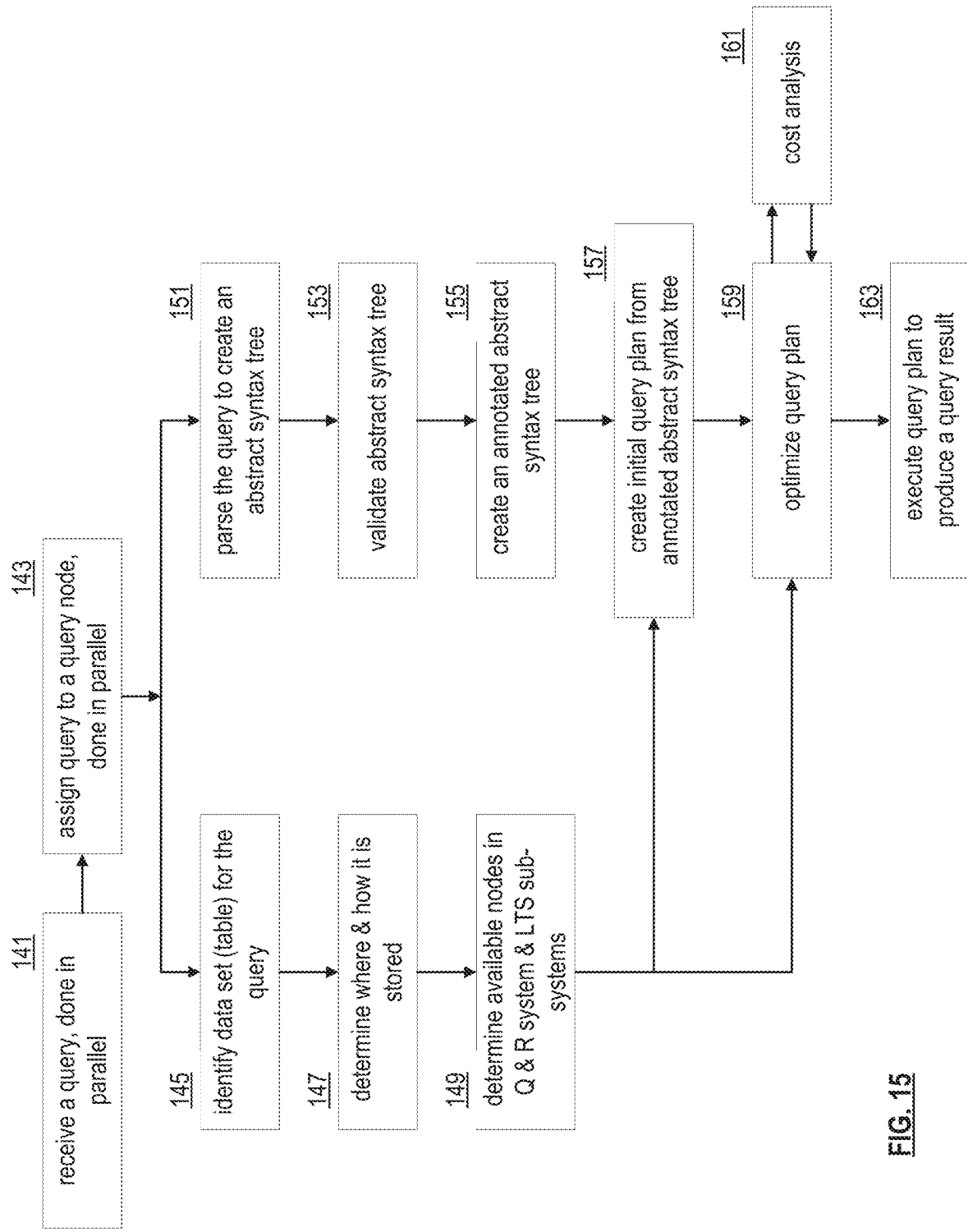
FIG. 15 is a logic diagram of an example of creating a query plan for execution within the database system in accordance with the present invention.

FIG. 15 is a logic diagram of an example of creating a query plan for execution within the database system that begins at steps 141 and 143 where one or more processing core resources of a node, one or more nodes of a computing device, and/or one or more computing devices of the parallelized query & response sub-system (hereinafter referred to as a computing node for the discussion of this figure) is assigned to receive a query. The received query is formatted in one of a variety of conventional query formats. For example, the query is formatted in accordance with Open Database Connectivity (ODBC), Java Database Connectivity (JDCB), or Spark.

The parallelized query & response sub-system is capable of receiving and processing a plurality of queries in parallel. For ease of discussion, the present method is discussed with reference to one query.

The method branches to steps 145 and 151. At step 145, the computing device identifies a table (or tables) for the received query. The method continues at step 147 where the computing device determines where and how the table(s) is/are stored. For example, the computing device determines how the table was partitioned; how each partition was divided into one or more segment groups; how many segments in a segment group; how many storage clusters are storing segment groups; how many computing devices are in a storage cluster; how many nodes per computing device; and/or how many processing core resources per node.

The method continues at step 149 where the computing device determines available nodes (and/or processing core resources) within the parallelized Q&R sub-system for processing operations of the query. In addition, the computing device determines nodes (and/or processing core resources) available for processing operations of the query. Typically, the nodes and/or processing core resources storing a relevant portion of the table will be needed for processing one or more operations of the query.

At step 151, the computing device parses the received query to create an abstract syntax tree. For example, the computing device converts SQL statements of the query into nodes of a syntactic structure of source code and creates a tree structure of the nodes. A node corresponds to a construct occurring in the source code.

The method continues at step 153 where the computing device validates the abstract syntax tree. For example, the computing device verifies one or more of the SQL statements are valid, the conversion to operations of the DB instruction set are valid, the table(s) exists, the selected operations of the DB instruction set and/or the SQL statements yield viable data (e.g., will produce a result, will not cause a deadlock, etc.), etc. If not, the computing device sends an SQL exception to the source of the query.

For validated abstract syntax tree, the method continues at step 155 where the computing device generates an annotated abstract syntax tree. For example, the computing device adds column names, data types, aggregation information, correlation information, subquery information, etc. to the verified abstract system tree.

The method continues at step 157 where the computing device creates an initial query plan from the annotated abstract syntax tree. For example, the computing device selects operations from an operating instruction set of the database system to implement the abstract syntax tree. The operating instruction set of the database system (i.e., DB instruction set) includes the following operations:

Aggregation—aggregates two or more rows based on one or more values of a row and then combine (e.g., sum, average, appended, sort, etc.) into a row;

AggVectorOperationlnstance—use when number of rows is known and is less than or equal to a specific value (e.g., 256), use a vector operation instead of a hash function to aggregate rows, which allows aggregation without the need for caching;

Broadcast—computing device or node sending data to other computing devices or nodes performing similar tasks, functions, and/or operations (typically for lateral data flow in the system);

Eos—"end of stream" is a placeholder to indicate no data, may also be used to indicate a function cannot be performed;

Except—set subtraction;
Extend—add a column to received data;
Gather—combine data together;
GdeLookup—"Global Dictionary Compression" lookup function for data compression;
HashJoin—join data using a hash function;
IncrementBigInt—increment one or more data values in accordance with a test protocol
IncremetingInt—increment one or more data values
Index—uses indexed metadata to reduce amount of data to read and/or to push operations downstream to delay reading;
IndexAgg—aggregation of indexing;
IndexDistinct—indexing of distinct row, rows, column, and/or columns;
SegmentAgg (operator instance)—segmenting of an aggregation operation to produce sub-aggregation operations;
SegmentDistinct (operator instance)—segmenting of a distinct operation to produce sub-distinct operations;
IndexCountStar—
Intersect—is a mathematical function to find data from two or more sets of data that intersect;
JobsVirtual—
Limit—limit the number of rows to be read, to be operated on, etc.;
MakeVector—convert columns into a matrix for linear algebra functions;
UnMakeVector—convert a resulting matrix back into columns;
MatrixExtend—add columns or another matrix to an existing matrix;
Offset—is an offset for data retrieval;
OrderedAgg—ordering of aggregation to allow for lower level aggregation, which allows higher level to be more efficient;
OrderedDistinct—ordering of distinct values at lower levels, which allows higher levels to be more efficient;
OrderedGather—ordering of gathering at lower levels, which allows higher levels to be more efficient;
ProductJoin—nested loop join function (e.g., join data from one or more rows and/or from one or more columns);
ProjectOut—remove a column for data of interest (e.g., want to do this as far downstream as possible);
Rename—change name of a column, (can be used to avoid column name collisions);
Reorder—reorder data of one or more rows and/or one or more columns based on an ordering preference;
Root—conduit for data flow;
Select—select columns from one or more tables;
Shuffle—sub-divide data into a plurality of data sub-divisions (typically for lateral data flow in the system);
Switch—change where to send data when a condition is met;
TableScan—retrieve all of the data of a table;
TableSlabScan (operator instance)—retrieve particular data slabs of a table;
Tee—creates a brand in operational flow when operating on redundant data;
Union—establish a set of operations;
Window—is a specific type of aggregation that captures a moving window of aggregated data (e.g., a running sum, a running average, etc.); and
MultiplexerOperatorInstance for Set/ProductJoin/HashJoin/Sort/Aggregation—allows for lock free multiplexing for various types of operations.

The method continues at step 159 where the computing device optimizes the query plan using a cost analysis of step 161. The initial query plan is created to be executed by a computing device within the parallelized query & response sub-system. Optimizing the plan spreads the execution of the query across multiple layers (e.g., three or more) and to include the other sub-systems of the database system. The computing device utilizes one or more optimization transforms to optimize the initial query plan. The optimization transforms include:

AddDistinctBeforeMinMax: Adds a union distinct before an aggregation operator that only performs min/max
RemoveDistinctBeforeMinMax: The opposite of addDistinctBeforeMinMax
AddDistinctBetoreSemiAnti: Adds a union distinct as the right child of a join that is a semi or anti join
RemoveDistinctBeforeSemiAnti: The opposite of addDistinctBeforeSemiAnti
AggDistinctPushDown: Pushes down an aggregation that is only performing distinct operators (count/sum distinct) below its child
AggDistinctPushUp: The opposite of AggDistinctPushDown
AggregatePushDown: The same as AggDistinctPushDown but for aggregations performing non-distinct operations
AggregatePushUp: The opposite of AggregatePushDown
ConvertProductToHashJoin: Converts a product join with 1hasCol=rhsCol filters into an equivalent hash join
CreateTee: Given a certain node in the tree, searches the rest of the tree for equivalent subtrees, if one or more is found, the equivalent subtrees are deleted and a tee operator is created as the parent of the given node, which then forwards the results to the parents of those equivalent subtrees
Delete Tee: The opposite of create Tee
RedistributeAggDistinct: Moves a distinct aggregation to a lower level (below a gather), and adds a shuffle if needed
DedistributeAggDistinct: The opposite of redistributeAggDistinct
RedistibuteAggregation: The same as redistributeAggDistinct but for non-distinct aggregations
DedistributeAggregation: The opposite of redistributeAggregation
DeletePointlessSort: Deletes a pointless sort from the tree
DeletePointlessSwitch: Deletes a pointless switch from the tree (only happens if all of the extends the switch created were pushed out of the switch-union block)
DuplicateAggBelowShuffles: Given an aggregation (including aggdistinct) with a shuffle as its child, create a copy of the aggregation below the shuffle and update the original to have the correct operations
RemoveAggBelowShuffles: The opposite of duplicateAggBelowShuffles
DuplicateLimit: Given a limit above a gather type operator, create a copy of it below the gather type operator
ExceptPushDown: Pushes an except operator down below all of its child, can only happen if they are all equivalent
ExceptPushUp: The opposite of exceptPushDown
ExceptUnionContract: Given an except with more than 2 children, take children [1, N−1] and make them the children of a union all, which becomes child 1 of the except
ExceptUnionExpand: The opposite of exceptUnionContract
ExtendPushDown ExtendPush Up
IntersectPushDown: The same as exceptPushDown but for an intersect operator
IntersectPushUp: The opposite of intersectPushDown
JoinPushDown: Pushes a join down below its child(ren). Similar to except/intersectPushDown except with a few other cases. If one child is a join it instead swaps the joins, it also has to check that pushing below its children doesn't break the join (for example by creating name collisions or removing columns that needed to exist)
JoinPushUp: The opposite of joinPushDown, but with some more potential for optimizations. Specifically, if the parent is a select on equiJoin columns, the select can be pushed down to all children, or is the parent is a project and the join is a gdcJoin, then this deletes the join and its right subtree entirely
LimitPushDown
LimitPushUp
MakeVectorDown
MakeVectorPushUp
MatrixExtendPushDown
MatrixExtendPushI)own
MergeEquiJoins: Given two adjacent inner hash joins with no other filters, combine them into a single hash join with more children
SplitEquiJoins: The opposite of mergeEquiJoins
MergeExcept: Given two adjacent except operators, take the input to the lower one and make all of its children become children of the higher one
MergeIntersect: The same as mergeExcept but for intersect
MergeTee: Given two adjacent tee operators, take delete the higher one and make its parent additional parents on the lower one
MergeUnion: The same as mergeExcept but for union
MergeWindows: Combine two adjacent window operators into a single one
OffsetPushDown
OffsetPushUp
ProjectOutPushDown
ProjectOutPushUp
PushAggBelowJoin: Duplicates an aggregation below a hash join, and updates the higher one accordingly
PushAggAboveJoin: The opposite of pushAggBelowJoin
PushAggBelowGdcJoin: Given an aggregation above a gdcJoin, this moves it below the gdcJoin if possible. Currently requires that the aggregation does not reference the gdc column at all, or only groups by it. More cases are possible
PushJoinBelowSet: Given a join where one if it's children is a set operator, and moves the join below the set such that there are not multiple joins as the children of the set operator
PushSetBelowJoin: The opposite of pushJoinBelowSet
PushLimitintoIndex: Pushes a limit operator into an index operator, this way the index knows to only output up to LIMIT rows
PushLimitIntoSort: Pushes a limit into a sort operator, which causes us to run a faster limitSort algorithm in the virtual machine (e.g., node or processing core resource)
PushLimitOutOfSort: The opposite of pushLimitIntoSort
PushProjectIntoIndex: Pushes a project into an operator, which causes a not read of a column. Used when start reading all columns in plan generation
PushSelectBelowGdcJoin: Given a select above a gdcJoin, where the select is filtering the compressed column, this converts the filter to a filter on the stored integer mapping of that column, and moves the select below the join. For example, where col1="hello" might be converted to where col1 Key=42
PushSelectintoHashJoin: Given a select above a hash join, where the select filters on lhsCol=rhsCol, this creates additional equi join columns on the hash join
PushSelectOutOfHashJoin: The opposite of pushSelectintoHashJoin
PushSelectintoProduct: The same as pushSelectintoHashJoin but for product joins
PushSelectOut01Product: The opposite of pushSelectIntoProduct
RenamePushDown
RenamePushUp
ReorderPushDown
ReorderPushUp
SelectOutJoinNulls: Given a join that is joining on coil, if coil is nullable this creates a select below the join that has the filter where coil !=NULL
UnselectOutJoinNulls: The opposite of selectOutJoinNulls
SelectPushDown
SelectPushUp
SortPushDown
SortPushUp
SwapJoinChildren: Swaps the order of a joins children
SwitchPushDown: Given a switch operator, push it down over its child. In some cases, this causes copies of the child to become the switch's parents', and in others this causes that child to jump the entire switch union block and become the parent of the union associated with the switch
SwitchPushUp: The opposite of switchPushDown, but nothing jumps because the parents of the switch are inside the switch union block already. Also requires that all parents are equivalent
TeePushDown: Pushes a tee down below its child, causing that child to be copied for each parent of the tee
TeePushUp: The opposite of teePushDown, requires that all parents are equivalent
UnionDistinctCopyDown: Given a union distinct with gathers as its children, creates another 1 child union distinct as the children of those gathers
UnionDistinctCopyUp: The opposite of unionDistinctCopyDown
UnionPushDown: The same as exceptPushDown except for union, also handles the different rules that apply to union all and union distinct
UnionPushlJp: The opposite of unionPushDown, also handles the case where this is the opposite of switchPushDown because the union has an associated switch, so some operators will jump the entire switch union block
UnmakeVectorPushDown
UnmakeVectorPushUp
WindowPushDown
WindowPushUp
post-optimization options
Combining adjacent selects into super Selects
Combining adjacent limits
Combining adjacent offsets
Converting distinct aggregations into a non-distinct aggregation with a union distinct as its child Duplicating union distincts around shuffles, this only happens if there is a union distinct on 1 side of a shuffle, but not both Replacing index type operators with an eos operator we if can determine that the filters (if any) on the index are always false (possible by comparing possible values of data types)

Evaluating alternate indexes besides the primary index

Building orderedAggregations and orderedDistincts

Getting rid of pointless renames

Pushing sorts down to level 3 if possible

Creating indexCountStar operators if possible

Fixing out of order indexAggs, this makes the grouping key order match the primary index order when possible Tee'ing leaf operators, this combines as many equivalent leaf operators as possible to reduce IO Deleting pointless reorders Note that the Down and push Up transforms are used frequently, and mean to take the given operator and swap its position in the tree with its child (or parent) for most operators. Further note that not all of these transforms are legal in all possible cases, and they only get applied if they are legal.

The method continues at step 163 where the query plan is executed to produce a query result. The execution of the query plan is discussed in greater detail in subsequent figures.

Figure 16:
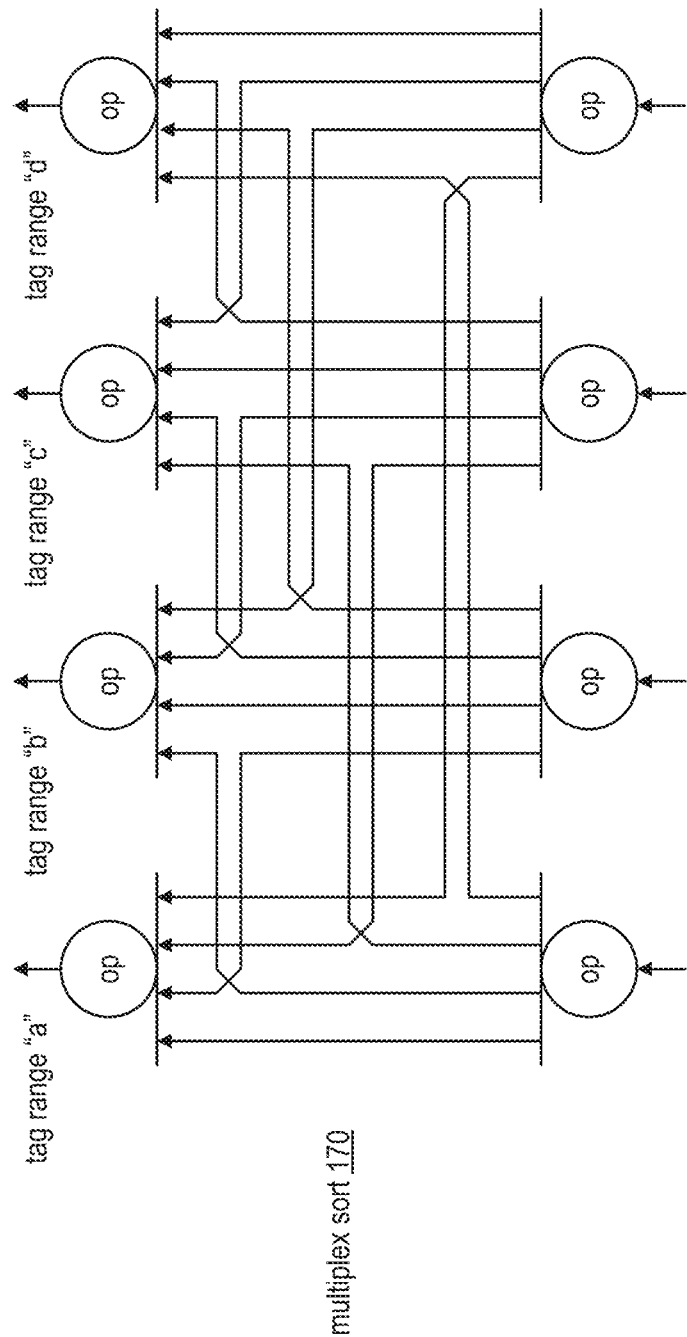
FIG. 16 is a schematic block diagram of an example of a multiplexed multi-thread sort operation in accordance with the present invention.

FIG. 16 is a schematic block diagram of an example of a multiplexed multi-thread sort operation 170. In general, a multiplexed multi-thread sort operation allows operations in threads downstream to send operation results (e.g., data, intermediate data, an operand, a result of a mathematic function, a result of a logic function, etc.) to a specific upstream operation in one of the threads.

For example, four threads of operations include a multiplex sort. The downstream operations in the threads (e.g., the operations on the bottom of the figure) execution an operation to produce a result or data value. For each result or data value that falls in range "a" is sent upstream to the operation in the far-left thread. For each result or data value that falls in range "b" is sent upstream to the operation in the second from the left thread. For each result or data value that falls in range "c" is sent upstream to the operation in the second from the right thread. For each result or data value that falls in range "d" is sent upstream to the operation in the far-right thread.

The operations use a bucket sort operation when the results or data values are of a defined set of values (e.g., integers, dates, time, etc.) to identify the appropriate upstream operation. When the results or data values are not of defined set of values (e.g., names, floating point data, etc.), the operations use a normal sort function to identify the appropriate upstream operation.

As a specific example, assume that range "a" is from negative infinity to −1 million; range "b" is from −999,999 to −1; range "c" is from 0 to 999,999; and range "d" is from +1 million to infinity. As such, the downstream operations would use one or more normal sort functions for ranges "a" and "d" and uses one or more bucket sort functions for ranges "b" and "c".

Figure 17:
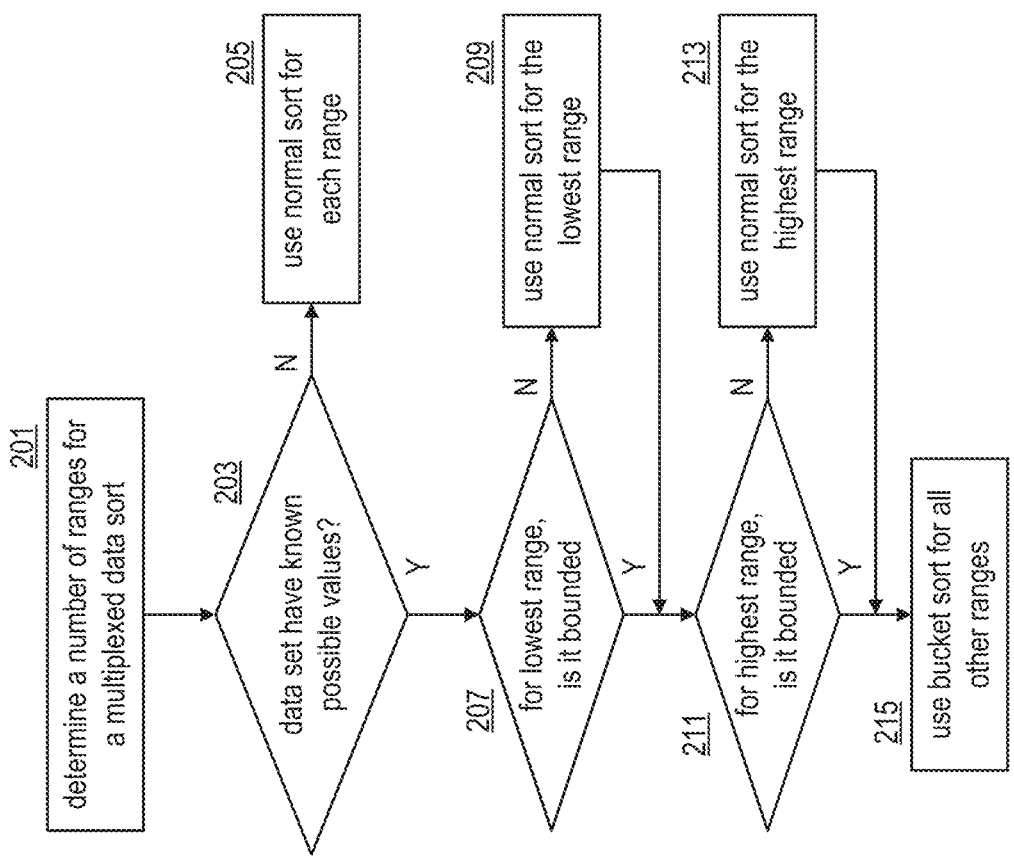
FIG. 17 is a logic diagram of an example of a method for executing a multiplexed multi-thread sort operation in accordance with the present invention.

FIG. 17 is a logic diagram of an example of a method for executing a multiplexed multi-thread sort operation that begins at step 201 where a processing core resource (executing one or more threads) determines a number of ranges for a multiplexed multi-thread sort operation. The number is two or more. The method continues at step 203 where the processing core resource determines whether the data set of results or data values are of a known set of possible values (e.g., integers, dates, time, etc.). If not, the method continues at step 205 where the processing core resource uses one or more normal sort functions to sort the data into the various ranges of the multiplexed multi-thread sort operation.

If, at step 203, the data set has at least some known possible values, the method continues at step 207 where the processing core resource determines whether the lowest range is bounded. For example, when there is a specific lowest value (e.g., −1 million), then the lowest range is bounded. As another example, when there is not a specific lowest value (e.g., −infinity), the lowest range is not bounded. When the lowest range is not bounded, the method continues at step 209 where the processing core resource uses a normal sort function for the lowest range. Whether the lowest range is bounded or not, the method continues at step 211 where the processing core resource determines whether the highest range is bounded. If not, the method continues at step 213 where the processing core resources uses a normal sort function for the highest range. Whether or not the highest range is bounded, the method continues at step 215 where the processing core resource uses a bucket sort function for all other ranges that have not yet been flagged for a normal sort function.

Figure 18:
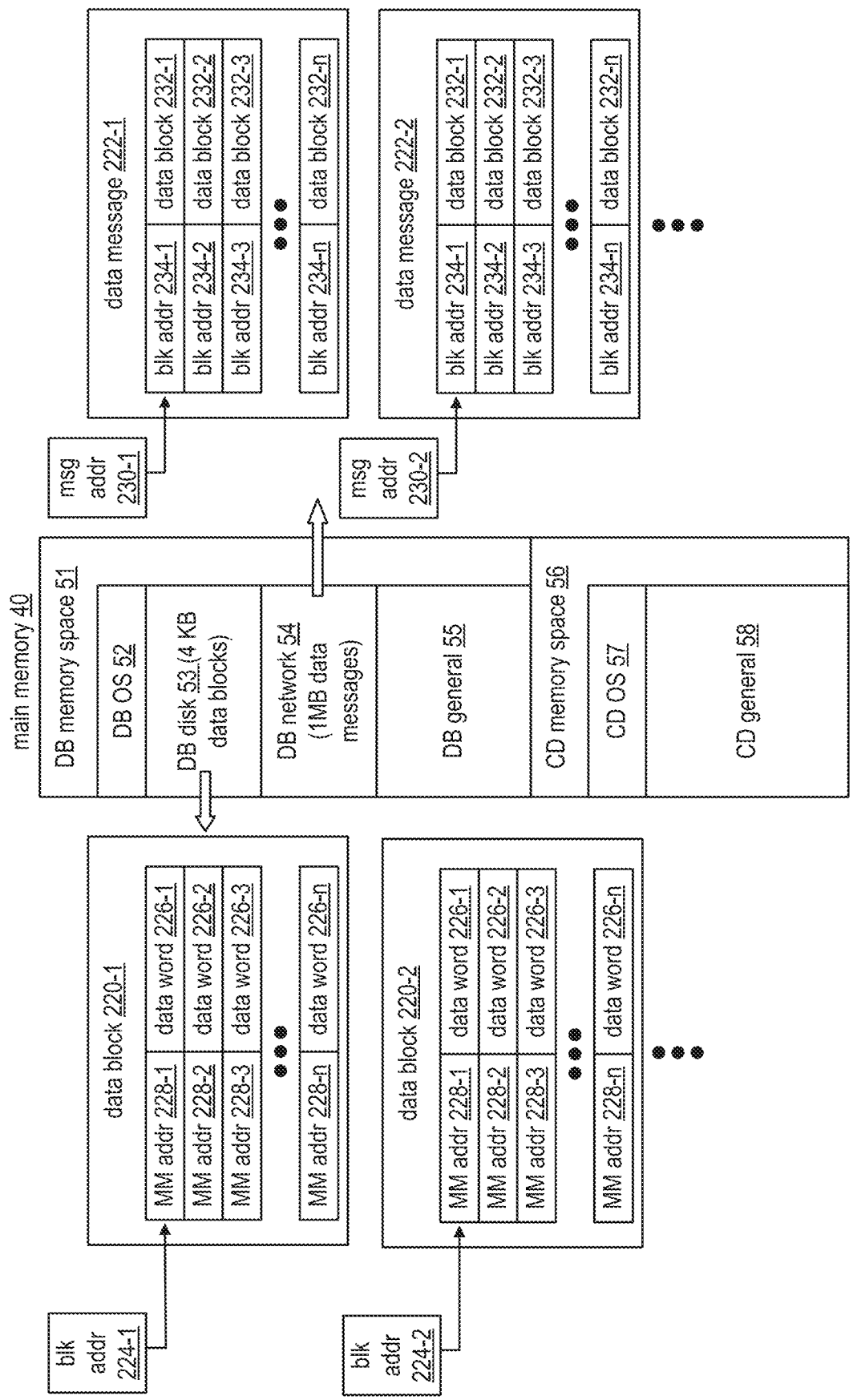
FIG. 18 is a schematic block diagram of an example of data blocks and data messages for direct memory access of a processing core resource and/or of a network connection in accordance with the present invention.

FIG. 18 is a schematic block diagram of an example of a plurality of data blocks 220-1, 220-2 etc. and a plurality of data messages 222-1, 222-2 etc. of the main memory 40 of FIG. 13 to enable direct memory access of a processing core resource and/or of a network connection. Data blocks include corresponding block addresses 224-1, 224-2 etc. that are logical block addresses for system's operations and corresponds to physical addresses for data accesses. Each data block includes a plurality of data words 226-1 through 226-$n$, which range in size from 1 Byte to 32 Bytes or more. Each data word has an associated main memory (MM) address of MM addresses 228-1 through 228-$n$ that, from a logical address perspective, are sequential offsets from the block address. For example, if each data word is the 32 Bytes and the data block is 4 K Bytes (actually 4,096 Bytes), there are 128 data words in a data block. The block address corresponds to the address of the first data word in the block. The other addresses in the block are the next sequential data word addresses corresponding to the next data words.

Accordingly, when a data block is written into the disk memory section 53 of the database (DB) memory space 51, it is done so as a data block with each data word having a sequential address. This facilitates direct memory access of the main memory 40 by the memory devices via the respective memory interfaces.

Data messages includes a corresponding message address of message addresses 230-1, 230-2 etc. and a plurality of data blocks 232-1 through 232-$n$. Each data block has an associated block address of block addresses 234-1 through 234-$n$. The block addresses are logical addressees and are sequential within a data message. The message address corresponds to the first data block address and the other data block addresses are a logical offset from the first. For example, a data message is 1 M Byte in size and includes 256 4 Kbyte data blocks. This message data structure within the DB network section 54 of the main memory 40 facilitates the network connection to have direct memory access.

FIGS. 19A-19E are schematic block diagrams of an example of dividing a table 236 into partitions having one or more segment groups for storage and subsequent query processing. The dividing may be done logically and/or physically. For example, the table is physically divided int partitions and each partition is physically divided into segments. A segment is sent to a computing device of a storage cluster for storage therein. Within a computing device, the segment is logically divided into data segment divisions (e.g., see FIG. 24) and one or more of the data segment divisions is further logically divided into data segment sub-divisions (e.g., see FIG. 25).

The logical dividing and sub-dividing allow for more efficient query processing of the table since a sub-division of the table is allocated, or affiliated, with a processing core resource of a node of a computing device of a storage cluster. In a specific example, the segment allocated to a computing device is stored in the disk memory of the computing device as a single data object (i.e., physically not divided into divisions and sub-divisions for storage). In another specific example, the segment is physically divided into divisions and one or more of the divisions are stored as physically separate data objects. In yet another specific example, a division is physically divided into sub-divisions and one or more of the sub-divisions are stored as physically separate data objects.

Figure 19A:
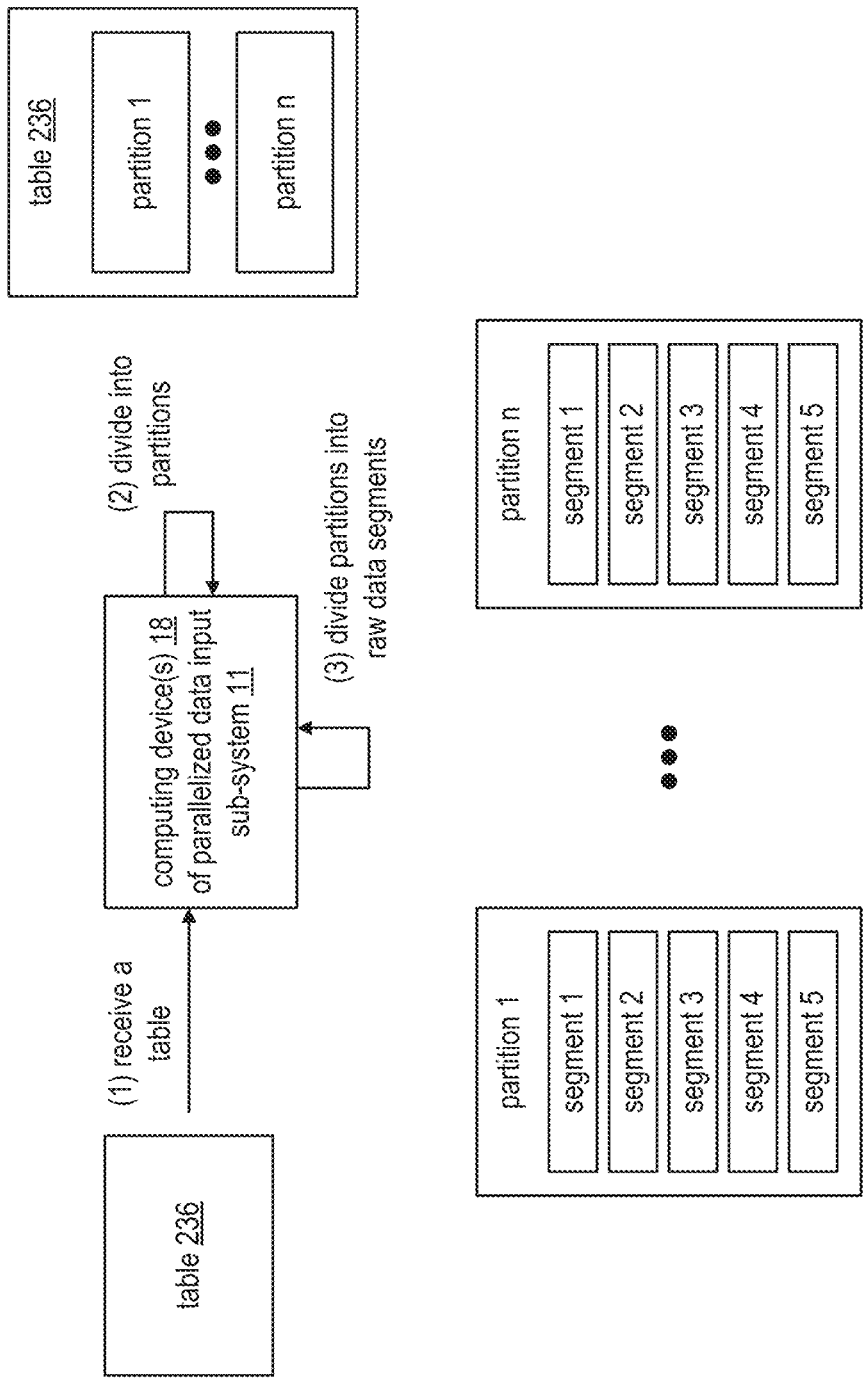
Figure 19B:
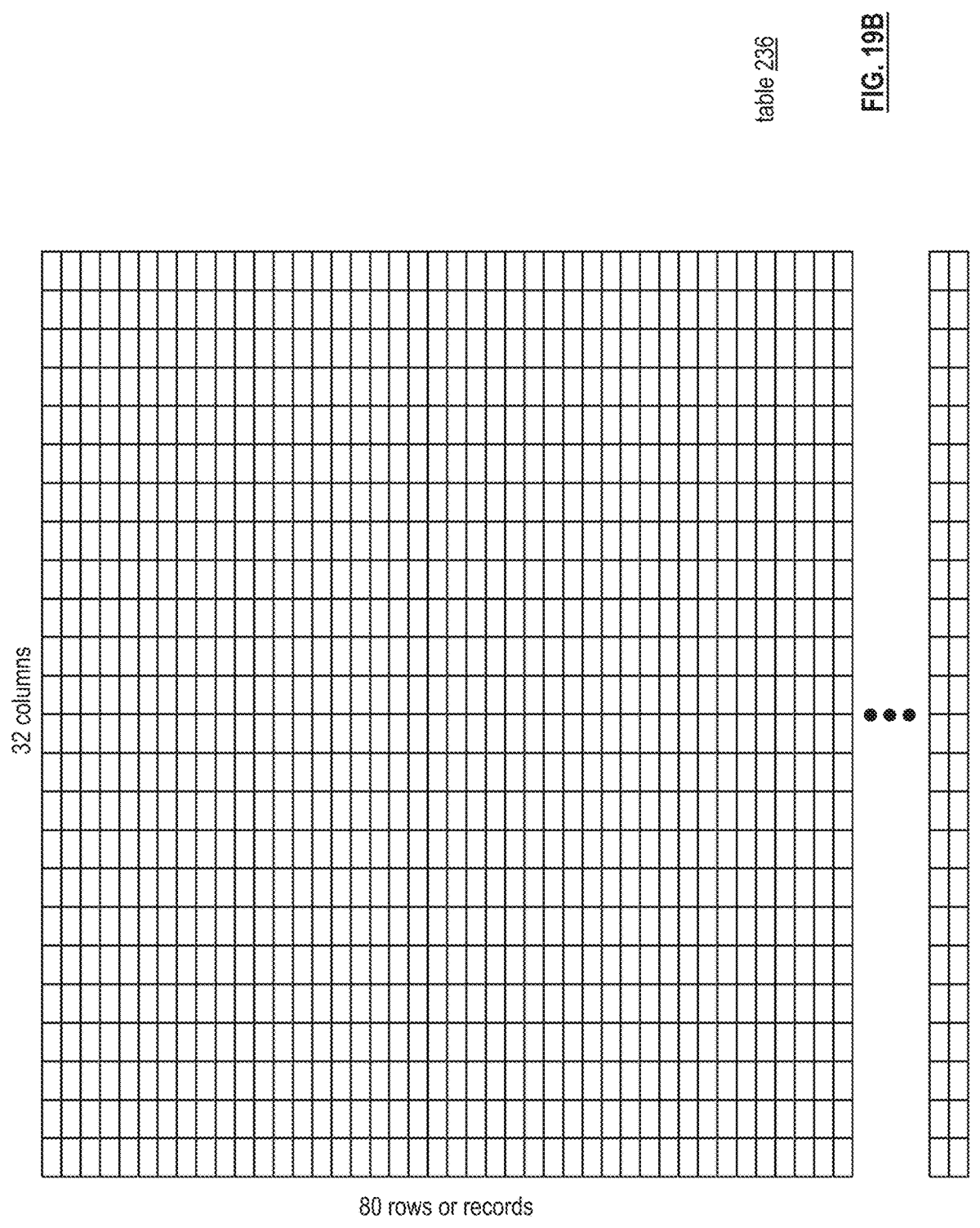

In FIG. 19A, one or more computing devices 18 of the parallelized data input sub-system 11 receive table 236. The computing device(s) 18 divides the table 236 into partitions (e.g., partitions 1-2). The computing device(s) 18 divides each partition into one or more segment groups, with each segment group including a plurality of segments (e.g., 1-5). FIG. 19B illustrates an example of table 236 that includes 32 columns and 80 rows, or records. This is a very small table but is sufficient for illustrating one or more concepts regarding one or more aspects of a database system. The table is representative of a variety of data ranging from insurance data, to financial data, to employee data, to medical data, and so on.

Figure 19C:
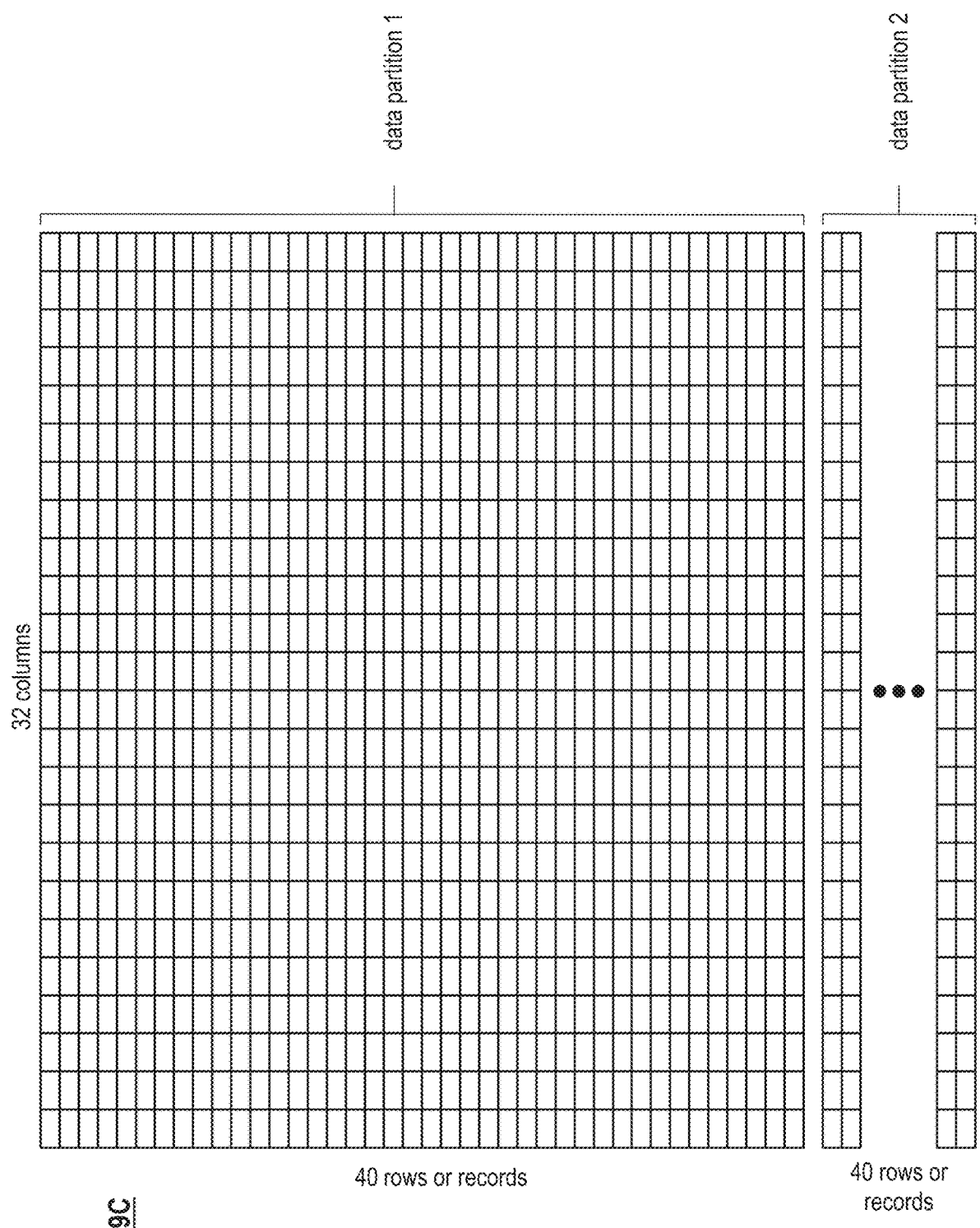

FIG. 19C illustrates an example of the computing device(s) 18 dividing the table 236 into two partitions. Each of the data partitions includes 40 rows, or records, of table 236. In another example, the computing device(s) 18 divide the table 236 into more than two partitions. In yet another example, the computing device(s) 18 divide the table 236 into many partitions and at least two of the partitions have a different number of rows.

Figure 19D:
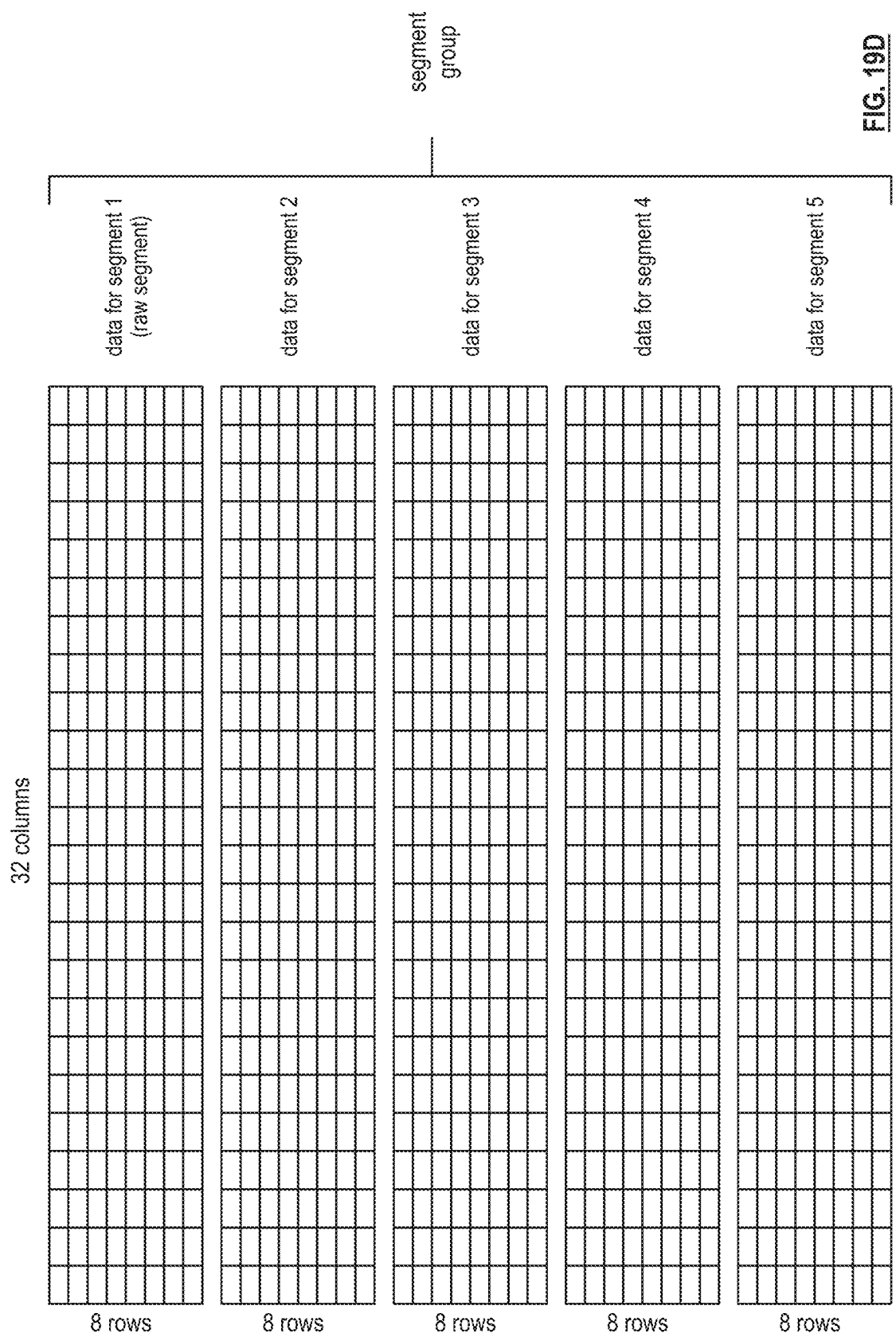

FIG. 19D illustrates an example of the computing device(s) 18 dividing a data partition into a plurality of segments to form a segment group. The number of segments in a segment group is a function of the data redundancy encoding. In this example, the data redundancy encoding is single parity encoding from four data pieces; thus, five segments are created. In another example, the data redundancy encoding is a two parity encoding from four data pieces; thus, six segments are created. In yet another example, the data redundancy encoding is single parity encoding from seven data pieces; thus, eight segments are created.

FIG. 19E illustrates an example of data for segment 1 of the segments of FIG. 19D. The segment is in a raw form since it has not yet been key column sorted. As shown, segment 1 includes 8 rows and 32 columns. The third column is selected as the key column and the other columns stored various pieces of information for a given row (i.e., a record).

As an example, the table 236 is regarding a fleet of vehicles. Each row represents data regarding a unique vehicle. The first column stores a vehicle ID, the second column stores make and model information of the vehicle. The third column stores data as to whether the vehicle is on or off. The remaining columns store data regarding the operation of the vehicle such as mileage, gas level, oil level, maintenance information, routes taken, etc.

With the third column selected as the key column, the other columns of the segment are to be sorted based on the key column. Prior to sorting, the columns are separated to form data slabs. As such, one column is separated out to form one data slab. This may be done by the computing device(s) 18 that is creating the partitions or by an L2 computing device (e.g., one of the computing device of a storage cluster selected as the host computing device). The remainder of this example assumes that the L2 host computing device is creating the data slabs and sorting them based on the key column. In the alternative, the initial computing device(s) could create the data slabs and sort them.

Figure 20:
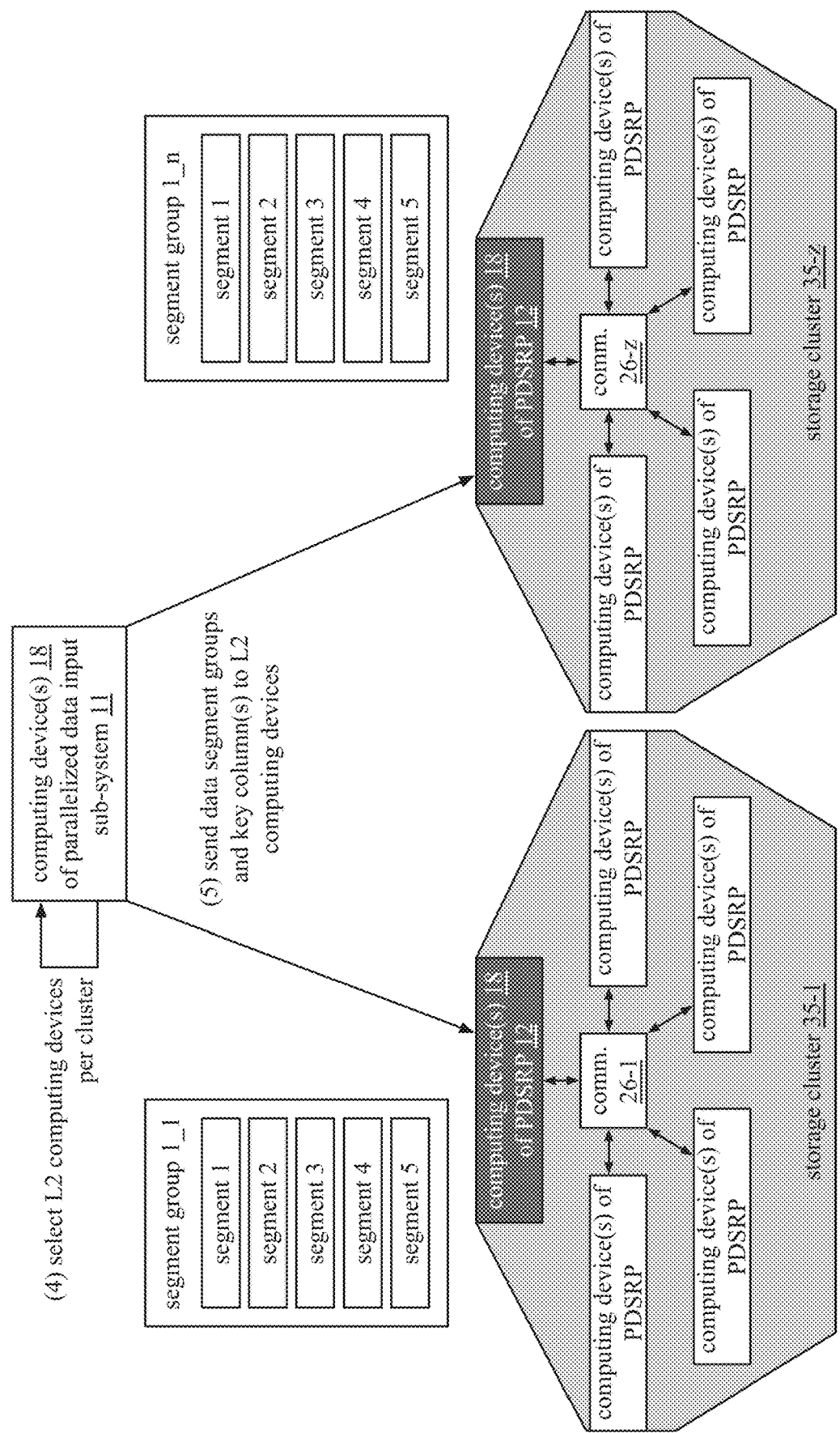
FIG. 20 is a schematic block diagram of an example of sending data segment groups and key column(s) to level 2 (L2) computing devices in accordance with the present invention.

FIG. 20 is a schematic block diagram of an example of sending data segment groups and key column(s) to level 2 (L2) computing devices. Computing device(s) 18 of the parallelized data input sub-system system 11 (e.g., the parallelized data store, retrieve, &/or process sub-system (PDSRP)) select a level 2 (L2) computing device 18 (e.g., a host computing device) from each storage cluster of storage clusters 35-1 through 35-z to which a segment group is being sent. For example, the darker gray shaded box of storage cluster 35-1 is the L2 computing device 18 for this cluster and the darker gray shaded box of storage cluster 35-z is the L2 computing device 18 for storage cluster 35-z.

The selection of the L2 computing devices 18 can be done in a variety of ways. For example, the L2 computing device is selected based on a predetermined selection process. As another example, the L2 computing device is selected based on a pseudo random selection process. As another example, the L2 computing device is selected in a round-robin manner. Having selected the L2 computing devices for each storage cluster, the computing device 18 of the parallelized data input sub-system 11 sends a corresponding segment group of segment groups 1_1 through 1_n to each L2 computing device.

Figure 21A:
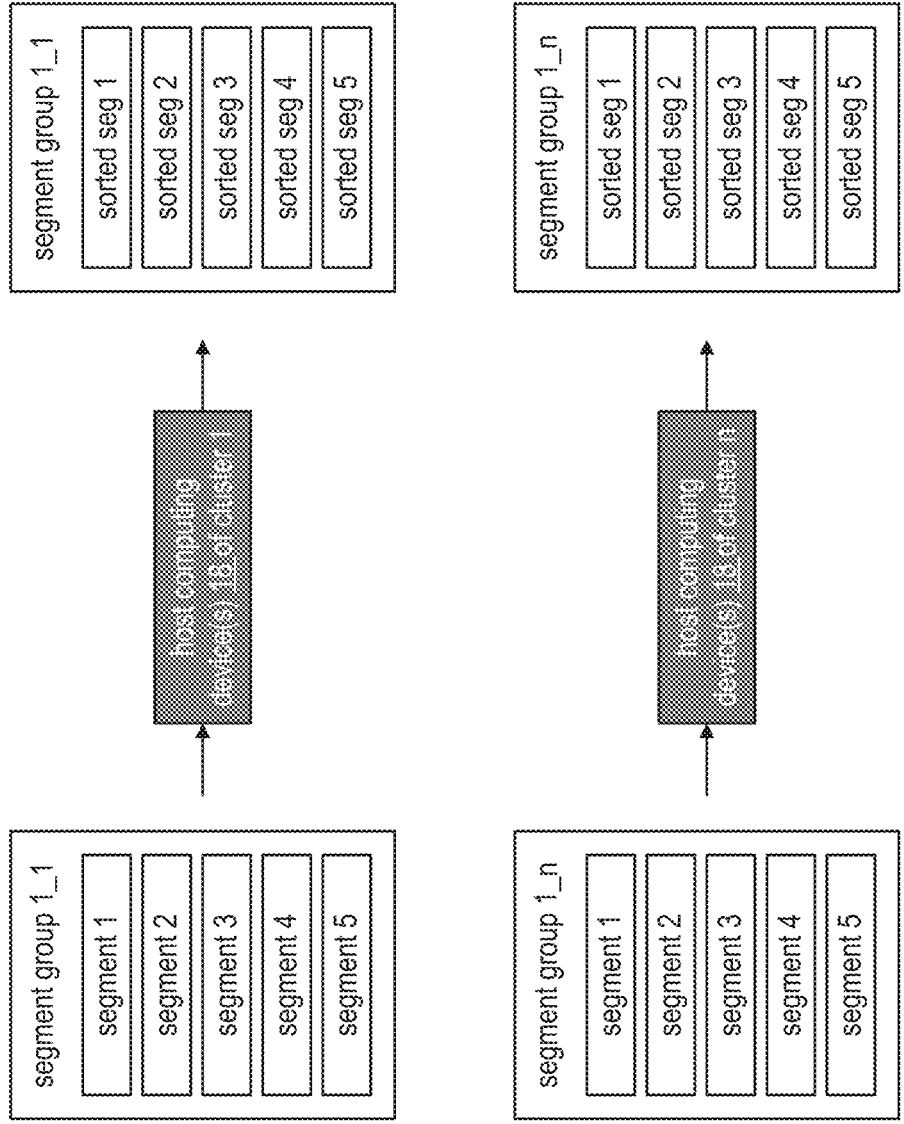

FIGS. 21A-21D are schematic block diagrams of an example of sorting each segment of its segment group to produce a segment group of sorted segments. FIG. 21A illustrates each of the L2 computing devices 18 (e.g., host computing devices) sorting each segment of its segment group to produce a segment group of sorted segments. The sorting is based on one or more key columns.

FIG. 21B illustrates an example of the L2 computing devices 18 of the parallelized data input-subsystem dividing a segment (e.g., segment 1 of FIG. 19E) into a plurality of data slabs. A data slab is a column of segment 1. In this Figure, the data of the data slabs has not been sorted. Once the columns have been separated into data slabs, each data slab is sorted based on the key column. Note that more than one key column may be selected and used to sort the data slabs based on two or more other columns.

FIG. 21C illustrates an example of each of the L2 computing devices 18 sorting the data slabs based on the key column. In this example, the data slabs are sorted based on the third column which includes data of "on" or "off". The rows of a data slab are rearranged based on the key column to produce a sorted data slab. For example, data in a row corresponding to "on" is sorted to the top. Each segment of the segment group is divided into similar data slabs and sorted by the same key column to produce sorted data slabs. The result is a sorted data segment having sorted data slabs.

Figure 21D:
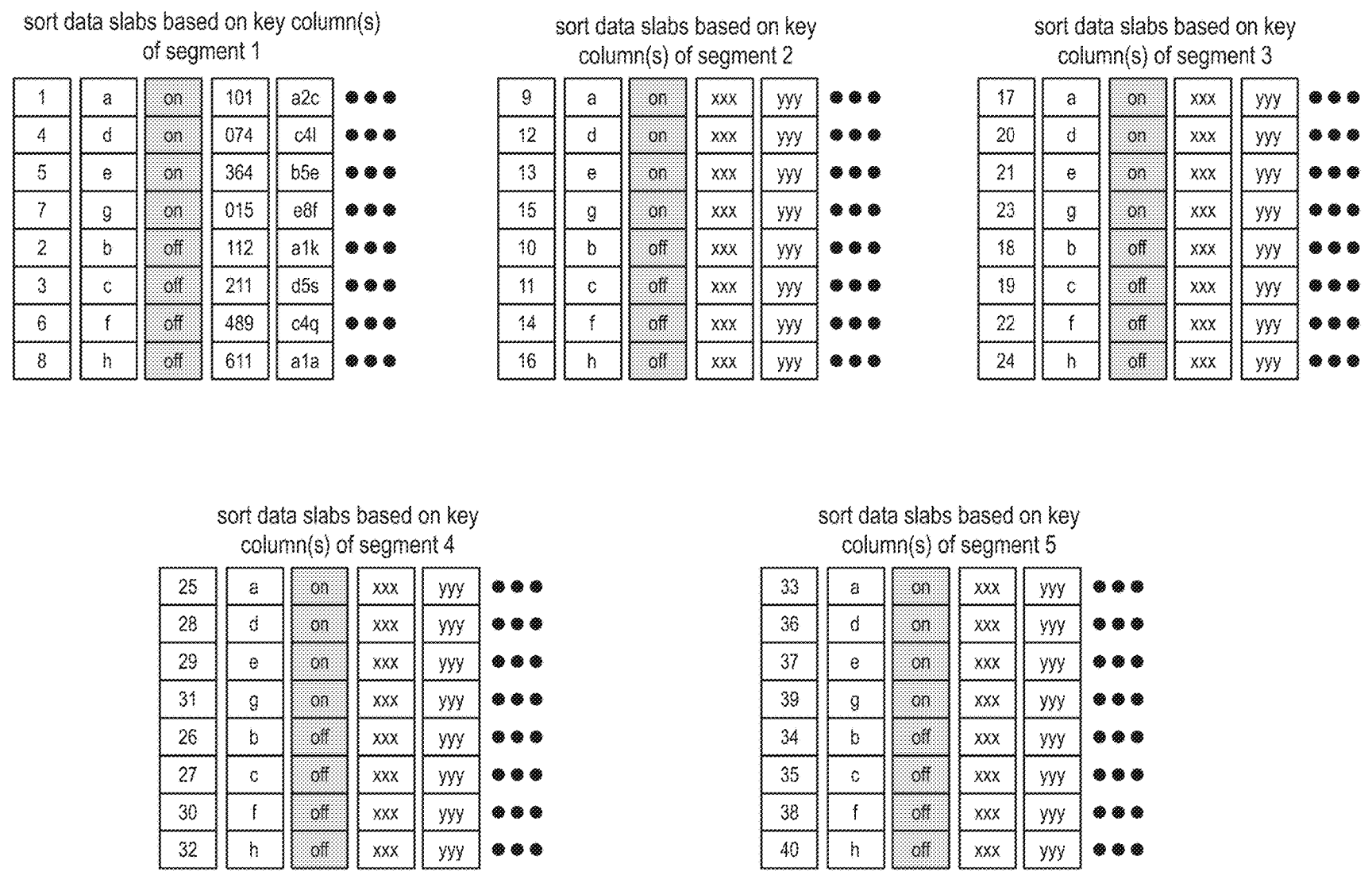

FIG. 21D illustrates an example of each segment being sorted to produce sorted data segments. The similarity of data from segment to segment is for the convenience of illustration. Note that each segment has its own data, which may or may not be similar to the data in the other sections.

Each segment is divided into the same number of data slabs and are sorted based on the same key column.

Figure 22A:
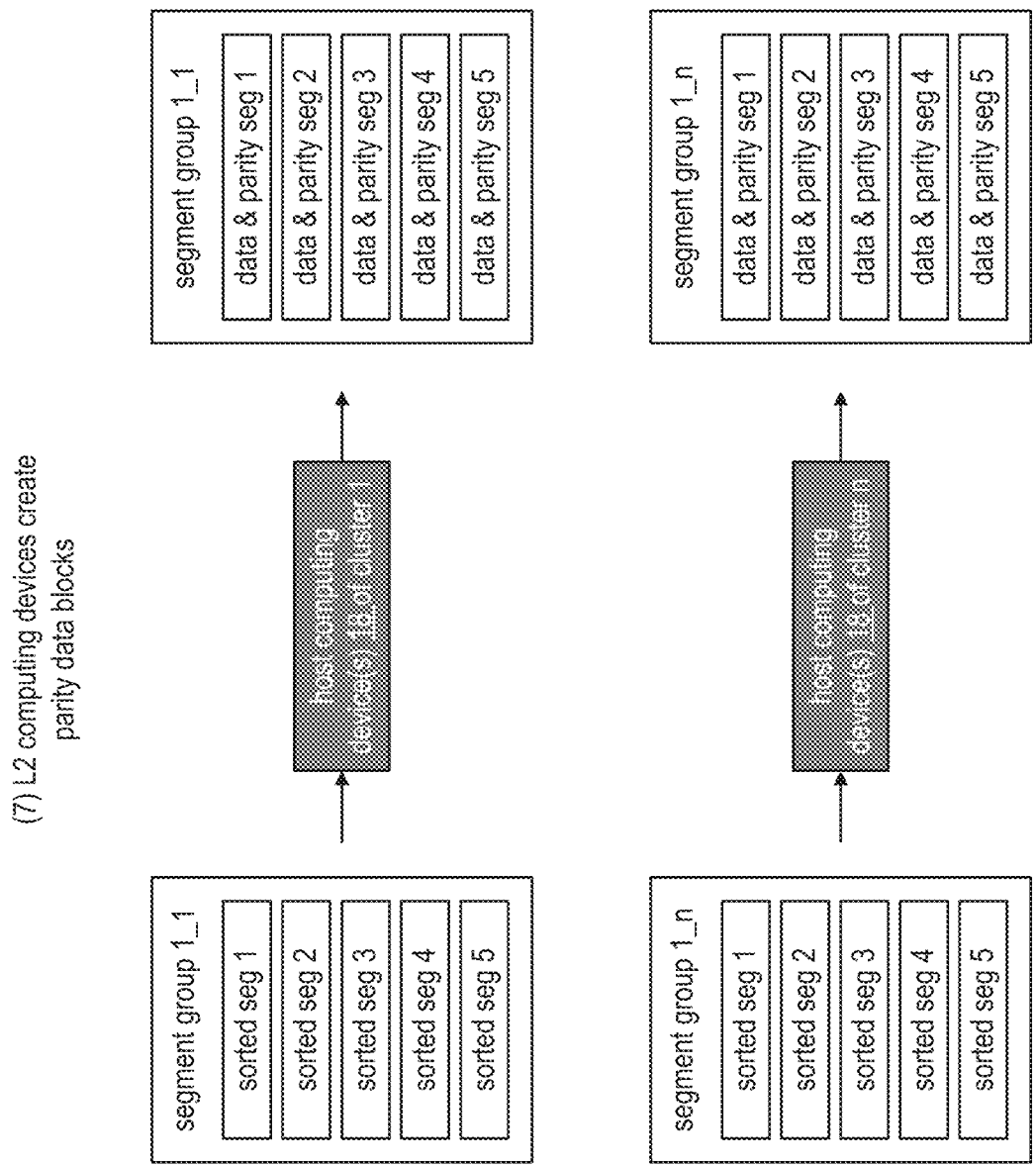
FIGS. 22A-22I are schematic block diagrams of an embodiment of creating data and parity segments from sorted segments in accordance with the present invention.
Figure 22B:
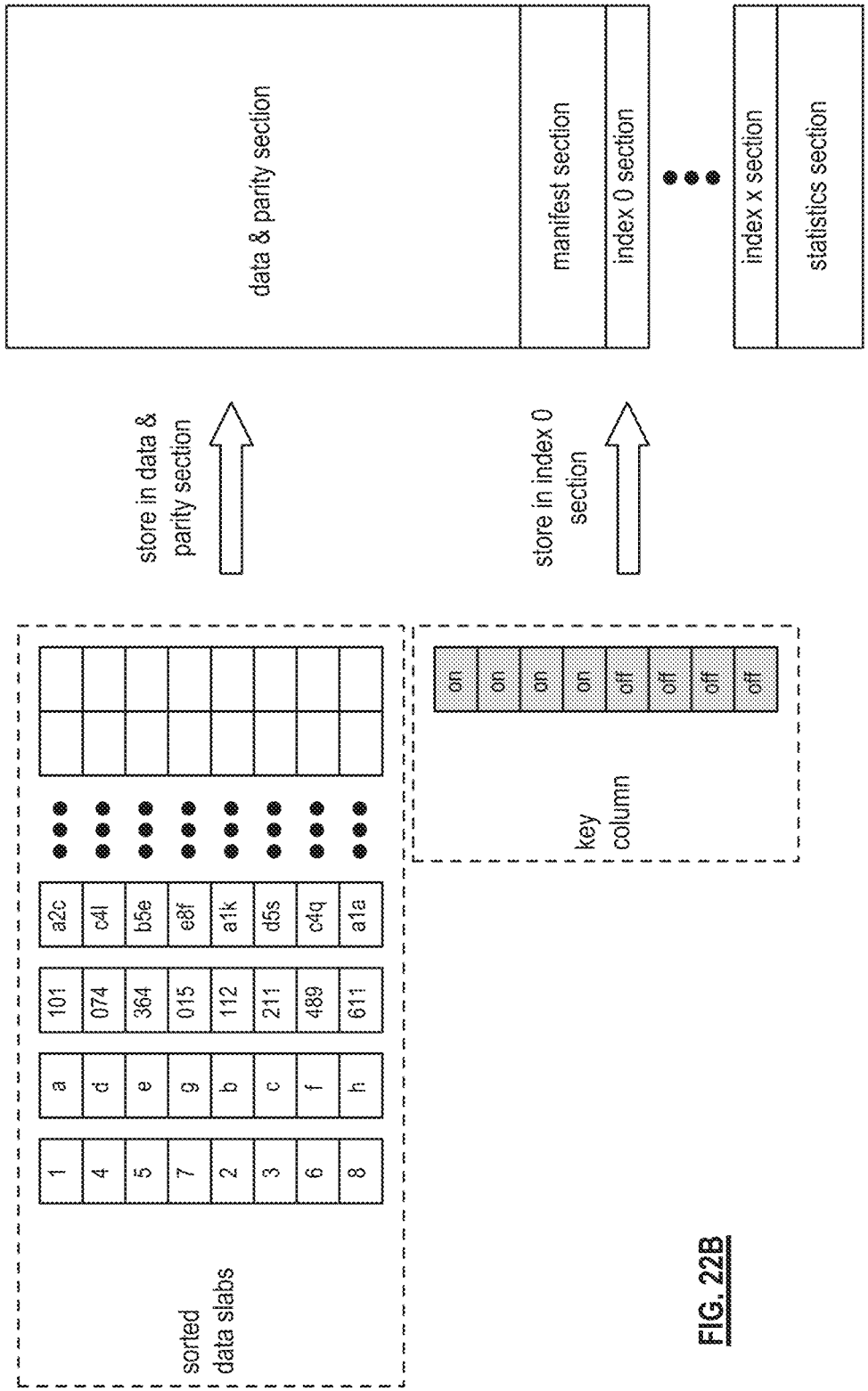

FIGS. 22A-22I are schematic block diagrams of an embodiment of creating data and parity segments from sorted segments. In FIG. 22A, the L2 computing devices 18 execute a redundancy function to produce parity data from the raw data of the sorted segments. The resulting sorted data and parity forms a resulting segment as shown in FIG. 22B.

FIG. 22B illustrates an example of a segment structure for a segment of the segment group. The segment structure for a segment includes the data & parity section, a manifest section, one or more index sections, and a statistics section. The segment structure represents a storage mapping of the data (e.g., data slabs and parity data) of a segment and associated data (e.g., metadata, statistics, key column(s), etc.) regarding the data of the segment. The sorted data slabs of FIG. 21D of the segment are stored in the data & parity section of the segment structure. The sorted data slabs are stored in the data & parity section in a compressed format or as raw data (i.e., non-compressed format). Note that a segment structure has a particular data size (e.g., 32 Giga-Bytes) and data is stored within coding block sizes (e.g., 4 Kilo-Bytes).

Before the sorted data slabs are stored in the data & parity section, or concurrently with storing in the data & parity section, the sorted data slabs of a segment are redundancy encoded. The redundancy encoding may be done in a variety of ways. For example, the redundancy encoding is in accordance with RAID 5, RAID 6, or RAID 10. As another example, the redundancy encoding is a form of forward error encoding (e.g., Reed Solomon, Trellis, etc.). An example of redundancy encoding is discussed in greater detail with reference to one or more of FIGS. 22C-22I, which is discussed below.

The manifest section stores metadata regarding the sorted data slabs. The metadata includes one or more of, but is not limited to, descriptive metadata, structural metadata, and/or administrative metadata. Descriptive metadata includes one or more of, but is not limited to, information regarding data such as name, an abstract, keywords, author, etc. Structural metadata includes one or more of, but is not limited to, structural features of the data such as page size, page ordering, formatting, compression information, redundancy encoding information, logical addressing information, physical addressing information, physical to logical addressing information, etc. Administrative metadata includes one or more of, but is not limited to, information that aids in managing data such as file type, access privileges, rights management, preservation of the data, etc.

The key column is stored in an index section. For example, a first key column is stored in index #0. If a second key column exists, it is stored in index #1. As such, for each key column, it is stored in its own index section. Alternatively, one or more key columns are stored in a single index section.

The statistics section stores statistical information regarding the segment and/or the segment group. The statistical information includes one or more of, but is not limited to, number of rows (e.g., data values) in one or more of the sorted data slabs, average length of one or more of the sorted data slabs, average row size (e.g., average size of a data value), etc. The statistical information includes information regarding raw data slabs, raw parity data, and/or compressed data slabs and parity data.

Figure 22C:
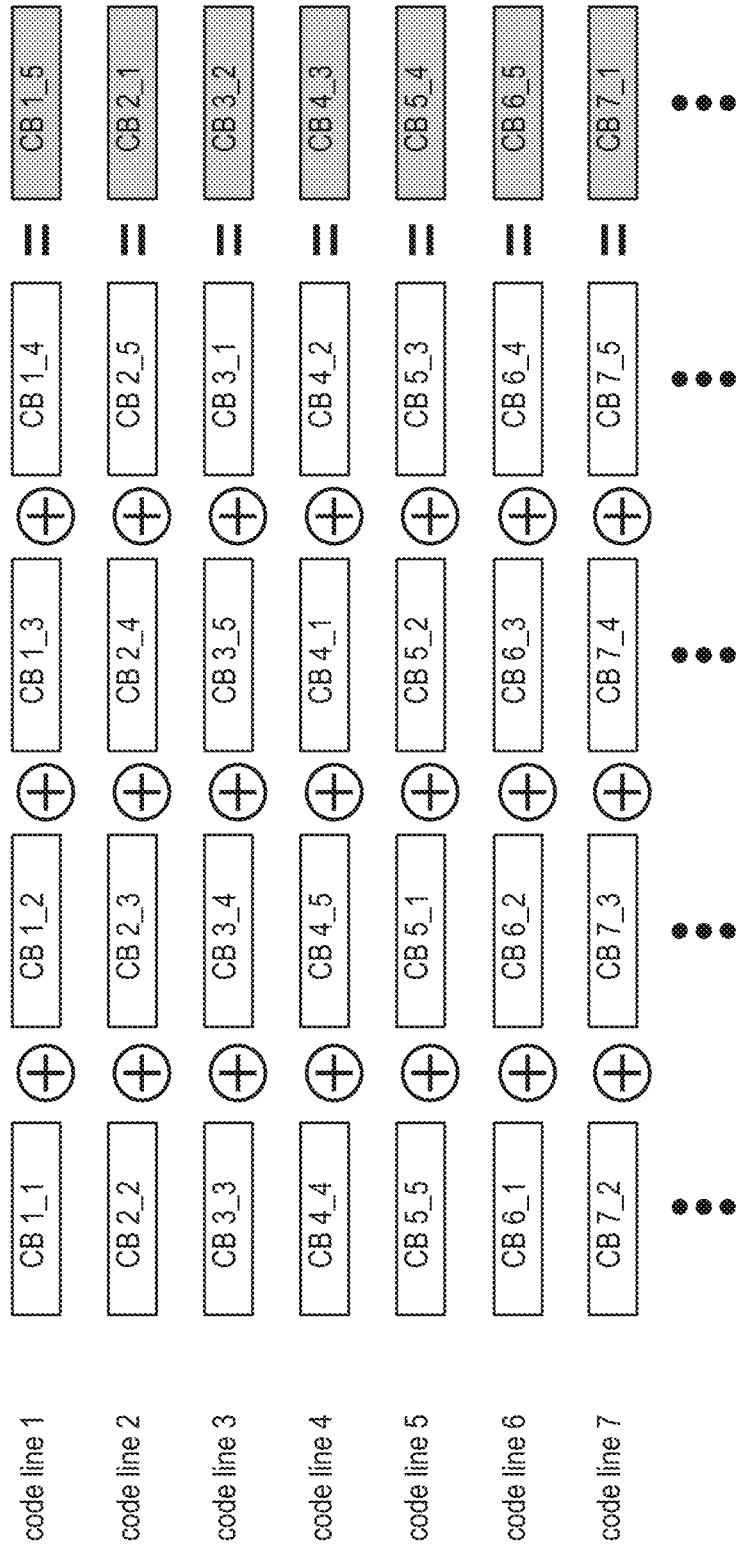

FIG. 22C is a schematic block diagram of an example of encoding a code line of data. Data is divided into groups of segments and segments are further divided into data blocks (e.g., coding blocks (CBs)). A parity calculation is done on the coding block level allowing for the smallest unit of data recovery (e.g., a coding block or data block, 4 Kbytes). In this example, data is divided into 5 segments where each segment is divided into a plurality of coding blocks. Four coding blocks from four of the data segments are arranged into a code line to calculate a fifth coding block (i.e., a parity coding block or parity block) based on a 4 of 5 coding scheme.

Because coding blocks of segments are stored in separate storage nodes, four coding blocks from different segments are used to create a parity coding block to be stored with coding blocks of the segment not used in the parity calculation. For example, in code line 1 a XOR operation is applied to CB 1_1 (coding block of code line 1 of segment 1), CB 1_2 (coding block of code line 1 of segment 2), CB 1_3, and CB 1_4 (coding block of code line 1 of segment 4) to create CB 1_5 (parity coding block of code line 1 of segment 5). As such, any combination of four code blocks out of five code blocks of a code line can be used to reconstruct a code block from that line.

Figure 22D:
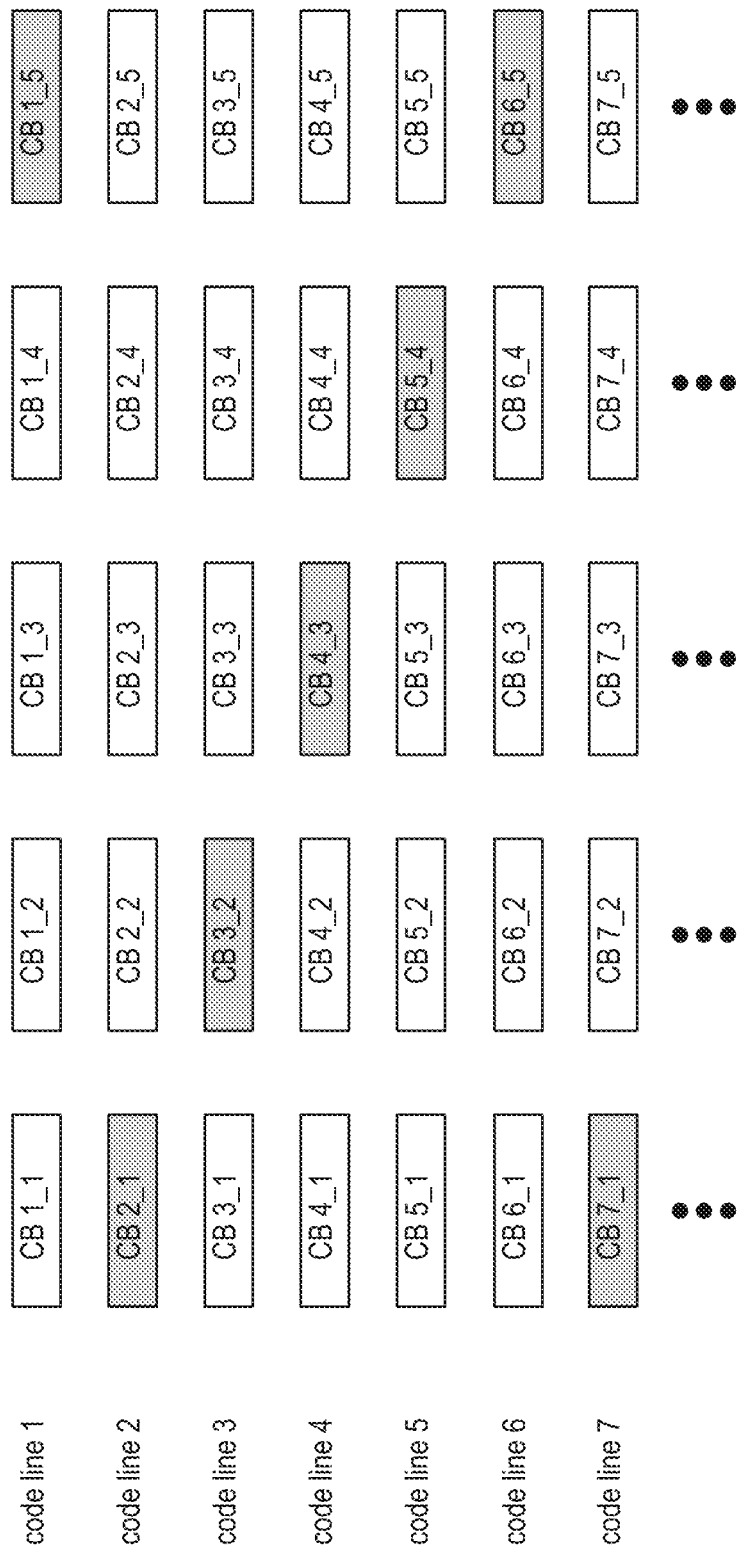

FIG. 22D is a schematic block diagram of an example of encoded code lines with distributed positioning of parity blocks. The parity blocks generated in the example of FIG. 22C (shown as shaded blocks) are distributed in accordance with a corresponding segment for storage. For example, parity blocks CB 2_1 and CB 7_1 are arranged with coding blocks of a first segment for storage in a first storage node, parity coding block CB 3_2 is arranged with coding blocks of a second segment for storage in a second storage node, parity coding block CB 4_3 is arranged with coding blocks of a third segment for storage in a third storage node, parity coding block 5_4 is arranged with coding blocks of a fourth segment for storage in a fourth storage node, and parity coding blocks CB 1_5 and CB 6_5 are arranged with coding blocks of a fifth segment for storage in a fifth storage node.

Using a dedicated parity storage node creates parity storage node bottlenecks for write operations. Therefore, distributing the parity coding blocks allows for more balanced data access and substantially fixes the write bottleneck issue.

Figure 22E:
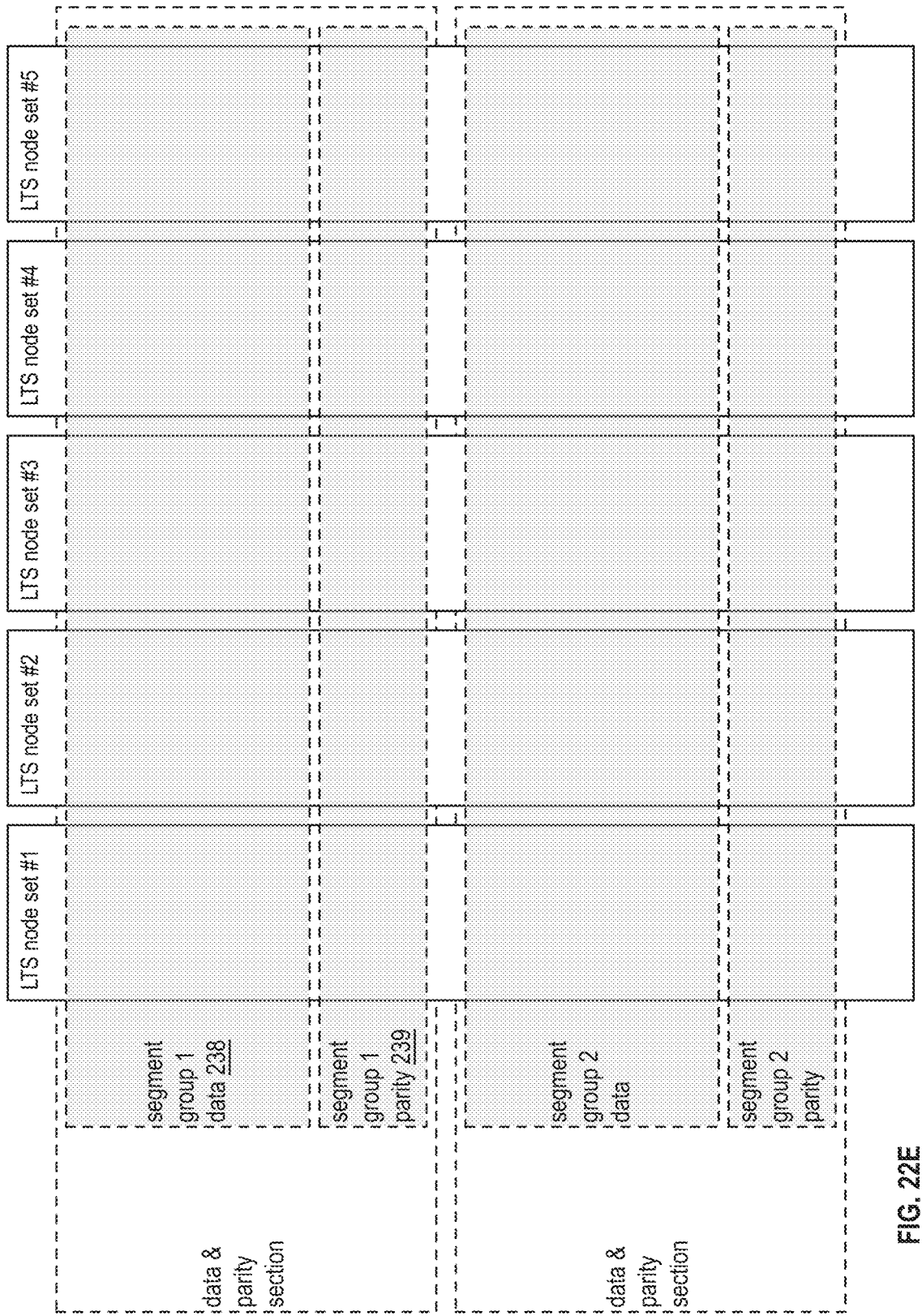

FIG. 22E is a schematic block diagram of an example of memory of a cluster of nodes 35 and/or of computing devices 18 having the data & parity section of the segment structures for segment groups divided into a data storage section 238 and a parity storage section 239. Here, five long term storage (LTS) node sets (LTS node sets #1-5) are shown storing data that has been divided into five segments per segment group (e.g., each segment is assigned its own storage node). Segment group 1 is stored in the data & parity section of their respective segment structures and segment group 2 is stored in the data & parity section of their respective segment structures.

As previously discussed, the segments are further divided into pluralities of coding blocks and parity coding blocks (e.g., data blocks and parity blocks). Each of the data & parity sections are divided into data section 238 and a parity section 239. The data blocks of the segments are stored in the data section 238 and the parity blocks are stored in the parity section 239 of each data & parity section of the segment structures.

Organizing the parity data in a separate storage section from the data within a storage node allows for greater data access efficiency. For example, parity data is only accessed when data requires reconstructing (e.g., data is lost, after a reboot, etc.). Other data access operations are achieved by accessing the data required from the data storage section.

Figure 22F:
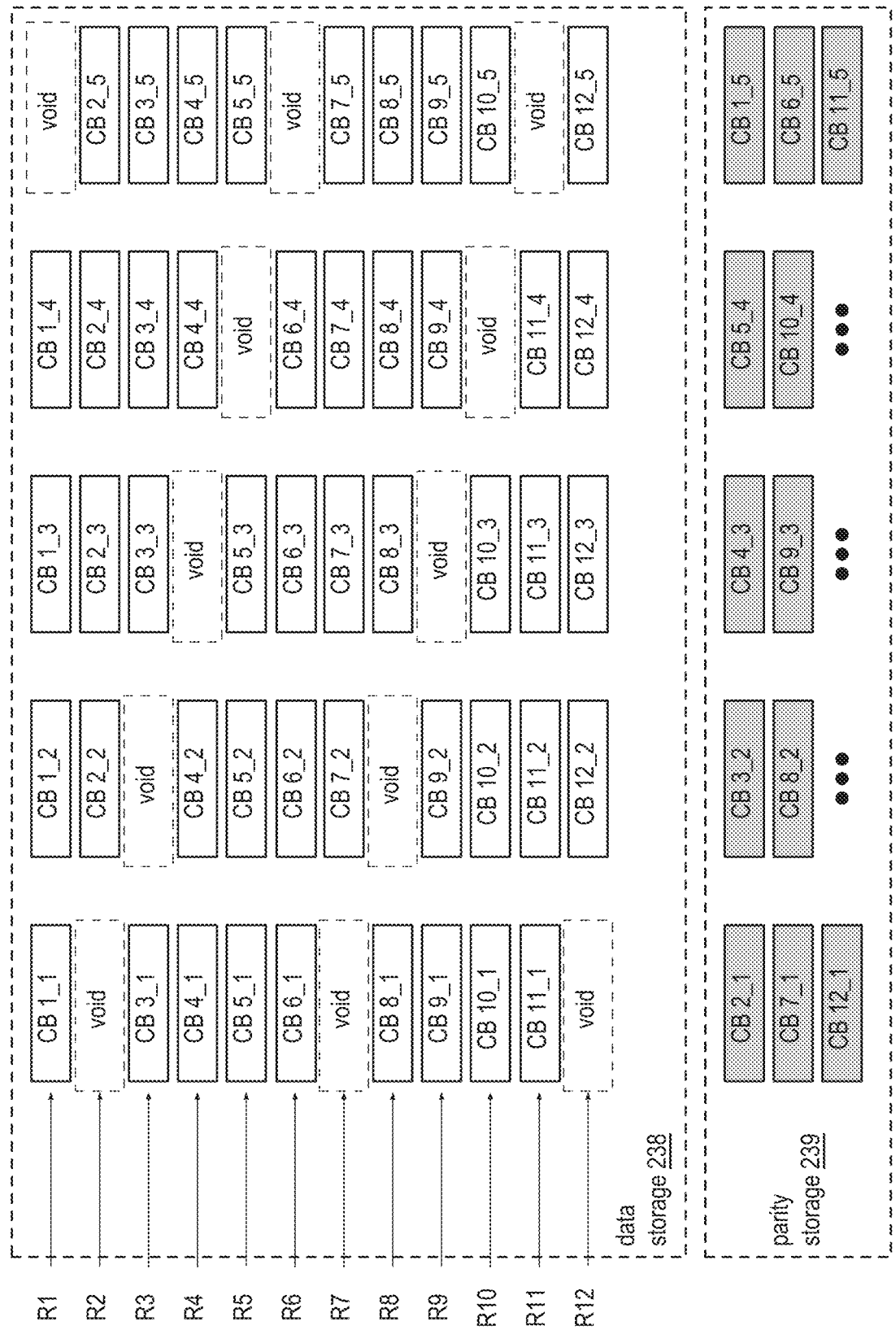

FIG. 22F is a schematic block diagram of an example of storing data blocks in a data storage section 238 and parity blocks in a parity storage section 239, with empty spaces (voids) in the data storage section 238. Five storage node sets (e.g., five computing devices) are shown storing data that has been divided into five segments (e.g., each segment requires its own storage node) and further divided into pluralities of data blocks (e.g., coding blocks (CBs)) and parity blocks. Distributing the parity blocks (as discussed in FIG. 22D) and writing parity blocks in a parity storage section 239 (as discussed in FIG. 22E) separate from the data storage sections 238 results in voids in the data storage section 238.

For example, parity blocks CB 2_1, CB 7_1, and CB 12_1 are stored in the parity storage section 239 of a first storage node resulting in three voids in the data storage section 238 of a first storage node as shown (e.g., in rows R2, R7, and R12). Various ways to fill voids in the data storage section 238 created from separating out the parity blocks are discussed in FIGS. 22G-22I.

Figure 22G:
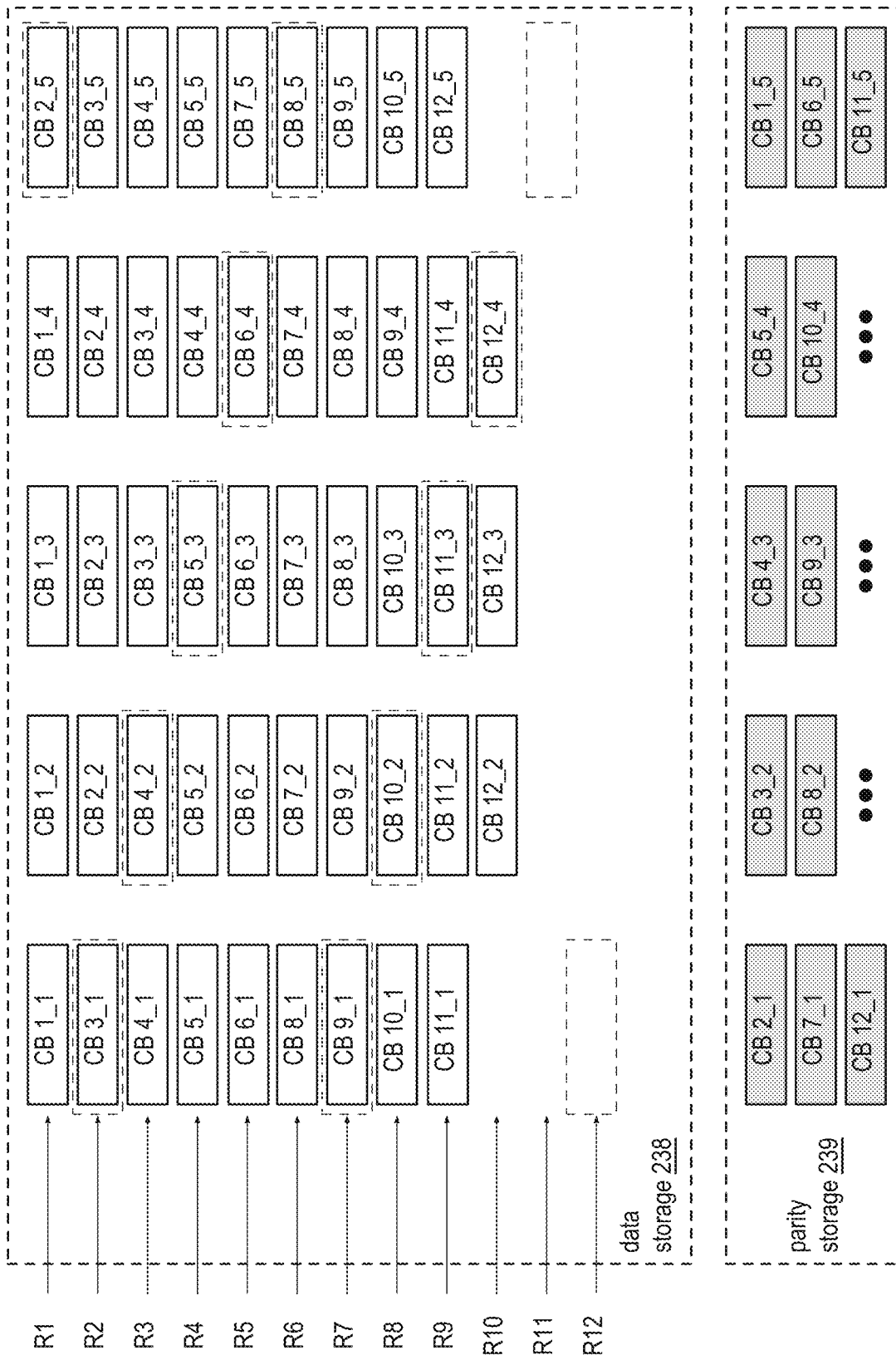

FIG. 22G is a schematic block diagram of an example of filling the empty spaces in the data storage section 238 of FIG. 22F. In this example, voids in the data storage section are filled by applying a mathematical function that includes a logical address adjustment that effectively pushes up data blocks (e.g., coding blocks (CBs)) in the data storage section 238 to fill the voids. For example, the mathematical function applied here effectively pushes up the data blocks in groups of four (e.g., the number of data blocks in a line of data blocks) to use a minimal amount of moves to fill voids. For example, parity blocks CB 2_1, CB 7_1, and CB 12_1 are written to the parity storage section 239 of a first storage node resulting in three voids in the data storage section 238 of the first storage node. CB 3_1-CB 6_1 are effectively pushed up to fill the void in R2 of the data storage section 238 of the first storage node thus forming a group of five coding blocks (CB 1_1, CB 3_1, CB 4_1, CB 5_1, and CB 6_1). CB 8_1-CB 11_1 are effectively pushed up to fill the void in R7 of the data storage section 238 of the first storage node, and so on.

In a specific example, the mathematical function is:

$$Ydata(doff, n, m, i) := \frac{doff * m - i}{n}$$

$$Yparity(poff, n, m, i) := \frac{(poff + 1) * m - i - 1}{m - n}$$

where y is the coding line, off is the block offset, n is the number of data blocks, m is the number of data and parity blocks, and i is the information dispersal algorithm (IDA) offset.

Figure 22H:
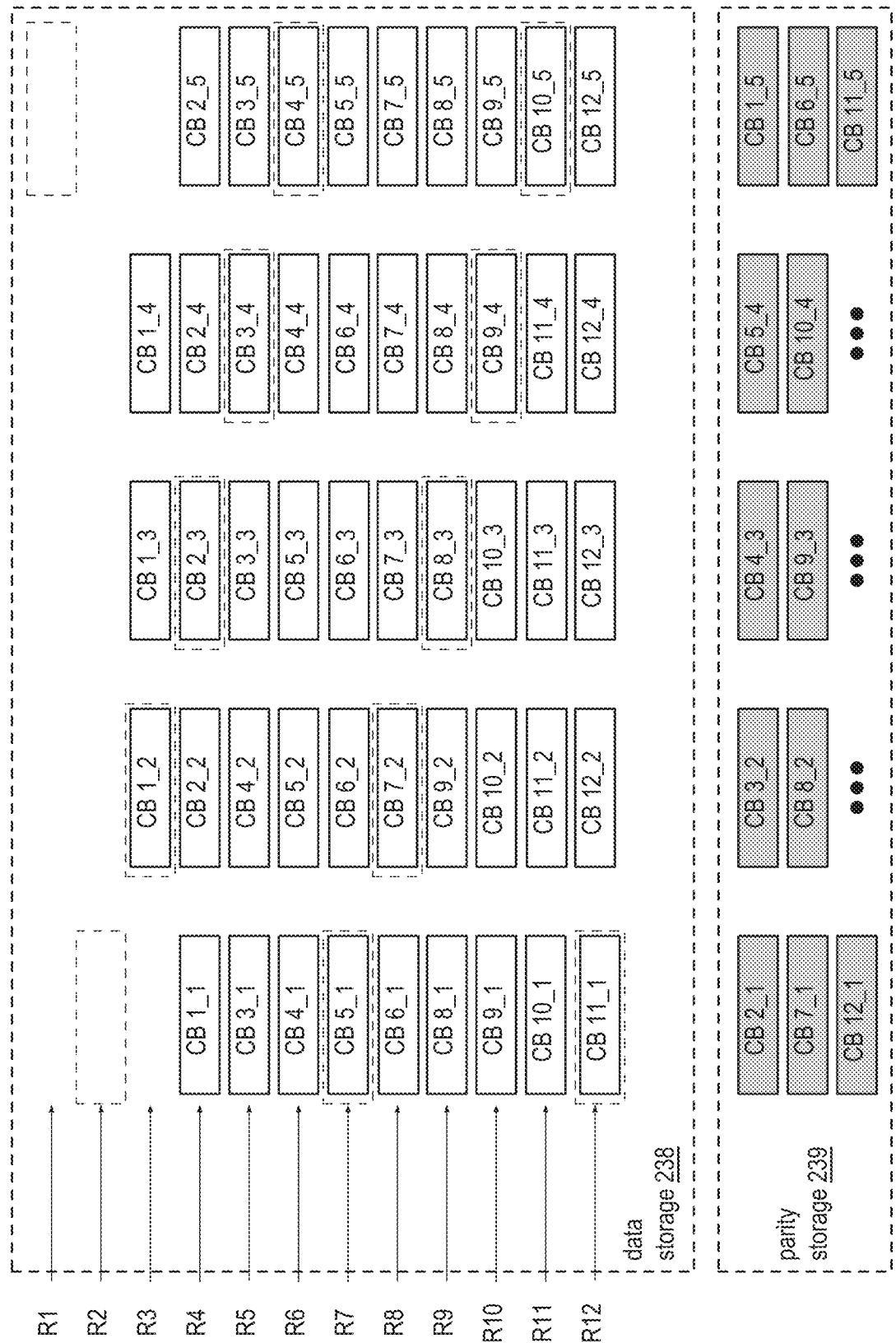

FIG. 22H is a schematic block diagram of another example of filling the empty spaces in the data storage section 238 of FIG. 22F. In this example, voids in the data storage section 238 are filled by applying a mathematical function that includes a logical address adjustment that effectively pushes down data blocks (e.g., coding blocks (CBs)) in the data storage section 238 to fill the voids. For example, to fill the voids in the data storage section 238 of a first storage node, CB 8_1 through CB 11_1 are effectively moved down to fill the void in R12 and CB 1_1, CB 3_1, CB 4_1, CB 5_1, and 6_1 are effectively moved down to fill the void in R7.

Figure 22I:
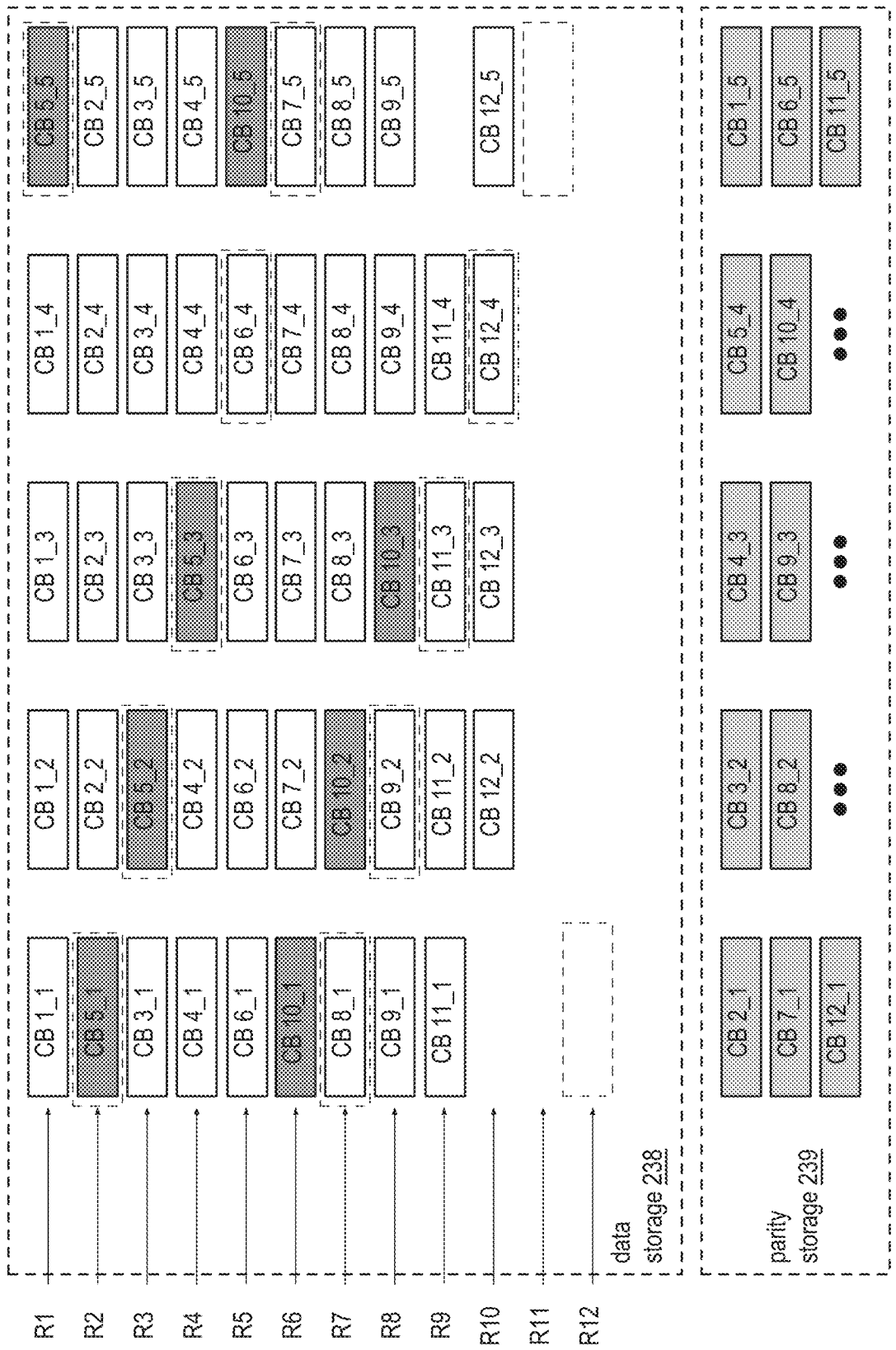

FIG. 22I is a schematic block diagram of another example of filling the empty spaces in the data storage section 238 of FIG. 22F. In this example, voids are filled by applying a mathematical function that includes using data blocks from every "n" lines of data blocks, and using data blocks of "n-d" lines of data blocks to fill voids in "n-k" lines of data blocks in the "n" lines of data blocks, where "n" equals the number of storage nodes (e.g., computing devices) in a cluster of storage nodes, "k" equals the number of parity blocks created per line of data blocks, and "d" equals the number of data blocks in the line of data blocks. For example, here "n" equals 5, "k" equals 1, and "d" equals 4. Therefore, blocks of "n-d" (5-4=1) line of every "n" (5) lines is used to fill "n-k" (5-1=4) lines. For example, the fifth line of coding blocks includes CB 5_1, CB 5_2, CB 5_3, and CB 5_5. CB 5_1 is used to fill the void between CB 1_1 and CB 3_1, CB 5_2 is used to fill the void between CB 2_2 and CB 4_2. CB 5_3 is used to fill the void above CB 2_5. A similar method occurs using data from the tenth line to fill voids between lines 6-9.

Figure 23:
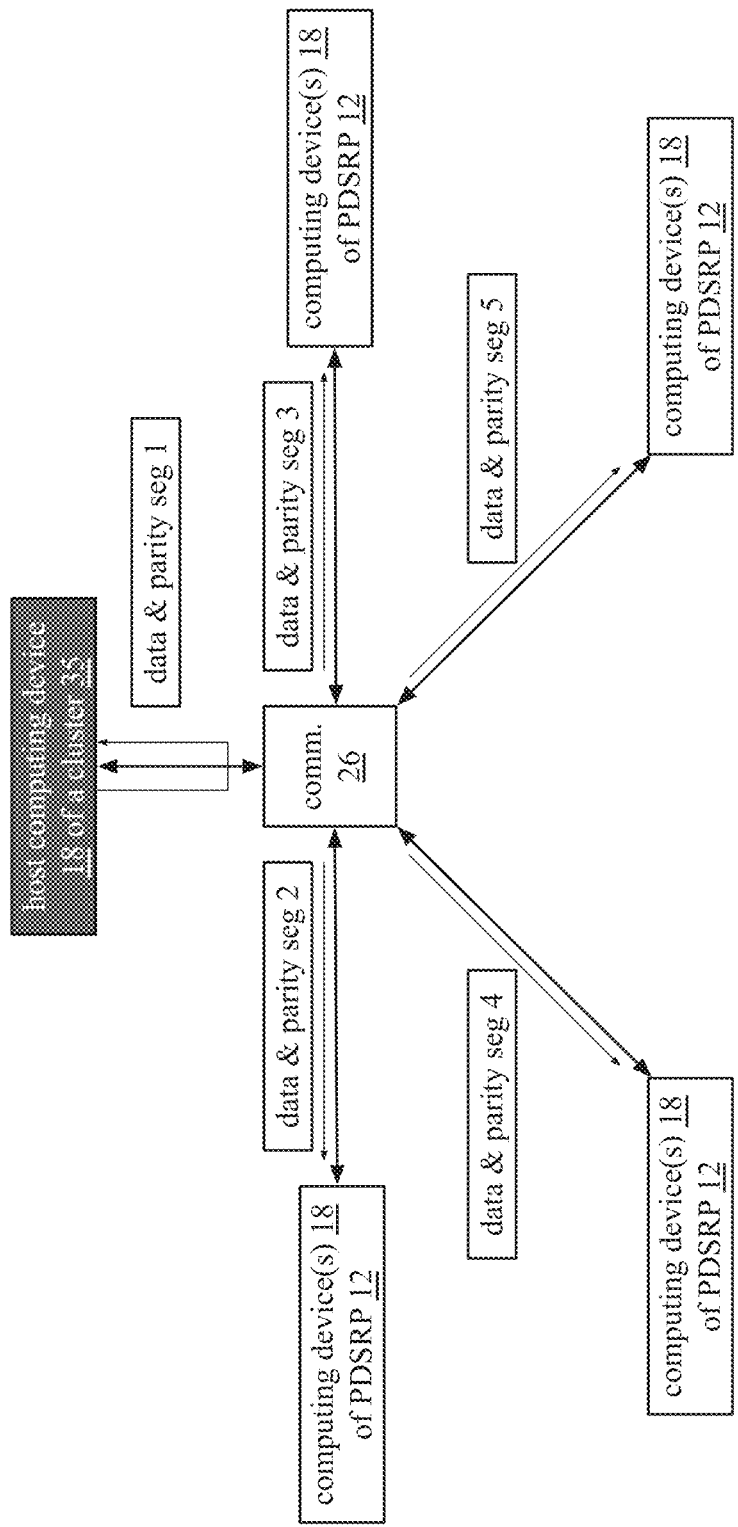
FIG. 23 is a schematic block diagram of an embodiment of sending processed data segments to computing devices within a storage cluster in accordance with the present invention.

FIG. 23 is a schematic block diagram of an embodiment of sending processed data segments to computing devices within a storage cluster. For example, level 2 (L2) computing device 18 within a storage cluster 35 distributes, via local communication resources 26, the data & parity segments to the other computing devices 18 within the storage cluster 35, including itself. Note that the data & parity segments (e.g., processed data segments) also include a manifest section for metadata, one or more index sections for the key column(s), and may further include a statistics section as discussed in FIG. 22B. As shown, each computing device receives a processed data segment (e.g., data & parity segment).

Figure 23A:
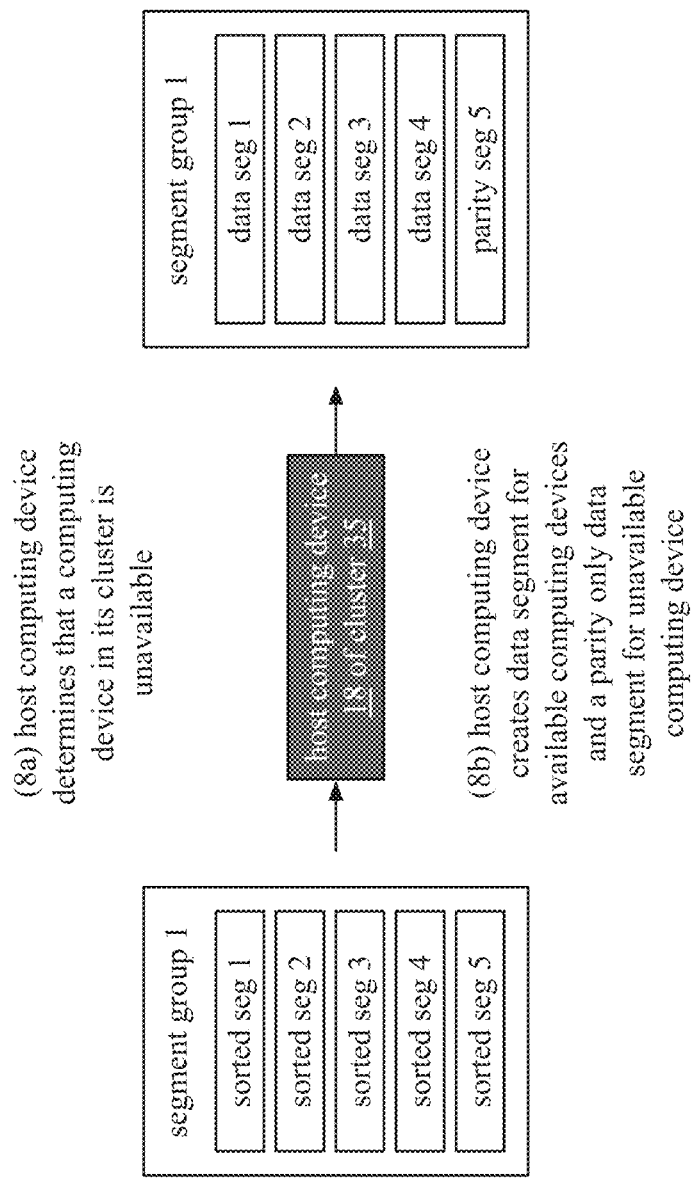
FIG. 23A is a schematic block diagram of another embodiment of sending processed data segments to computing devices within a storage cluster when a computing device is unavailable in accordance with the present invention.

FIG. 23A is a schematic block diagram of another embodiment of sending processed data segments to computing devices within a storage cluster when a computing device is unavailable. For example, when the host computing device 18 of cluster 35 receives segment group of data, which includes a plurality of sorted segments, it determines the availability status of the other computing devices in the cluster 35. When a computing device of the cluster is unavailable (e.g., off line, communication failure, hardware failure, software failure, etc.), the host computing device reorganizes the segment group or creates a different type of a segment group.

In either case, the resulting segment group (assuming 5 segments in the group) has four segments that include data and a fifth segment that only includes parity data for a forward error correction scheme of XOR. Each of the resulting data segments 1-4 and the parity segment include a manifest section, one or more index sections, and/or one or more statistics sections as discussed herein.

FIG. 23B is a schematic block diagram of another embodiment of sending processed data segments to computing devices within a storage cluster when a computing device is unavailable. In this example, the host computing device 18 sends four data segments to the four active computing devices (including itself) in the cluster and holds in temporary or permanent storage the parity segment, which is targeted for the unavailable computing device. When the unavailable computing device becomes available, the host computing device sends it the parity segment. Note that host computing device may send the data segment and/or parity segment to itself or it may just store them without self-transmission.

Figure 23C:
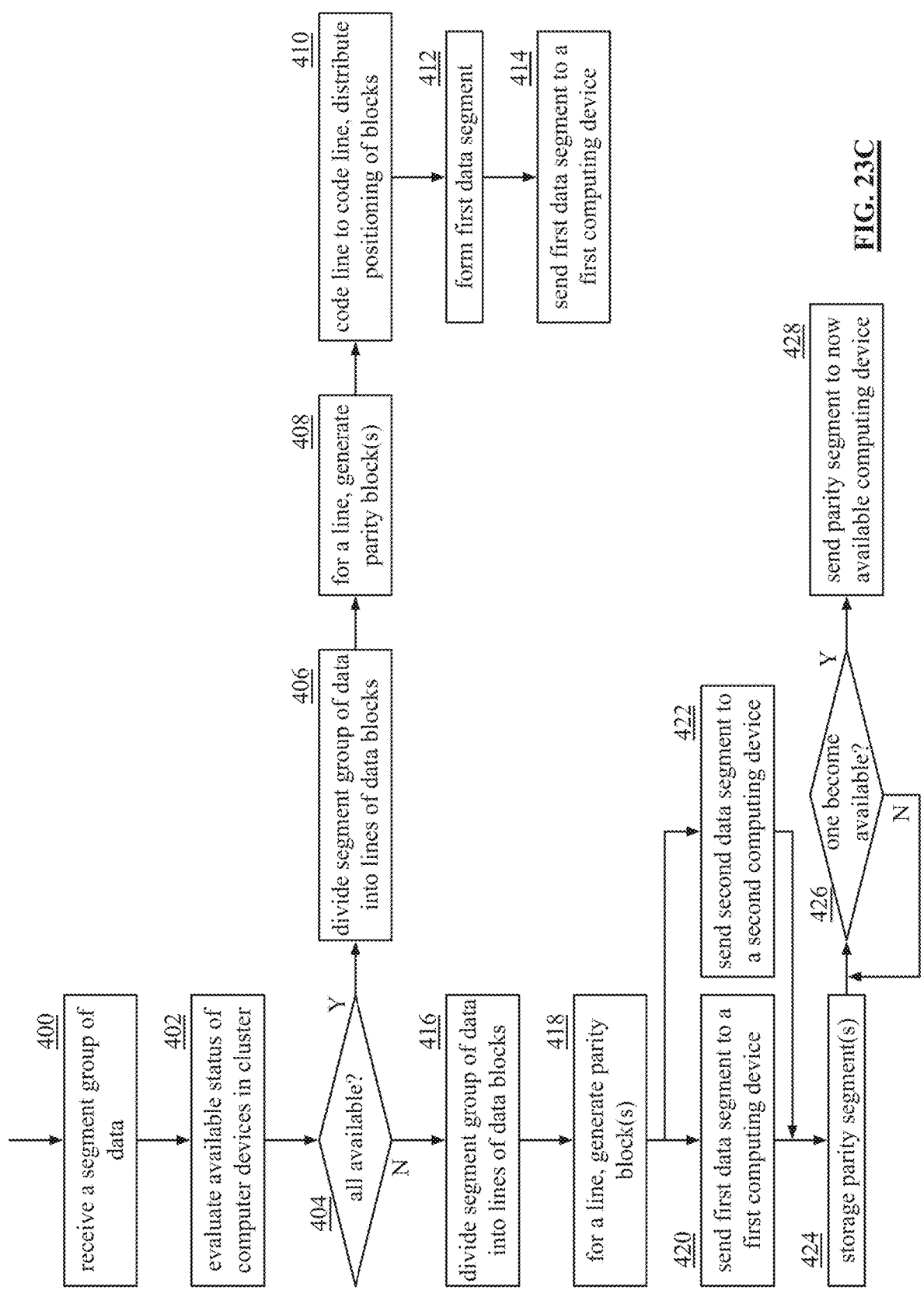
FIG. 23C is a logic diagram of an example of a method of sending processed data segments to computing devices within a storage cluster when a computing device is unavailable in accordance with the present invention.

FIG. 23C is a logic diagram of an example of a method of sending processed data segments to computing devices within a storage cluster when a computing device is unavailable. The method begins at step 400 where the host computing device of a storage cluster of computing device receives a segment group of data of a processed table for storage within the database system. The method continues at step 402 where the host computing device evaluates the availability status of other computing devices in the storage cluster. The available status indicates that a computing device is available for storing data or is unavailable for storing data. A computing device may be unavailable for storing data for a variety of reasons. For example, a computing device is unavailable when it is offline, when it has a hardware failure, when it has a software failure, when it has a communication failure, etc.

The method continues at step 404 where the host computing device determines whether all of the computing devices in the storage cluster are available. When all of the computing devices in the storage cluster are available, the method continues at step 406 where the host computing device divides the segment group of data into a plurality of lines of data blocks. For a line of data blocks of the code lines of data blocks, the method continues at step 408 where the host computing device generates at least one parity block in accordance with a redundancy encoded function as previously discussed. Note that the line of data blocks and the at least one parity block form a coding line. An example is discussed with reference to FIG. 23D.

From a coding line to another coding line, the method continues at step 410 where the host computing device distributes positioning of the parity block among the data blocks of a corresponding coding line. The method continues at step 412 where the host computing device forms a first data segment to include data blocks or parity blocks from a first position within distributed coding lines. The method continues at step 414 where the host computing device sends the first data segment to a first computing device of the storage cluster. The host computing device performs similarly for other data segments and other computing devices in the storage cluster. An example is discussed with reference to FIG. 23E.

When, at step 404, a computing device is not available, the method continues at step 416 where the host computing device divides the segment group of data into a plurality of lines of data blocks. The method continues at step 418 where the host computing device, for a line of data blocks, generates at least one parity block in accordance with a redundancy encoded function as previously discussed. Note that the line of data blocks and the at least one parity block form a coding line. An example is discussed with reference to FIG. 23D.

The method continues at step 420 where the host computing device sends a first data segment to a first available computing device of the storage cluster. The method also continues at step 422 where the host computing device sends a second data segment to a second available computing device of the storage cluster. The host computing device performs similar steps for other available computing devices in the storage cluster. In this example, the first data segment includes first positioned data blocks of the lines of data blocks and the second data segment includes second positioned data blocks of the lines of data blocks. An example is discussed with reference to FIG. 23F.

The method continues at step 424 where the host computing device stores the parity segment, or segments. In this example, a parity segment includes at least one parity block for each of the code lines of data blocks for which a parity block was created. As part of storing the parity segment, the host computing device may send the parity segment to itself.

The method continues at step 426 where the host computing device determines whether the unavailable computing device becomes available. When it does, the method continues to step 428 where the host computing device sends a parity segment of the one or more parity segments to the now available computing device. Note that when the host computing device determined that a computing device was unavailable, the host computing device targeted it to store parity segment if and when it became available.

Figure 23D:
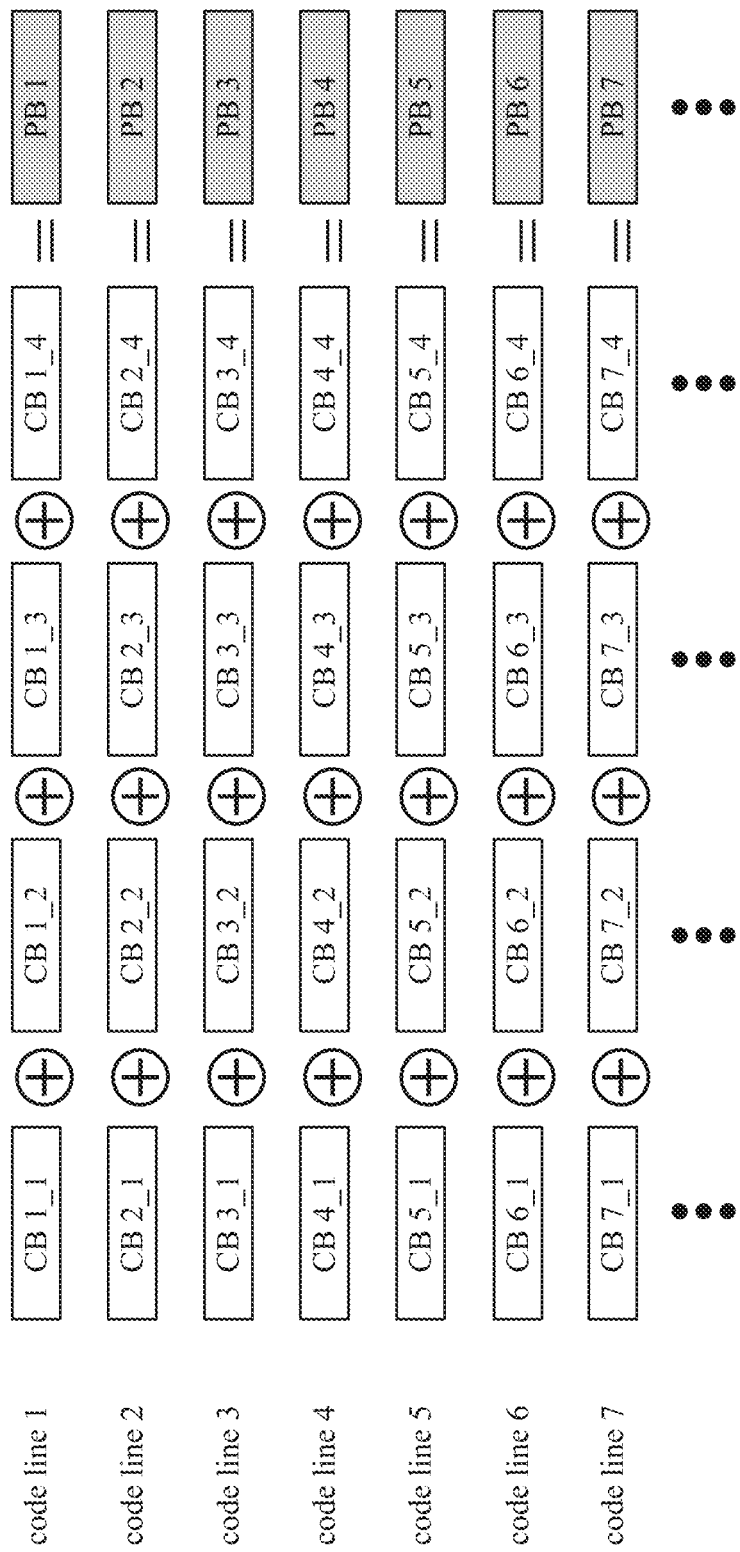
FIG. 23D is a schematic block diagram of an example of generating parity blocks from data blocks in accordance with the present invention.

FIG. 23D is a schematic block diagram of an example of generating parity blocks from data blocks. In this example, data is divided into groups of segments and segments are further divided into coding blocks (CBs). A parity calculation is done on the coding block level allowing for the smallest unit of data recovery (e.g., a coding block or data block, 4 Kbytes). In this example, data is divided into 5 segments where each segment is divided into a plurality of coding blocks. Four coding blocks from four of the data segments are arranged into a code line to calculate a fifth coding block (i.e., a parity coding block) based on a 4 of 5 coding scheme.

Because coding blocks of segments are stored in separate storage nodes, four coding blocks from different segments are used to create a parity coding block to be stored with coding blocks of the segment not used in the parity calculation. For example, in code line 1 a XOR operation is applied to CB 1_1 (coding block of code line 1 of segment 1), CB 1_2 (coding block of code line 1 of segment 2), CB 1_3, and CB 1_4 (coding block of code line 1 of segment 4) to create CB 1_5 (parity coding block of code line 1 of segment 5). As such, any combination of four code blocks out of five code blocks of a code line can be used to reconstruct a code block from that line.

Figure 23E:
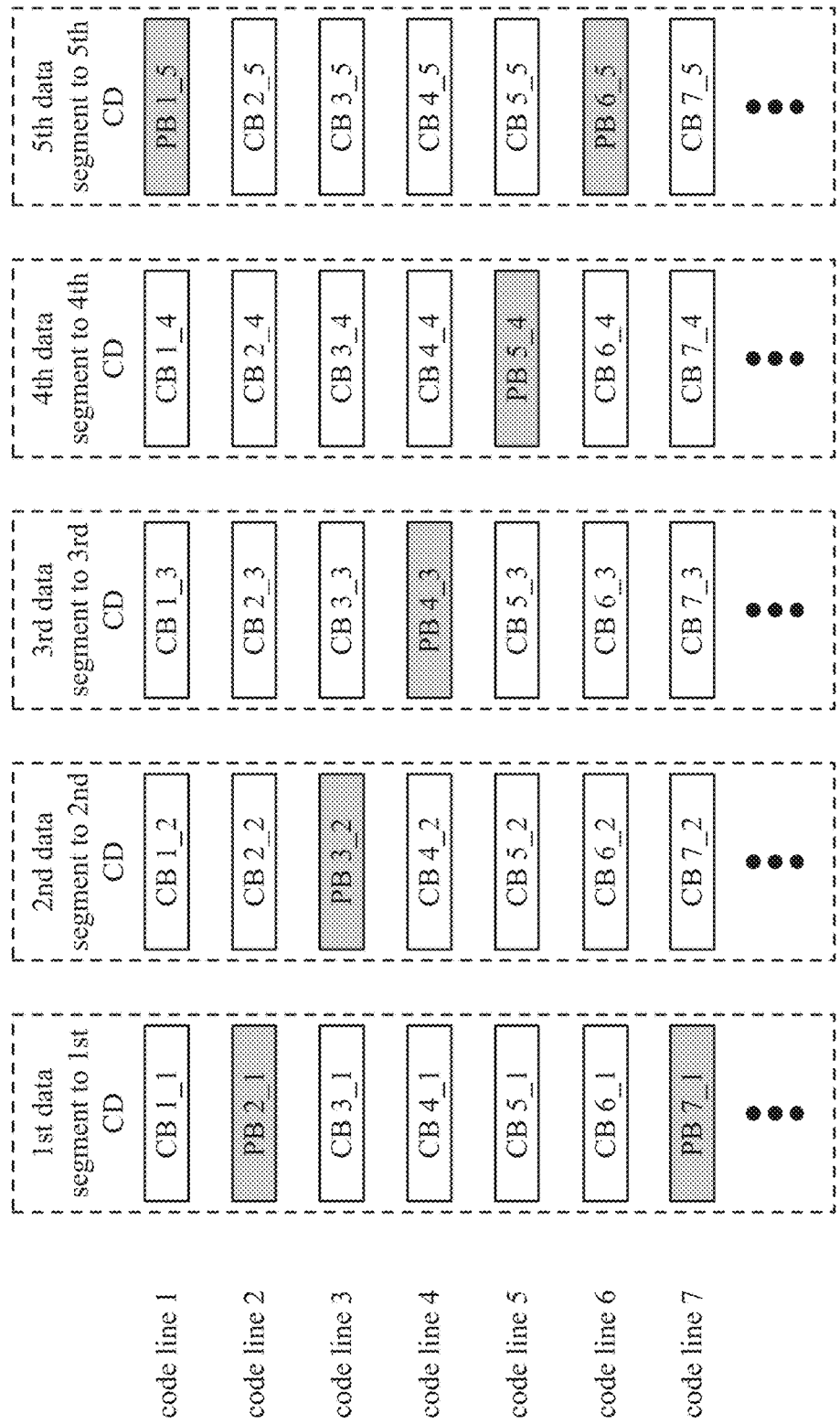
FIG. 23E is a schematic block diagram of an example of, when all computing devices in a cluster are available, generating data segments to include a pattern of parity blocks and data blocks in accordance with the present invention.

FIG. 23E is a schematic block diagram of an example of, when all computing devices in a cluster are available, generating data segments to include a pattern of parity blocks and data blocks. In this example, the position of data blocks and parity blocks are varied from code line to code line. For instance, the distribution of position from code line to code line is done in a round-robin manner, in a pseudo-random, and/or in a patterned manner.

As shown, the first data segment includes first positioned blocks (data and/or parity), the second data second data segment includes second positioned blocks, and so on. The first data segment is sent to the first computing device, the second data segment is sent to the second computing device, and so on.

Figure 23F:
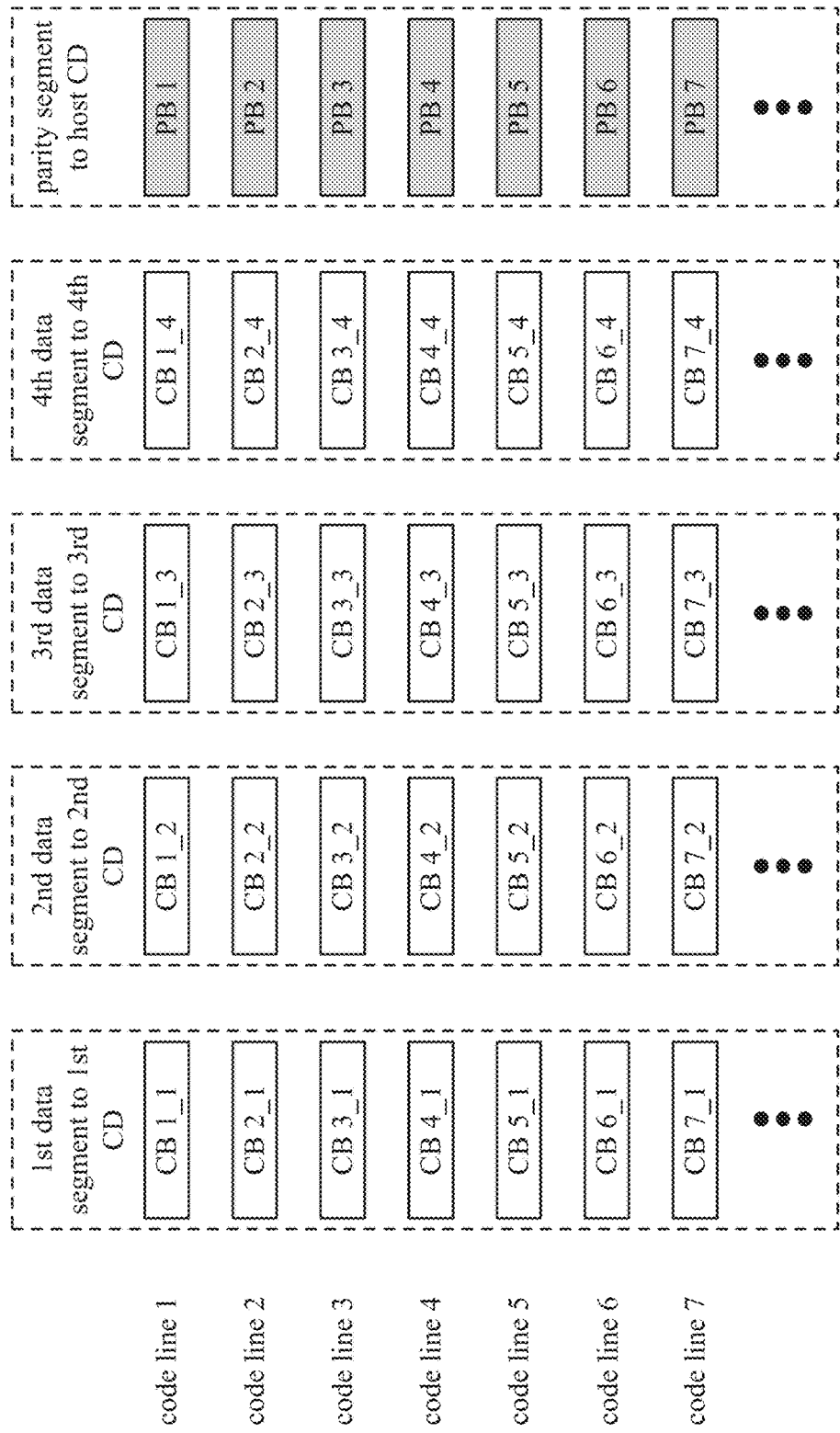
FIG. 23F is a schematic block diagram of an example of, when a computing device in a cluster is unavailable, generating data segments to include data blocks and one or more segments to be a parity segment in accordance with the present invention.

FIG. 23F is a schematic block diagram of an example of, when a computing device in a cluster is unavailable, generating data segments to include data blocks and one or more segments to be a parity segment. In this example, the first through fourth positions of a code line are for data blocks and the fifth position is for parity blocks. As such, the first computing device receives the first data segment, which only includes data blocks; the second computing devices receives the second data segment, which only includes data blocks; the third computing devices receives the third data segment, which only includes data blocks; and the fourth computing devices receives the fourth data segment, which only includes data blocks. The fifth data segment, which only includes parity blocks, is stored by the host computing device.

Figure 24:
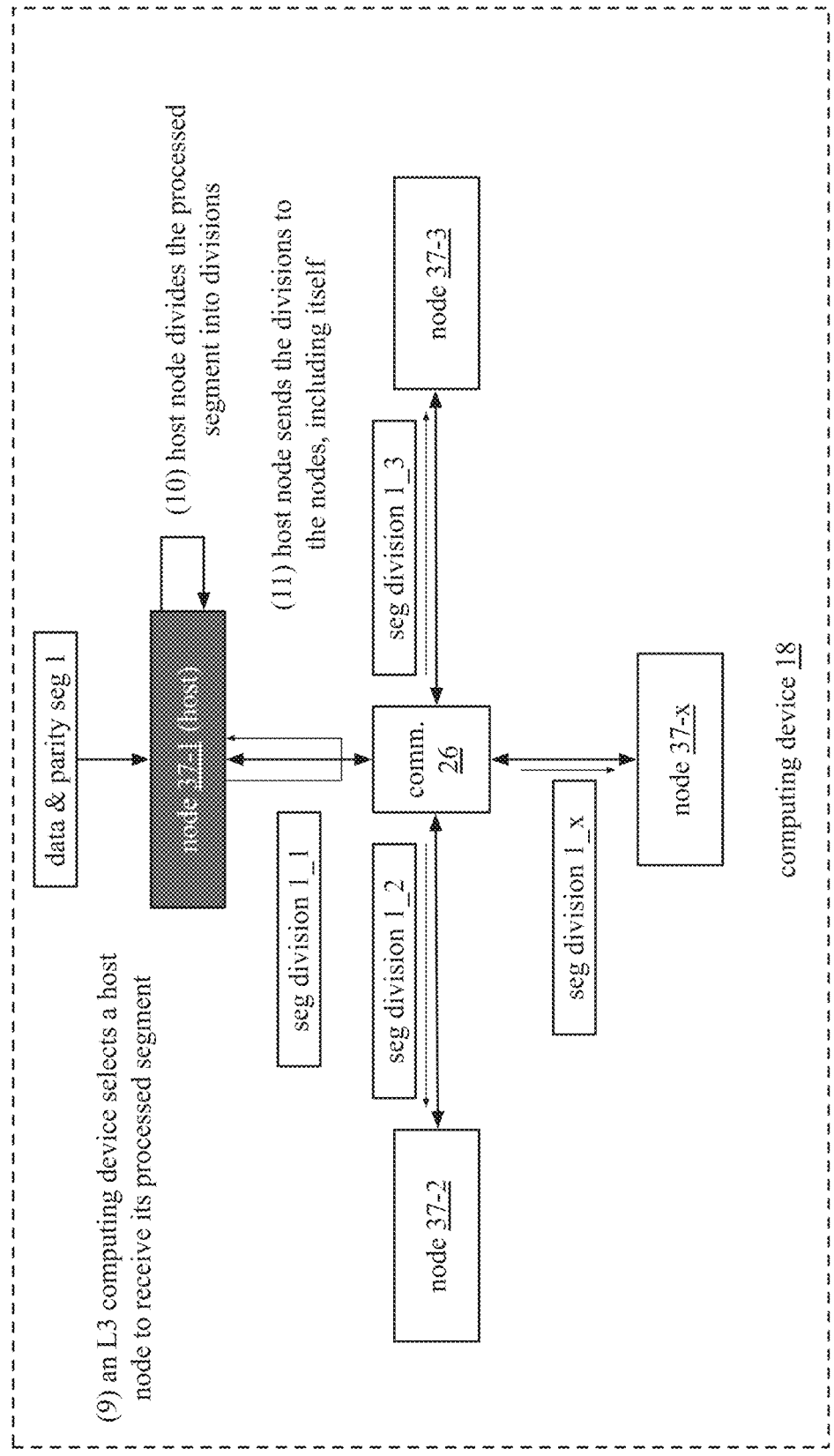
FIG. 24 is a schematic block diagram of an embodiment of receiving a data segment by a host node of a plurality of nodes of a computing device in accordance with the present invention.

FIG. 24 is a schematic block diagram of an embodiment of receiving a data segment by a host node of a plurality of nodes of a computing device. Computing device 18 within a cluster (at a third level L3) selects a host node 37-1 to initially process the received data & parity section (e.g., processed data segment). Selecting the host node from the plurality of nodes is based on one or more of: a predetermined selection process, a round-robin selection process, and a pseudo-random selection process.

In an example, the host node (gray shaded box) divides the received segment into a plurality of segment divisions; one segment division per node within the computing device. The host node sends, via local communication resources 26, the segment divisions to the respective nodes 37-2, 37-3, 37-x etc. of the L3 computing device 18.

In another example, the host node stores the received segment in the memory of the computing device upon receipt. Most, if not all of the nodes of the computing device have access to the memory and thus access to the received segment. The received segment is not further divided until a query request is received. When a query request involving the receive segment is received, the host node coordinates dividing the receive segment up as discussed in the previous paragraph.

Figure 25:
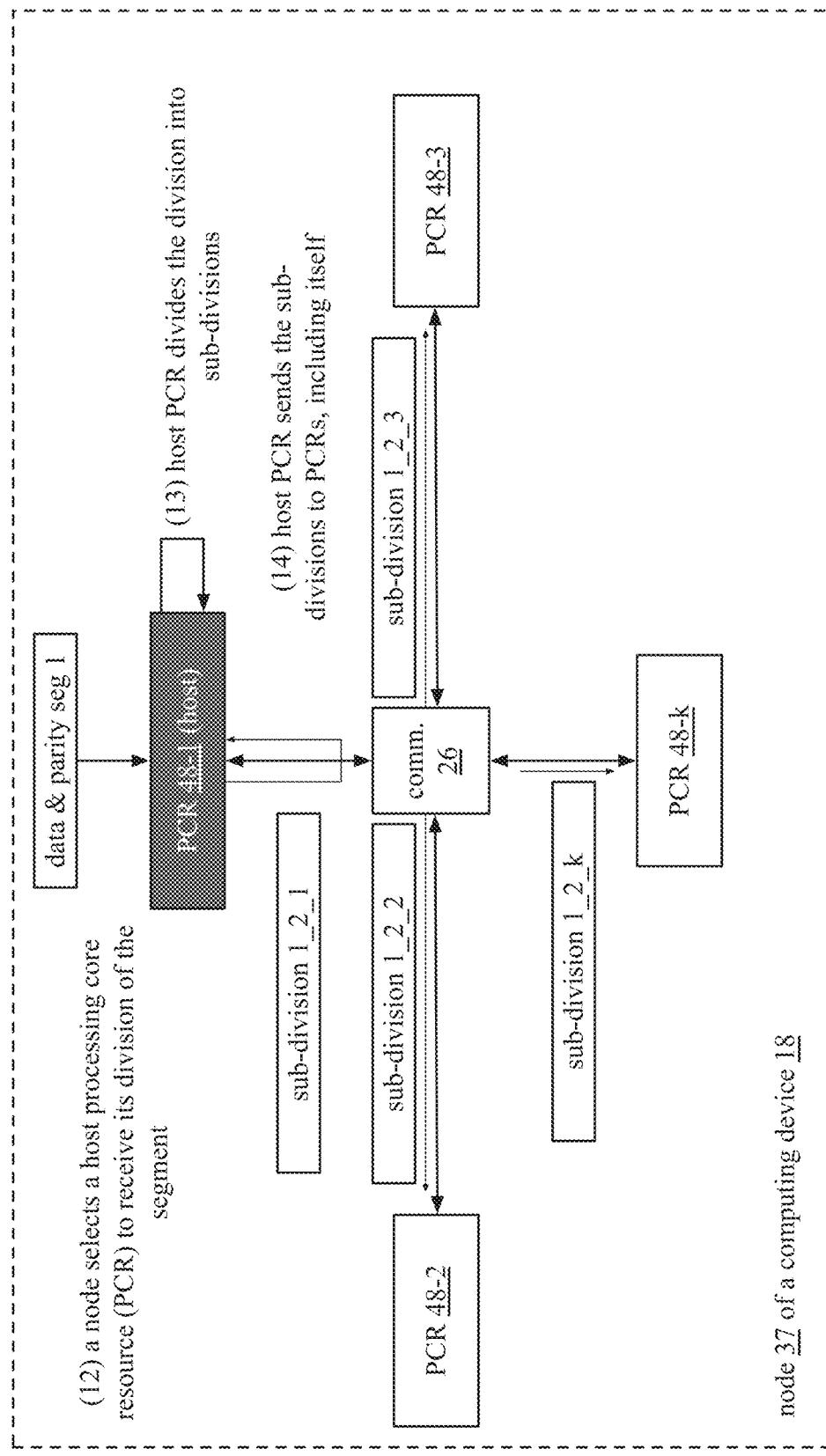
FIG. 25 is a schematic block diagram of an embodiment of receiving a data segment division by a host processing core resource (PCR) in accordance with the present invention.

FIG. 25 is a schematic block diagram of an embodiment of receiving a data segment division by a host processing core resource (PCR) of a node 37. The node 37 of an L3 computing device 18 selects a host processing core resource (PCR) 48-1 to process the received segment division. The host processing core resource is selected from a plurality of processing core resources based on one or more of: a predetermined selection process, a round-robin selection process, and a pseudo-random selection process.

The host PCR 48-1 further divides the segment division into a plurality of segment sub-divisions; one for each PCR of PCRs 48-2, 48-3, 48-k, etc. in the node 37. The host PCR 48-1 then sends, via local communication resources 26, the segment sub-divisions to the PCRs, including itself for storage therein. The further dividing of the segment division occurs when the node of the PCR receives its corresponding segment, which occurs at initial storage and/or at query response processing.

Figure 25A:
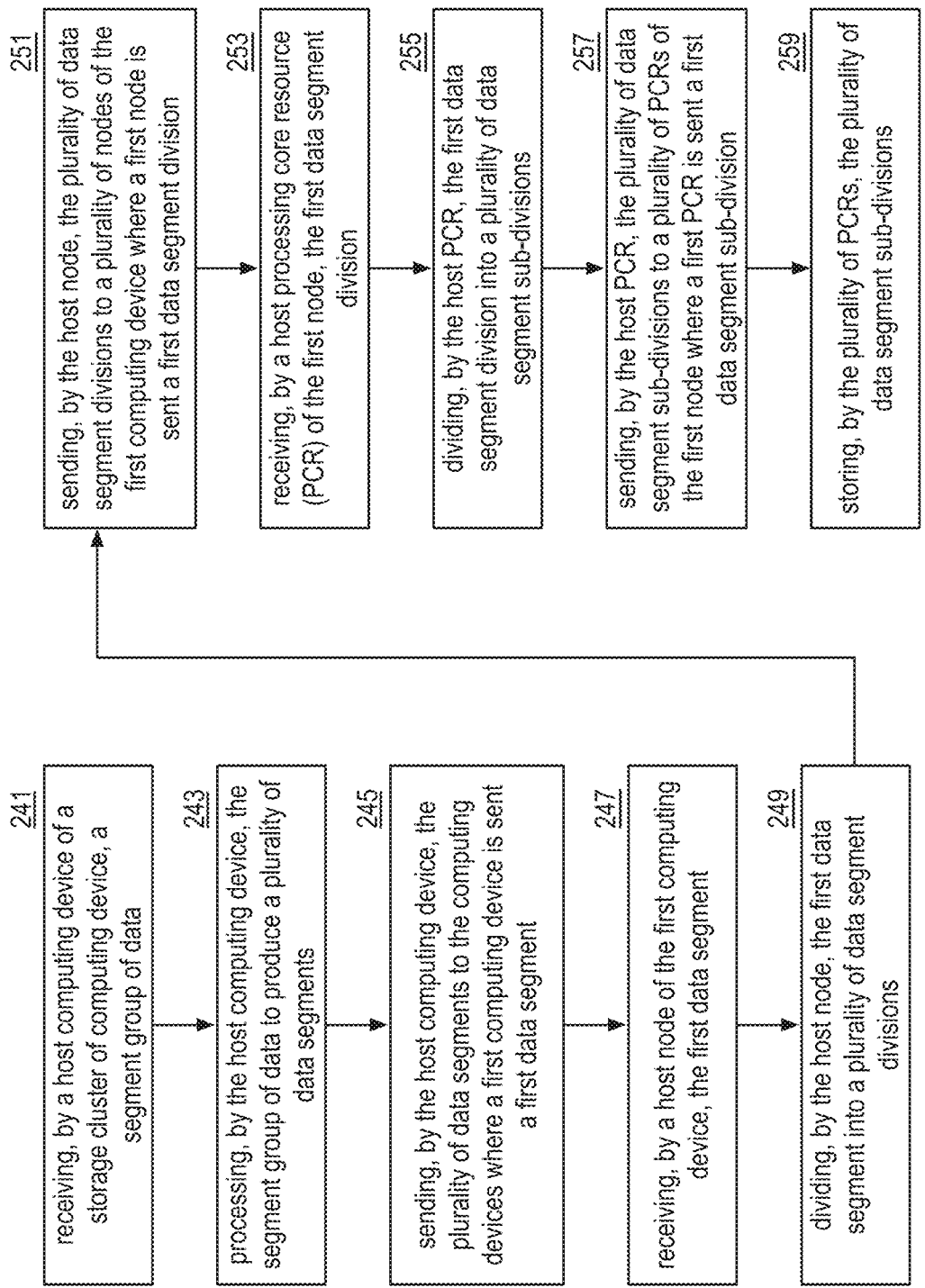
FIG. 25A is a logic diagram of an embodiment of a method for processing a received table and distributing the processed table for storage in the database system in accordance with the present invention.

FIG. 25A is a logic diagram of an embodiment of a method for processing a received table and distributing the processed table for storage in the database system. The method begins with step 241 where a host computing device of a storage cluster of computing devices receives a segment group of data. The segment group is one of at least one segment group of a data partition of plurality of data partitions of a table of data. The host computing device is selected from the computing devices of the storage cluster based on one or more of: a predetermined selection process, a round-robin selection process, and a pseudo-random selection process.

The method continues with step 243 where the host computing device processes the segment group of data to produce a plurality of data segments. For example, the processing of the segment group includes sorting data of a portion of the segment group of data based on a sorting criteria to produce a data segment of the plurality of segments. For example, columns of a data segment are separated into data slabs and each data slab is sorted based on a key column as discussed with reference to FIGS. 21B-21D.

As another example, the processing of the segment group includes error encoding data of a portion of the segment group of data in accordance with an error coding protocol to produce a data segment of the plurality of data segments. For example, data segments are divided into data blocks (e.g., coding blocks (CBs)) and a parity calculation is done on the coding block level. Parity data can then be organized in a separate storage section from the data to allow for greater data access efficiency as discussed with reference to FIGS. 22C-22I.

As another example, the processing of the segment group includes dividing data of the segment group of data in accordance with a data segmenting protocol to produce a data segment of the plurality of data segments. For example, the data segmenting protocol indicates that the number of segments in a segment group is equal to the number of computing devices in a storage cluster. Further, the host computing device may receive an instruction regarding processing of the segment group of data.

The method continues with step 245 where the host computing device sends the plurality of data segments to the computing devices of the storage cluster. A first computing device of the computing devices is sent a first data segment of the plurality of data segments. For example, the host computing device sends the first data segment to the host computing device as the first computing device.

The method continues with step 247 where a host node of the first computing device receives the first data segment. Selecting the host node from the plurality of nodes is based on one or more of: a predetermined selection process, a round-robin selection process, and a pseudo-random selection process.

The method continues with step 249 where the host node divides the first data segment into a plurality of data segment divisions. This step may occur as part of the initial storage of the segments or when a query request involving the segment is to be processed.

The method continues with step 251 where host node sends the plurality of data segment divisions to a plurality of nodes of the first computing device. A first node of the plurality of nodes is sent a first data segment division of the plurality of data segment divisions. For example, the host node sends the first data segment division to the host node as the first node.

The method continues with step 253 where a host processing core resource (PCR) of the first node receives the first data segment division. The host processing core resource is selected from the plurality of processing core resources based on one or more of: a predetermined selection process, a round-robin selection process, and a pseudo-random selection process. The method continues with step 255 where the host processing core resource divides the first data segment division into a plurality of data segment sub-divisions.

The method continues with step 257 where the host processing core resource sends the plurality of data segment sub-divisions to a plurality of processing core resources of the first node. A first processing core resource of the plurality of processing core resources is sent a first data segment sub-division of the plurality of data segment sub-divisions. For example, the host processing core resource sends the first data segment sub-division to the host processing core resource as the first processing core resource. The method continues with step 259 where the plurality of processing core resources store the plurality of data segment sub-divisions.

Figure 26:
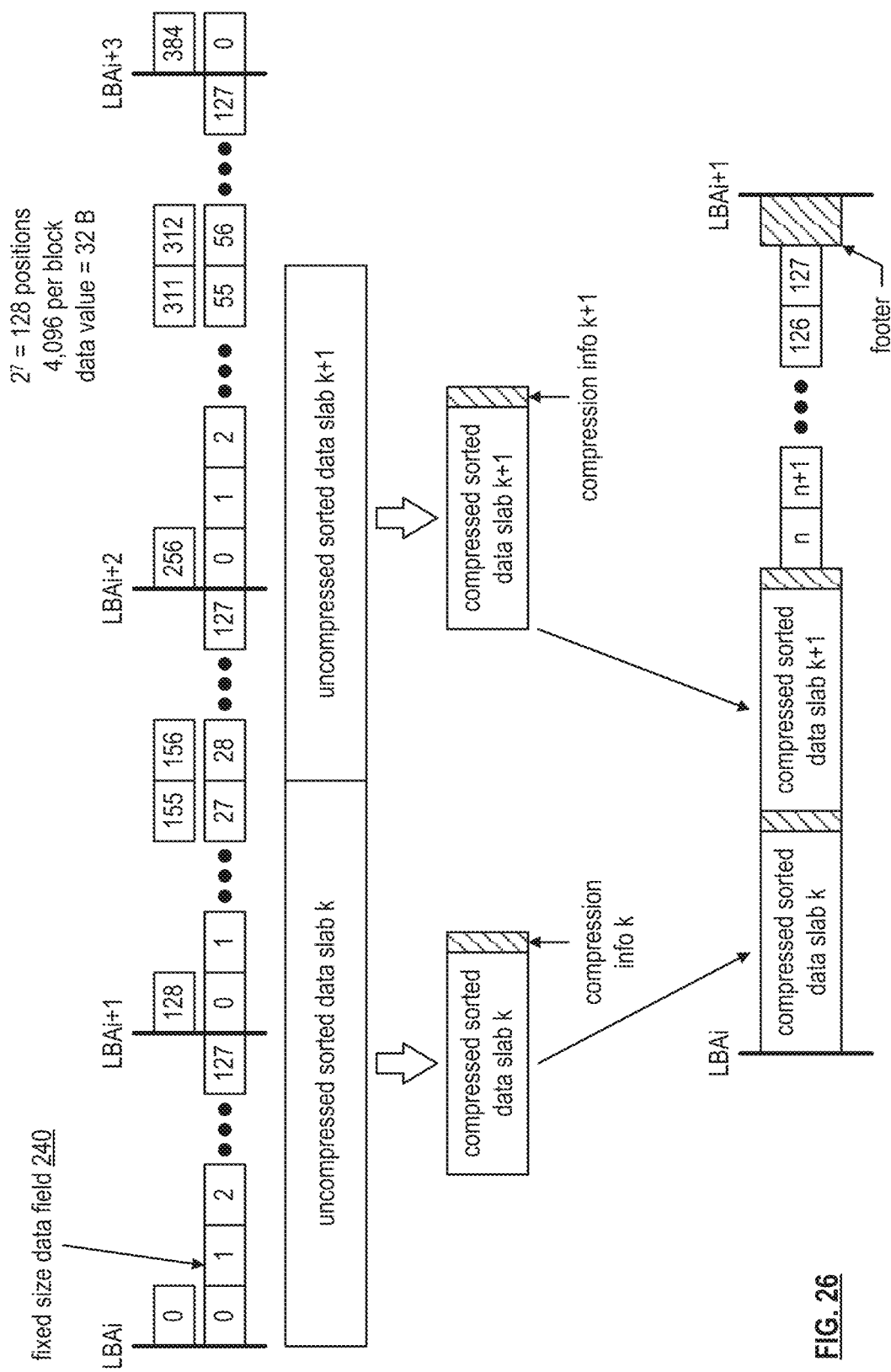
FIG. 26 is a schematic block diagram of an example of compressing data in accordance with the present invention.

FIG. 26 is a schematic block diagram of an example of compressing data. Conventional data compression can disturb the structure of raw data, which negatively affects database processing for the data by, for example eliminating the address for the data. FIG. 26 illustrates a form of compression to allow for more efficient processing in a massively parallel database system. Uncompressed data slab k (and data slab k+1) is a column of a table that has been sorted based on a key. In an example each data slab includes 156 32-byte data values, however data slabs can be of any reasonable size and include any reasonable number of data values. In an example, logical data block addresses (LBAs) are assigned. Each uncompressed sorted data slab could be each of a portion of a logical block address (LBA), aligned with a LBA, or in an example a given uncompressed sorted data slab could span a plurality of LBAs. In an example an uncompressed sorted data slab could span thousands of LBAs.

Each LBA includes a number of fixed size data fields 240 positioned within the LBA. In an example LBAi through LBA+x includes $2^7$ (128) positions and each block of data includes 4,096 positions. In practice, the number of positions, data value, and data fields can be any reasonable value. In the example of FIG. 26 uncompressed data slabs k and k+1 are compressed and compression information can be included at the front or rear of to create compressed sorted data slabs k and k+1 along with compressed sorted data slabs n and n+1 etc. to produce 128 positions of compressed data for LBAi. A footer at the end of LBAi can include at least one of a) raw uncompressed data; 2) null elimination and run length encoding (RLE) information; 3) RLE alone; 4) identity of data included within the block; 5) a count of compressed blocks stored in block; 6) the size of a compressed data slab; 7) size of compression information; and 8) a number of entries in compression information. The footer can be of varying size and can include information indicating why it is a footer. Additionally, the footer may consume one or more of the data value fields (e.g., field 127, 126, etc.) instead of being appended to the 128 position LBA.

Figure 27:
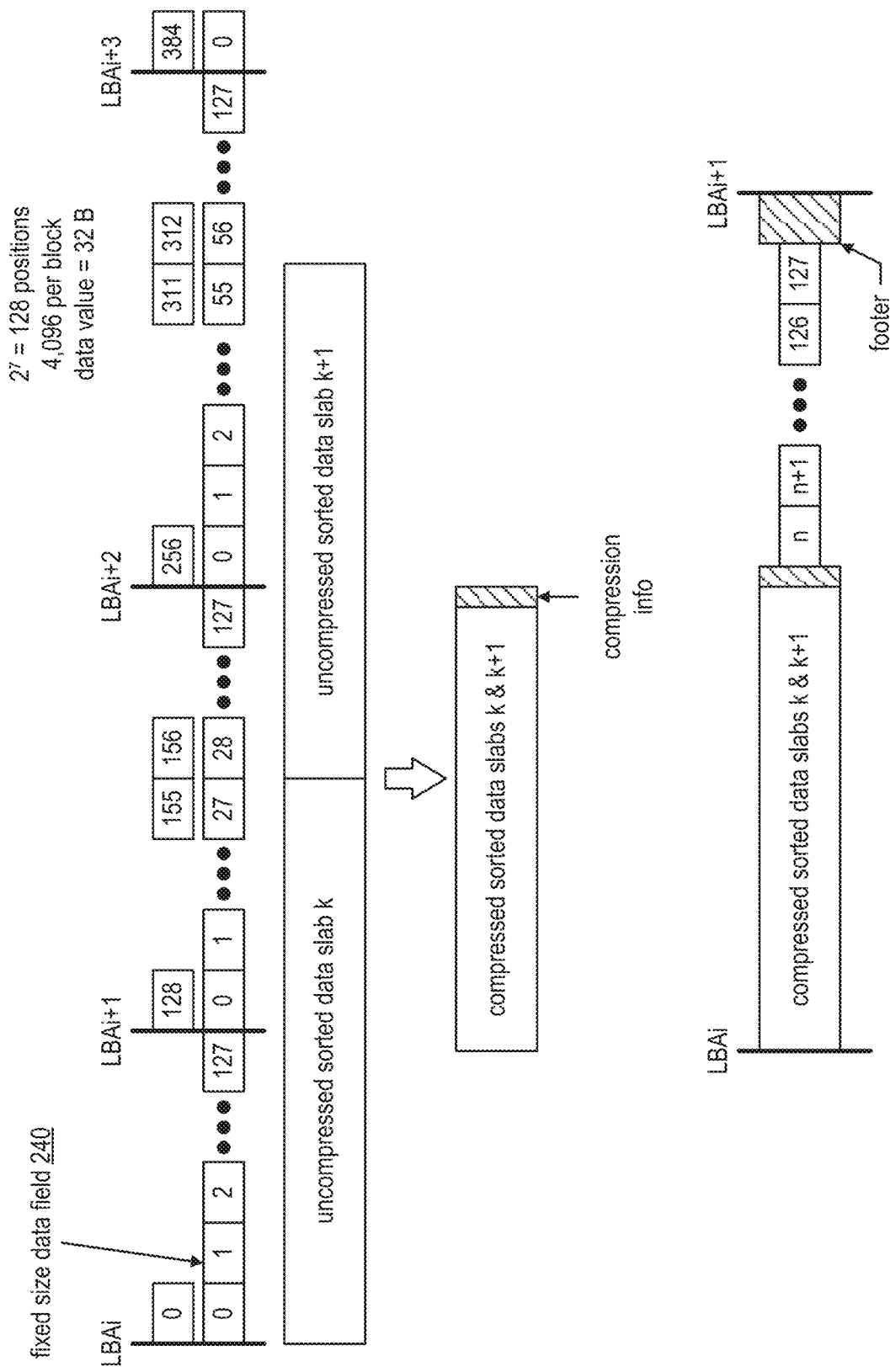
FIG. 27 is a schematic block diagram of an example of compressing data in accordance with the present invention.

FIG. 27 is a schematic block diagram of an example of compressing data where two (or more) uncompressed sorted data slabs are compressed into one compressed data "section". Each LBA includes a number of fixed size data fields 240 positioned within the LBA. In the example the compressed sorted data slabs k and k+1 occupy one data section with other compressed data in the remaining 128 positions of LBAi.

Figure 28:
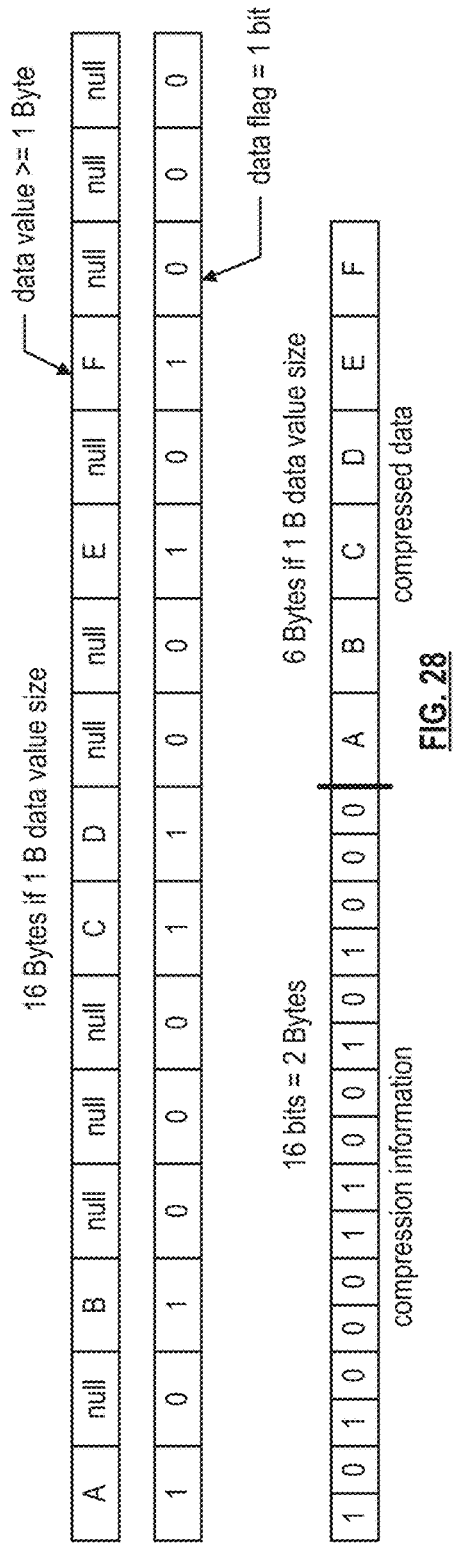
FIG. 28 is a schematic block diagram of an example of compressing data using null elimination in accordance with the present invention.

FIG. 28 is a schematic block diagram of an example of compressing data using null elimination. In the example a series of data values includes null values interspersed between not-null data values. In an example each data value is one (1) byte of a 16 byte section of data that includes data values A-F, along with 10 null values. In an example each not-null data value is assigned a data flag of "1" and each null value is assigned a "0" data flag. Compression information in this example is used to eliminate null values by including only not-null data values in the compressed data.

Figure 29:
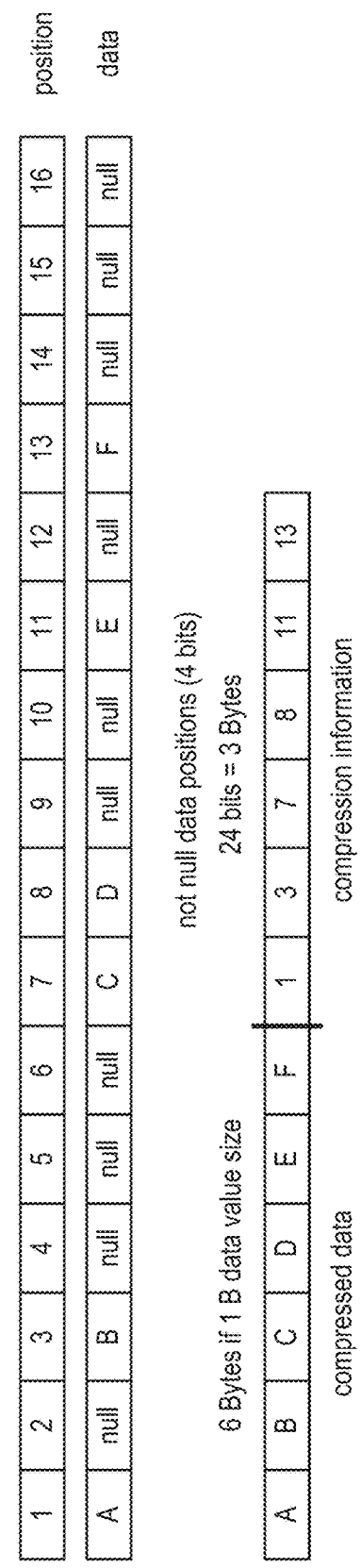
FIG. 29 is a schematic block diagram of another example of compressing data using null elimination in accordance with the present invention.

FIG. 29 is a schematic block diagram of another example of compressing data using null elimination. In an example data values in positions 1-16 are compressed to the data containing data values A-F, and the compression information is appended, where the compression indicates which positions of the 16-byte data sections include not-null data. Accordingly, decompression may be achieved by providing null values in each data value of the 16-byte data section with the indicated not-null data values in indicated positions (without including the "0" data flag of FIG. 99).

Figure 30:
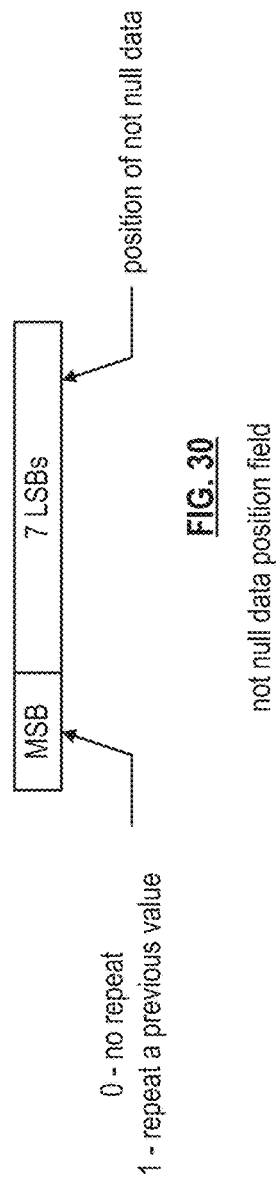
FIG. 30 is a schematic block diagram of an example of a compression information field for data compression using null elimination in accordance with the present invention.

FIG. 30 is a schematic block diagram of an example of a compression information field for data compression using null elimination that includes a not-null position field of 8 bits. In an example a bit (in this case the most significant bit [MSB]) indicates whether a data value is to be repeated or not repeated, and the 7 least significant bits (LSBs) are used to indicate the position of the data containing not-null data values. The not-null position field can be more or less than 8 bits in practice.

Figure 31:
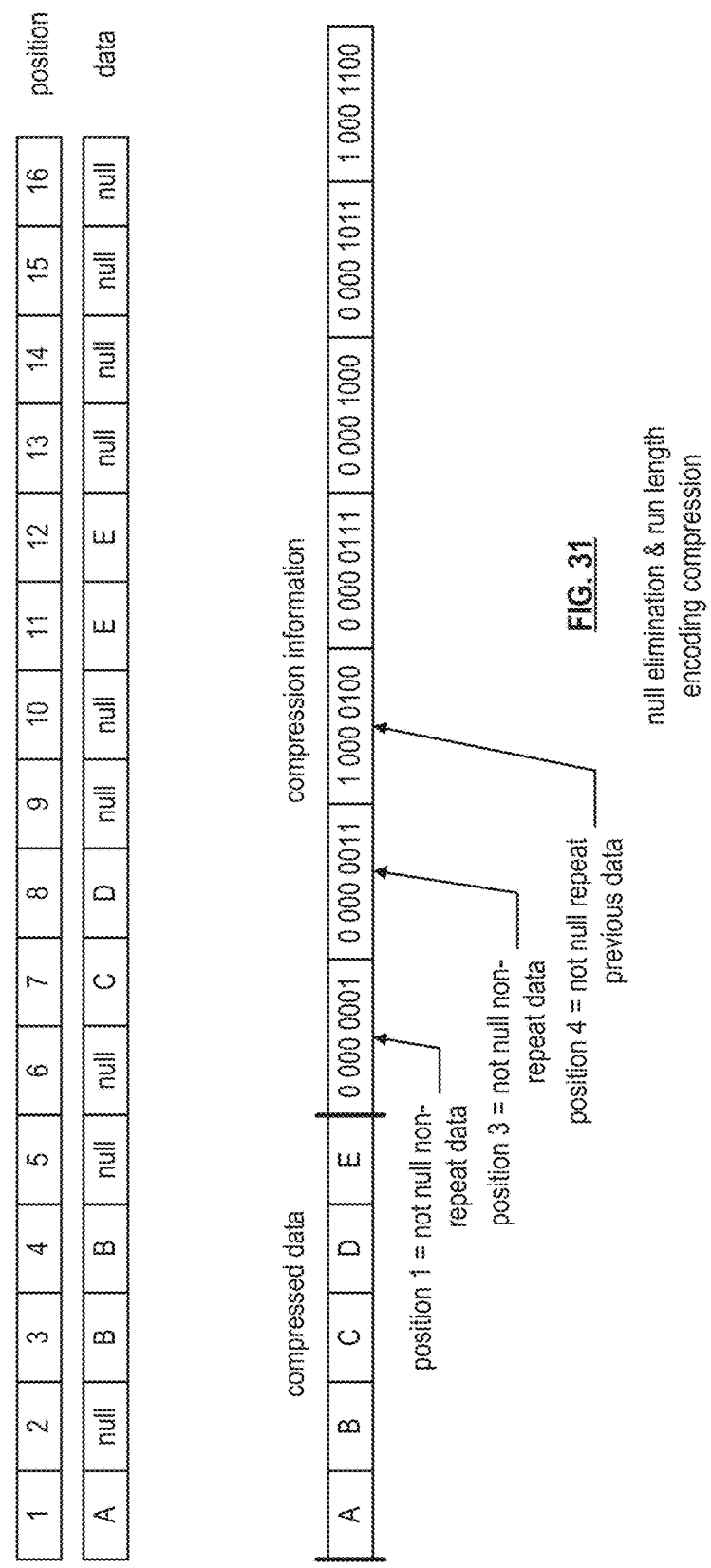
FIG. 31 is a schematic block diagram of an example of compressing data using a combination of null elimination and run length encoding in accordance with the present invention.

FIG. 31 is a schematic block diagram of an example of compressing data using a combination of null elimination and run length encoding. In an example, a data section includes not-null data values A-E with not-null data values B and E being repeated. Compressed data includes only the non-repeat not-null data values as compressed data. A plurality of 8-bit data fields are appended to the compressed data to indicate where the not-null data values and repeated not-null data values are included in the 16-byte data section. For example, the first 8-bit not-null data field indicates data value "A" in data value position 1, whereas the second 8-bit data field indicates that data value "B" is located in data value position 3. The third 8-bit data field indicates that the data value is not-null and repeats the not-null data value from position 3 and so forth. In practice the not-null position field can be more or less than 8-bits as is practical.

Figure 32:
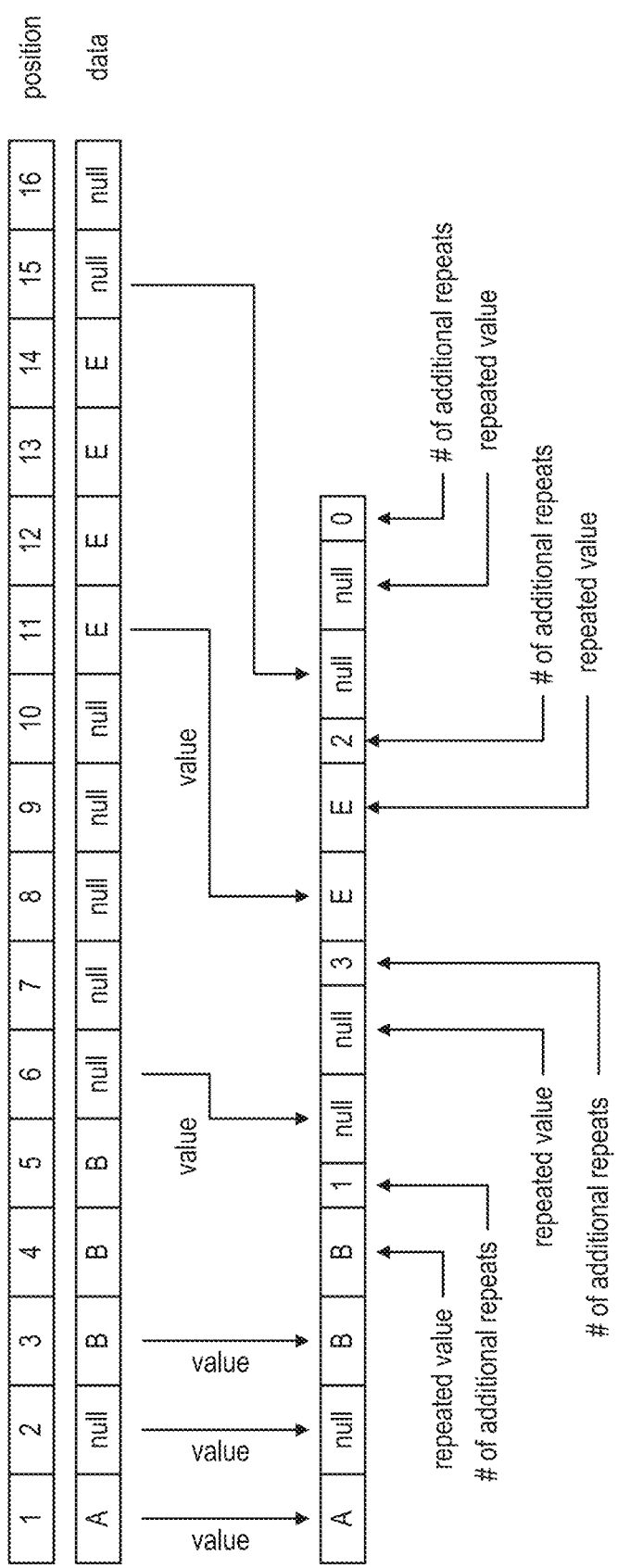
FIG. 32 is a schematic block diagram of an example of compressing data using run length encoding in accordance with the present invention.

FIG. 32 is a schematic block diagram of an example of compressing data using run length encoding. In an example, a 16-byte data section includes not-null data values A, B and E with not-null data values B and E being repeated two and three times, respectively in the 16-byte data section. In the example the 16-byte data section is converted to a 14-byte section by indicating any repeats of not-null data values beyond 2. For example, when not-null data value "B" is repeated 2 times the B data valued is repeated once and then instead of a third repeat the data value indicates only that the preceding data value is a repeated value. Likewise, when a null data value is repeated 4 times the null value and it its first repeat is included along with an indication of "2" indicating that there are two additional repeats of the null data value. When a data value (null or not-null) is repeated only once a "0" is indicated.

Figures 33, 34:
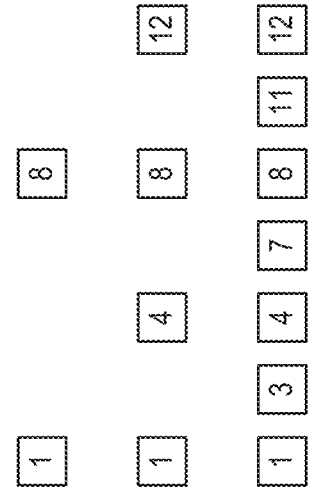
FIG. 33 is a schematic block diagram of another example of compressing data using a combination of null elimination and run length encoding in accordance with the present invention.
FIG. 34 is a schematic block diagram of an example of search list of the compression information of FIG. 33 in accordance with the present invention.

FIG. 33 is a schematic block diagram of another example of compressing data using a combination of null elimination and run length encoding. In an example, not-null data values A-E are located in a 16-byte data section, with not-null data values B and being repeated once each. The 5 distinct values A-E are compressed, along with compression information for each not-null field (including repeats). In the example the position field can indicate the a "0", indicating "no repeat" or "1", indicating repeat of the previous not-null data value in the MSB. In an example the 8-bit data position field (or any practical field size) specifies "0 000 0001" in the first data position field, indicating that the first field of compressed data is in position 1 of the 16-byte field and is "no repeat". The second data position field specifies "0 000 0011", indicating that indicating that the second field of compressed data is in position 3 of the 16-byte field and is likewise "no repeat". The third data position field specifies "1 000 0100" indicating with the "1" in the MSB that the data value is a repeat of the previous value.

FIG. 34 is a schematic block diagram of an example of using a search list of the compression information of FIG. 33 to retrieve a specific data value. In this example, each compressed sorted data slab of a plurality of compressed sorted data slabs includes "X" number of data values and the type of compression used (for example null, RLE, null and RLE, etc.) is known, along with the total number of compressed data values, and the size of each compressed data slab. Additionally, the compression information is in a sorted order and the number of [entries] is included in the compression information. Once the known compressed data slab size known along with the data value field size the number of fields used in compressed data slab is calculated. Compression information can then be searched to determine the compressed data position desired. Non-null fields include not-null data values 1, 3, 4, 7, 8, 11 and 12, arranged in the stacked "search list." The stacked search list may then be used to locate the specific location for the desired data value. If the data value is not in the list it must be a null value. The stacked search list can be stored in the main memory for subsequent searches.

Figure 35:
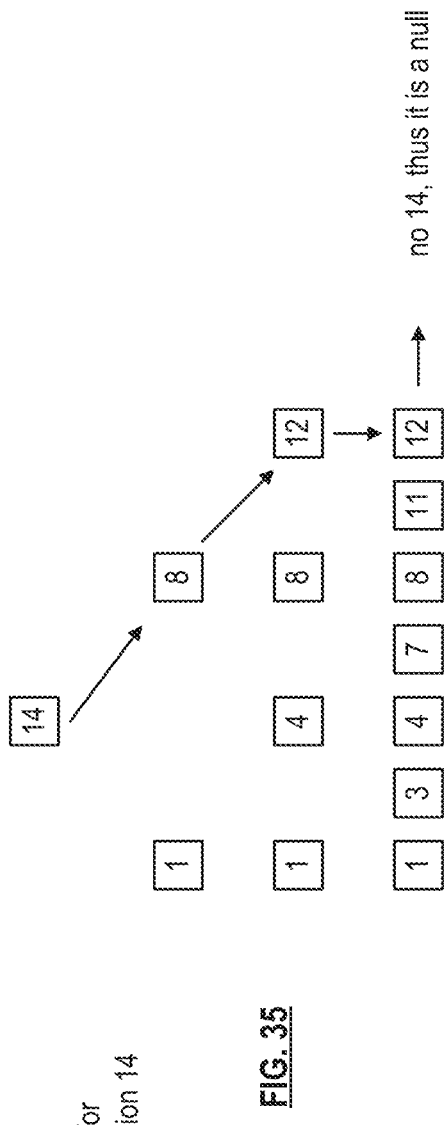
FIG. 35 is a schematic block diagram of an example of searching the search list of FIG. 34 to find a particular compressed data value in accordance with the present invention.

FIG. 35 is a schematic block diagram of an example of searching the search list of FIG. 34 to find a particular compressed data value. In the example the stacked search list is being used to locate the data value for uncompressed position 14. The stacked search list includes only data values 1 and 8 in the top level, which is less than data value 14; the next level of the stacked search list includes only the repeated 1 and 8 data values and additional repeat data values 4 and 12. Since position 14 is after position 12, the stacked search list need only be examined at the base level after position 12, and since there is not data value after position 12, the position 14 data value is a null data value.

Figure 36:
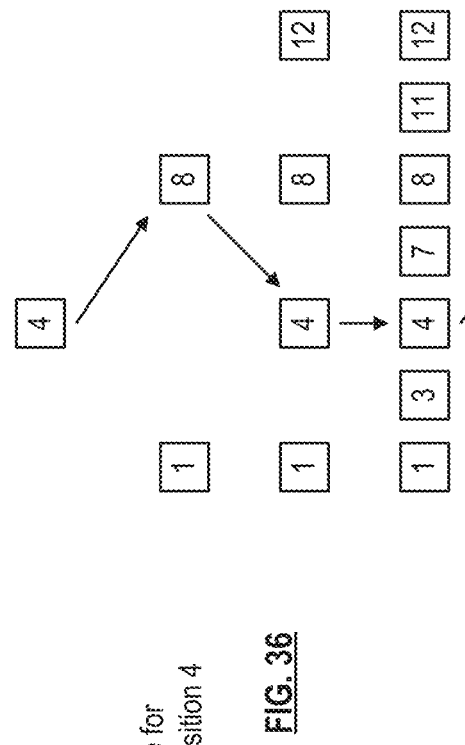
FIG. 36 is a schematic block diagram of another example of searching the search list of FIG. 34 to find a particular compressed data value in accordance with the present invention.

FIG. 36 is a schematic block diagram of another example of searching the search list of FIG. 34 to find a particular compressed data value. In the example the stacked search list is being used to locate the data value for uncompressed position 4. The stacked search list includes only data values 1 and 8 in the top level, accordingly only values between 1 and 8 need to be searched further. The next level of the stacked search list includes the repeated 1 and 8 data values along with the data value 4. Since data value 4 is included as a repeat of data value 4 in the stacked search list, evaluating the data position field for 4 indicates that the data value for position 4 is a repeat of the data value in position 3, which is the second field in the compressed data, thus the data value for uncompressed data value is the decompressed data value "B".

FIG. 37 is a schematic block diagram of an example a portion of the database system 10 for implementing global dictionary compression (GDC). In a first example, the parallelized data input sub-system 11 receives a table 236, converts it into segment groups 241, and sends the segment groups 241 to the parallelized data, store, retrieve, and/or process sub-system 12 for storage and subsequent processing. As part of preparing the segments of the segment groups, the parallelized data input sub-system 11 compresses the data using global dictionary compression. Alternatively, or in addition to the parallelized data input sub-system 11 compresses the data, and the parallelized data, store, retrieve, and/or process sub-system 12 compresses the data prior to storage.

The administrative sub-system 15 creates global dictionary compression (GDC) 246 tables based on requests 242 from the parallelized data input sub-system 11 and/or based on requests 244 from the parallelized data, store, retrieve, and/or process sub-system 12. For example, a request includes a request for the administrative sub-system 15 to create or update a city dictionary. As another example, a request includes a request for the administrative sub-system 15 to create or update a state dictionary.

In a second example of implementing the global dictionary compression, the parallelized data input sub-system 11 receives a data set (e.g., one or more tables 236) that includes a plurality of data records. Each data record of the plurality of data records includes a plurality of data fields. A data record of the plurality of data records includes a first data field of the plurality of data fields containing a first fixed length data value of a plurality of fixed length data values (e.g., record numbers, SSN, employee number, etc.) and a second data field of the plurality of data fields containing a first variable length data value of a plurality of variable length data values (e.g., names, city, state, etc.).

The data set has a first organizational structure. The first organizational structure of the data set includes one of a first table format where rows of a first table are the data records and columns of the first table are the data fields, a second table format where the columns of a second table are the data records and the rows of the second table are the data fields, and a tree structure where the data records are linked in a hierarchical order. The first variable length data value includes one or more of a binary string that represents one of: text data, audio data, video data, image data, graphics data, and numerical data, and an alpha-numeric string that represents one of: text data, audio data, video data, image data, graphics data, and numerical data.

Having received the data set, the parallelized data input sub-system 11 accesses (e.g., utilizing the request 242 to the administrative sub-system 15 and receiving the dictionary 246 in response) a compression dictionary for the second data field. The compression dictionary includes a plurality of entries, where each entry of the plurality of entries includes a key field and a value field. A first entry of the plurality of entries includes the key field storing a first fixed length index value and the value field storing the first variable length data value of the plurality of variable length data values. The key field has a smaller data size than the value field.

The accessing the compression dictionary includes determining, by the parallelized data input sub-system 11, whether the compression dictionary for the second data field exists. When the compression dictionary for the second data field does not exist, the parallelized data input sub-system 11 initiates creation of the compression dictionary for the second data field (e.g., generates the dictionary and/or sends the request 242 to the administrative sub-system 15 and receives the dictionary 246 in response). When the compression dictionary does exist, the parallelized data input sub-system 11 accesses the compression dictionary (e.g., in a local memory). When creating the compression dictionary and/or updating the compression dictionary, the parallelized data input sub-system 11 updates the compression dictionary with a new entry for a new variable length data value being added to the plurality of variable length data values.

Having accessed the compression dictionary, the parallelized data input sub-system 11 creates a storage data set based on the data set and the compression dictionary, where the first variable length data value of the second data field of the data record is replaced with the first fixed length index value. The storage data set has a plurality of fixed length fields. The creating the storage data set further includes one or more of replacing a second variable length data value of the second data field of a second data record of the plurality of data records of the data set with a corresponding second fixed length index value of a second entry of the plurality of entries of the compression dictionary (e.g., a different record with different variable length value), and replacing the first variable length data value of the second data field of a third data record of the plurality of data records of the data set with the first fixed length index value (e.g., a different record with same variable length value).

When a third data field is required, the parallelized data input sub-system 11 may access a second compression dictionary for the third data field of the plurality of data fields, where the second compression dictionary includes a second plurality of entries, where each entry of the second plurality of entries includes a second key field and a second value field. A first entry of the second plurality of entries includes the second key field storing a second fixed length index value and the second value field storing a second variable length data value of a second plurality of variable length data values, where the second key field has a smaller data size than the second value field.

Having accessed the second compression dictionary for the third data field, the parallelized data input sub-system 11 creates the storage data set based on the data set, the compression dictionary, and the second compression dictionary, where the second variable length data value of the third data field of the data record is replaced with the second fixed length index value. The creating the storage data set further includes selecting the first data field of the data set, selecting the value field from the compression dictionary, selecting the second value field from the second compression dictionary, joining the data set to the compression dictionary based on the first data field of the data set and the value field of the compression dictionary, joining the data set to the second compression dictionary based on the first data field of the data set and the second value field of the second compression dictionary, and creating a view name for the storage data set that corresponds to a name of the data set.

When the storage data set has been created, the parallelized data input sub-system 11 sends the storage data set to a data storage-process sub-system for storage. For example, the parallelized data input sub-system 11 sends the storage data set as segments for storage 241 to the parallelized data store, retrieve, &/or process sub-system 12 for storage.

FIG. 38 is a schematic block diagram of an example of a global dictionary compression (GDC) for cities per the request(s) of FIG. 37. In this example, each city is given a code (e.g., typically a numerical binary value of 8 bits to 8 K bytes or more). As a specific example, the city of Albany is given code 1, the city of Baltimore is given code 2, and so on. When data includes a city name, the code is stored instead of the actual name; thereby compressing the amount of data being stored.

FIG. 39 is a schematic block diagram of an example of a global dictionary compression (GDC) for states per the request(s) of FIG. 37. In this example, each state is given a code (e.g., typically a numerical binary value of 8 bits to 8 K bytes or more). As a specific example, the state of Alabama is given code 1, the state of Alaska is given code 2, and so on. When data includes a state name, the code is stored instead of the actual name; thereby compressing the amount of data being stored.

FIG. 40 is a schematic block diagram of an example of creating tables to form a view of a user's table. In this example, the user's table includes three columns ($C_0$, $C_1$, and $C_2$). Column $C_0$ includes data of a fixed length and may further be of a known data set (e.g., integers). Both columns $C_1$ and $C_2$ include strings of data, which are of undeterminable length.

To mimic the user's table, but taking advantage of global dictionary compression, the administration sub-system creates a new table (SYSDDC.USER.TABLE), which is designated as table 1. Table 1 includes three columns ($C_0$, $C_1$, and $C_2$), but each are integer columns. Column C1 includes integers that are keys into a second table (e.g., SYSLOOKUP.USER.TABLE_C1). The second table includes two columns. The first is an integer column that includes the keys or codes for the string values of the user's table in column 1 (e.g., cities).

Column C2 of the new table includes integers that are keys into a third table (e.g., SYSLOOKUP.USER.TABLE_C2). The third table includes two columns. The first is an integer column that includes the keys or codes for the string values of the user's table in column 2 (e.g., states).

FIG. 41 is a schematic block diagram of an example of forming a view of a user's table from the tables created in FIG. 40. At step 251, a computing device, or node thereof, or processing core resource thereof (hereinafter referred to as a processing node for this figure) selects column 0 from the newly create table 1; value C1 from table 2, and value C2 from table 3. The method continues at step 253 where the processing node joins tables 1 and 2 and joins tables 1 and 3. The method continues at step 255 where the processing node creates a view name for the view of the user's table.

Figure 42:
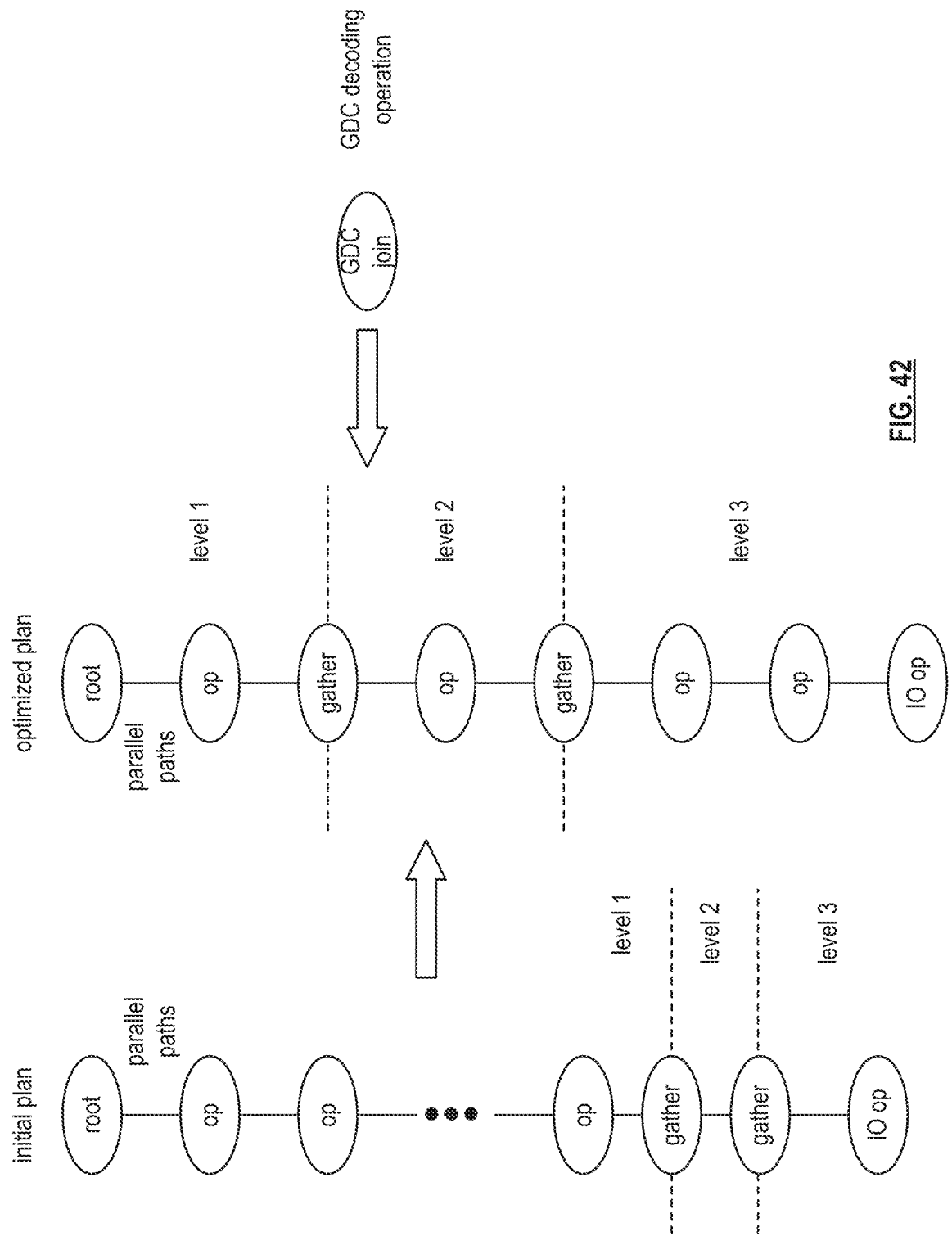
FIG. 42 is a schematic block diagram of an example of optimizing an initial query plan to include one or more global dictionary compression (GDC) decoding operations in accordance with the present invention.

FIG. 42 is a schematic block diagram of an example of optimizing an initial query plan to include one or more global dictionary compression (GDC) decoding operations. During the optimization of the initial plan, the parallelized query and response sub-system determines when and where to insert global dictionary compression (GDC) decoding steps. The further upstream the decoding, the more efficient the movement and processing of data since there is physically less data being moved. In some instances, a sequence of operations can be fully processed without GDC decoding (e.g., count states, etc.)

Figure 43:
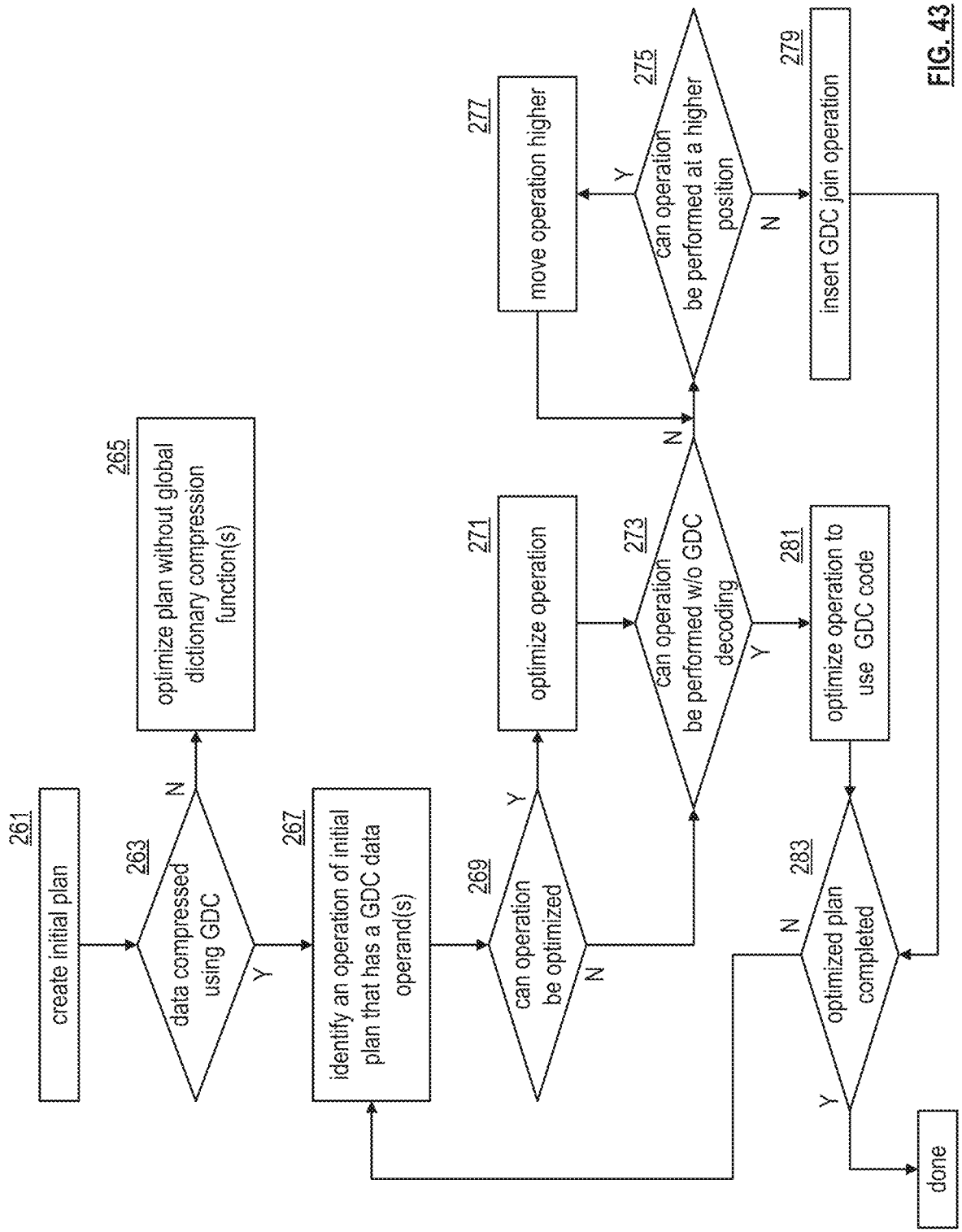
FIG. 43 is a schematic block diagram of an example of a method of optimizing an initial query plan to include one or more global dictionary compression (GDC) decoding operations in accordance with the present invention.

FIG. 43 is a schematic block diagram of an example of a method of optimizing an initial query plan to include one or more global dictionary compression (GDC) decoding operations. The method begins at step 261 where a computing device, or node thereof, or processing core resource thereof of a computing device of the parallelized query and response sub-system (hereinafter referred to as a processing node for this figure) creates an initial plan. The method continues at step 263 where the processing node determines when the table being addressed by the query has used global dictionary compression (GDC) compression for storing data. If not, the method continues at step 265 where the processing node optimizes the initial plan without using GDC decoding operations.

If the data was stored using GDC, then the method continues at step 267 where the processing node identifies an operation, or operations, of the initial plan that has a GDC data operand(s) (e.g., is access data that was compressed using GDC). The method continues at step 269 where the processing node determines whether the operation itself, or a sequence of operations, can be optimized (e.g., reworked to more efficiently access data and/or more efficiently process data). If yes, the method continues at step 271 where the processing node optimizes the operation and/or the sequence of operations.

Whether the operation or sequence of operations are optimized or not, the method continues at step 273 where the processing node determines whether the operation, or sequence of operations can be performed without GDC decoding. For example, if the operation or sequence of operations is to count the records by state, the name of the state is not needed for this operation. As such, decoding is not needed. If yes, the method continues at step 281 where the processing node optimizes the operation to use the GDC code without GDC decoding.

If, however, the operation cannot be performed without GDC decoding (e.g., adding floating point values of a list of floating point values), the method continues at step 275 where the processing node determines whether the operation needs to be done at the current level or can the operation be pushed upstream. If the operation can be pushed upstream, the method continues at step 277 where the processing node moves the operation upstream.

When the operation cannot be pushed upstream, or pushed upstream any further, the method continues at step 279 where the processing node inserts a GDC join operation to execute the GDC decoding, which replaces the key code with the actual value. The method continues at step 283 where the processing node determines whether the plan optimization is complete. If so, the method ends. If not, the method repeats at step 267 for another operation, or sequence of operations, that access data that has been compressed using GDC.

Figure 43A:
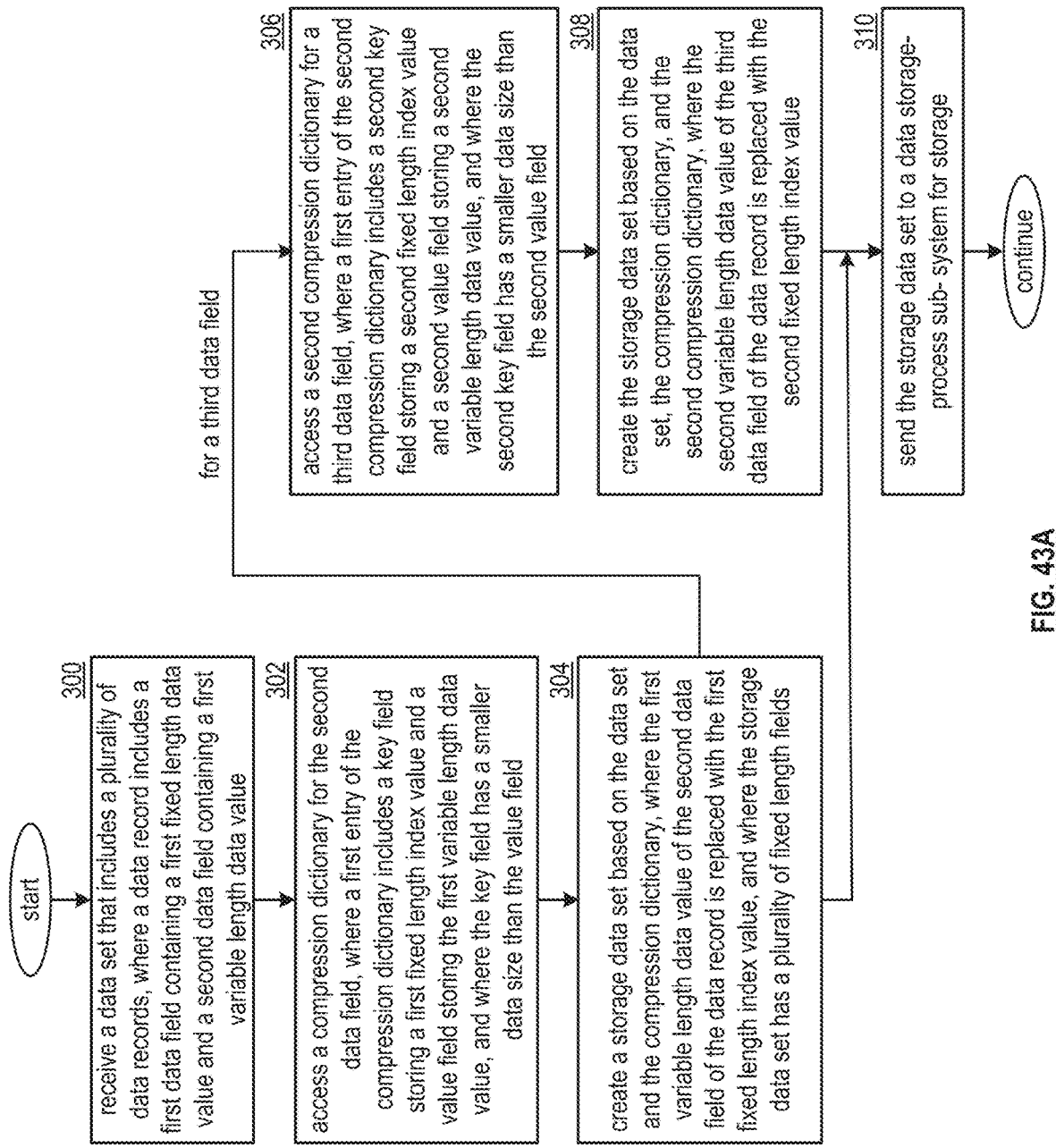
FIG. 43A is a logic diagram of an embodiment of a method for compressing a data set within a data processing system.

FIG. 43A is a logic diagram of an embodiment of a method for compressing a data set within a data processing system (e.g., the database system 10 of FIG. 1). In particular, a method is presented for use in conjunction with one or more functions and features described in conjunction with FIGS. 1-14, and also FIGS. 37-43. The method includes step 300 where a processing module of one or more processing modules of one or more computing entities that may include one or more computing devices within one or more subsystems of the data processing system receives a data set that includes a plurality of data records. Each data record of the plurality of data records includes a plurality of data fields. A data record of the plurality of data records includes a first data field of the plurality of data fields containing a first fixed length data value of a plurality of fixed length data values (e.g., record numbers, SSN, employee number, etc.) and a second data field of the plurality of data fields containing a first variable length data value of a plurality of variable length data values (e.g., names, city, state, etc.). The data set has a first organizational structure.

The method continues at step 302 where the processing module accesses a compression dictionary for the second data field, where the compression dictionary includes a plurality of entries, and where each entry of the plurality of entries includes a key field and a value field. A first entry of the plurality of entries includes the key field storing a first fixed length index value and the value field storing the first variable length data value of the plurality of variable length data values. The key field has a smaller data size than the value field. The accessing the compression dictionary includes determining whether the compression dictionary for the second data field exists and when the compression dictionary for the second data field does not exist, initiating creation of the compression dictionary for the second data field (e.g., creating the dictionary or obtaining the compression dictionary from another computing entity of the data processing system). When the compression dictionary does exist, the processing module accesses the compression dictionary. When a new entry is to be processed, the processing module updates the compression dictionary with the new entry for a new variable length data value being added to the plurality of variable length data values.

The method continues at step 304 where the processing module creates a storage data set based on the data set and the compression dictionary, where the first variable length data value of the second data field of the data record is replaced with the first fixed length index value, and where the storage data set has a plurality of fixed length fields. The creating the storage data set further includes one or more of replacing a second variable length data value of the second data field of a second data record of the plurality of data records of the data set with a corresponding second fixed length index value of a second entry of the plurality of entries of the compression dictionary (e.g., a different record with different variable length value), and replacing the first variable length data value of the second data field of a third data record of the plurality of data records of the data set with the first fixed length index value (e.g., a different record with a same variable length value).

The method continues at step 306 when operating on the third data field, otherwise the method continues to step 310. When operating on the third data field, the processing module accesses a second compression dictionary for a third data field of the plurality of data fields, where the second compression dictionary includes a second plurality of entries. Each entry of the second plurality of entries includes a second key field and a second value field. A first entry of the second plurality of entries includes the second key field storing a second fixed length index value and the second value field storing a second variable length data value of a second plurality of variable length data values, where the second key field has a smaller data size than the second value field.

The method continues at step 308 where the processing module creates the storage data set based on the data set, the compression dictionary, and the second compression dictionary, where the second variable length data value of the third data field of the data record is replaced with the second fixed length index value. The creating the storage data set further includes selecting the first data field of the data set, selecting the value field from the compression dictionary, selecting the second value field from the second compression dictionary, joining the data set to the compression dictionary based on the first data field of the data set and the value field of the compression dictionary, joining the data set to the second compression dictionary based on the first data field of the data set and the second value field of the second compression dictionary, and creating a view name for the storage data set that corresponds to a name of the data set.

When the storage data set has been created, the method continues at step 310 where the processing module sends the storage data set to a data storage-process sub-system of the data processing system for storage. For example, the processing module sends the storage data set to the data storage-process sub-system for direct storage. In another example, the processing module sends the storage data set to the data storage-process sub-system for further compression optimization and storage, where the further compression optimization includes utilizing one or more of the compression dictionary, the second compression dictionary, and another compression dictionary.

The method described above in conjunction with the processing module can alternatively be performed by other modules of the database system 10 of FIG. 1 or by other devices. In addition, at least one memory section (e.g., a computer readable memory, a non-transitory computer readable storage medium, a non-transitory computer readable memory organized into a first memory element, a second memory element, a third memory element, a fourth element section, a fifth memory element etc.) that stores operational instructions can, when executed by one or more processing modules of the one or more computing entities of the database system 10, cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   receiving, by a host computing device of a storage cluster of computing devices, a segment group of data;
   evaluating, by the host computing device, availability status of other computing devices in the storage cluster of computing devices;
   when one of the other computing devices is unavailable:
      dividing, by the host computing device, the segment group of data into a plurality of lines of data blocks;
      for a line of data blocks of the plurality of lines of data blocks, generating, by the host computing device, at least one parity block, wherein the line of data blocks and the at least one parity block form a coding line;
      sending, by the host computing device, a first data segment that includes first positioned data blocks of the plurality of lines of data blocks to a first available computing device of the other computing devices;
      sending, by the host computing device, a second data segment that includes second positioned data blocks of the plurality of lines of data blocks to a second available computing device of the other computing devices; and
      storing, by the host computing device, at least one parity segment that includes the at least one parity block for each of the plurality of code lines of data blocks for which the at least one parity block was created, wherein the at least one parity segment was targeted for storage by the other computing device that is unavailable.

2. The method of claim 1 further comprises:
   when the one of the other computing devices becomes available, sending, by the host computing device, a parity segment of the at least one parity segment to the now available computing device.

3. The method of claim 1 further comprises:
   sending to itself or retaining, by the host computing device, a third data segment that includes third positioned data blocks of the plurality of lines of data blocks.

4. The method of claim 1 further comprises:
   sending, by the host computing device, a third data segment that includes third positioned data blocks of the plurality of lines of data blocks to a third available computing device of the other computing devices.

5. The method of claim 1, wherein the generating the at least one parity block comprises:
   performing a redundancy encoded function on the data blocks of the line of data blocks.

6. The method of claim 1 further comprises:
   targeting, by the host computing devices, the at least one parity block for each of the plurality of code lines of data blocks for which the at least one parity block was created to the one of the other computing devices that is unavailable.

7. The method of claim 1 further comprises:
   when all of the other computing devices are available:
      dividing, by the host computing device, the segment group of data into a plurality of lines of data blocks;
      for a line of data blocks of the plurality of code lines of data blocks, generating, by the host computing device, at least one parity block, wherein the line of data blocks and the at least one parity block form a coding line;
      from a coding line to another coding line, distributing, by the host computing device, positioning of the at least one parity block among the data blocks of a corresponding coding line;
      forming, by the host computing device, a first data segment to include data blocks or parity blocks from a first position within distributed coding lines; and
      sending, by the host computing device, the first data segment to a first computing device of the storage cluster of computing devices.

8. The method of claim 7 further comprises:
   forming, by the host computing device, a second data segment to include data blocks or parity blocks from a second position within distributed coding lines; and
   sending, by the host computing device, the second data segment to a second computing device of the storage cluster of computing devices.

9. The method of claim 7, wherein the distributing the positioning of the at least one parity block among the data blocks of a corresponding coding line comprises at least one of:
   a round-robin distribution of the at least one parity block among the data blocks of a corresponding coding line;

a pseudo-random distribution of the at least one parity block among the data blocks of a corresponding coding line; and a patterned distribution of the at least one parity block among the data blocks of a corresponding coding line.

10. A computer readable memory comprises:

a first memory section for storing operational instructions that, when executed by a host computing device of a storage cluster of computing devices, causes the host computing device to:

receive a segment group of data;

evaluate availability status of other computing devices in the storage cluster of computing devices;

a second memory section for storing operational instructions that, when executed by the host computing device, causes the host computing device to:

when one of the other computing devices is unavailable:

divide the segment group of data into a plurality of lines of data blocks;

for a line of data blocks of the plurality of lines of data blocks, generate at least one parity block, wherein the line of data blocks and the at least one parity block form a coding line;

send a first data segment that includes first positioned data blocks of the plurality of lines of data blocks to a first available computing device of the other computing devices;

send a second data segment that includes second positioned data blocks of the plurality of lines of data blocks to a second available computing device of the other computing devices; and store at least one parity segment that includes the at least one parity block for each of the plurality of code lines of data blocks for which the at least one parity block was created, wherein the at least one parity segment was targeted for storage by the other computing device that is unavailable.

11. The computer readable memory of claim 10, wherein the second memory section further stores operational instructions that, when executed by the host computing device, causes the host computing device to:

when the one of the other computing devices becomes available, send a parity segment of the at least one parity segment to the now available computing device.

12. The computer readable memory of claim 10, wherein the second memory section further stores operational instructions that, when executed by the host computing device, causes the host computing device to:

send to itself or retain a third data segment that includes third positioned data blocks of the plurality of lines of data blocks.

13. The computer readable memory of claim 10, wherein the second memory section further stores operational instructions that, when executed by the host computing device, causes the host computing device to:

send a third data segment that includes third positioned data blocks of the plurality of lines of data blocks to a third available computing device of the other computing devices.

14. The computer readable memory of claim 10, wherein the second memory section further stores operational instructions that, when executed by the host computing device, causes the host computing device to generate the at least one parity block by:

performing a redundancy encoded function on the data blocks of the line of data blocks.

15. The computer readable memory of claim 10, wherein the second memory section further stores operational instructions that, when executed by the host computing device, causes the host computing device to:

target the at least one parity block for each of the plurality of code lines of data blocks for which the at least one parity block was created to the one of the other computing devices that is unavailable.

16. The computer readable memory of claim 10 further comprises:

a third memory section for storing operational instructions that, when executed by the host computing device, causes the host computing device to:

when all of the other computing devices are available:

divide the segment group of data into a plurality of lines of data blocks;

for a line of data blocks of the plurality of code lines of data blocks, generate at least one parity block, wherein the line of data blocks and the at least one parity block form a coding line;

from a coding line to another coding line, distribute positioning of the at least one parity block among the data blocks of a corresponding coding line;

form a first data segment to include data blocks or parity blocks from a first position within distributed coding lines; and send the first data segment to a first computing device of the storage cluster of computing devices.

17. The computer readable memory of claim 16, wherein the third memory section further stores operational instructions that, when executed by the host computing device, causes the host computing device to:

form a second data segment to include data blocks or parity blocks from a second position within distributed coding lines; and send the second data segment to a second computing device of the storage cluster of computing devices.

18. The computer readable memory of claim 16, wherein the third memory section further stores operational instructions that, when executed by the host computing device, causes the host computing device to distribute the positioning of the at least one parity block among the data blocks of a corresponding coding line by at least one of:

a round-robin distribution of the at least one parity block among the data blocks of a corresponding coding line;

a pseudo-random distribution of the at least one parity block among the data blocks of a corresponding coding line; and a patterned distribution of the at least one parity block among the data blocks of a corresponding coding line.

* * * * *